(12) United States Patent
Mathews

(10) Patent No.: US 11,354,571 B2
(45) Date of Patent: Jun. 7, 2022

(54) PARALLEL IMPLEMENTATION OF DEEP NEURAL NETWORKS APPLIED TO THREE-DIMENSIONAL DATA SETS

(71) Applicant: Gigantor Technologies Inc., Melbourne Beach, FL (US)

(72) Inventor: Mark Ashley Mathews, Fairfield, CA (US)

(73) Assignee: Gigantor Technologies, Inc., Melbourne Beach, FL (US)

( * ) Notice: Subject to any disclaimer, the term of this patent is extended or adjusted under 35 U.S.C. 154(b) by 0 days.

(21) Appl. No.: 17/570,757

(22) Filed: Jan. 7, 2022

(65) Prior Publication Data
US 2022/0138394 A1 May 5, 2022

Related U.S. Application Data

(63) Continuation-in-part of application No. 17/373,497, filed on Jul. 12, 2021, now Pat. No. 11,256,981, (Continued)

(51) Int. Cl.
| | |
|---|---|
| *G06N 3/063* | (2006.01) |
| *G06N 20/00* | (2019.01) |
| *G06F 17/16* | (2006.01) |
| *G06F 17/15* | (2006.01) |
| *G06F 30/392* | (2020.01) |
| *G06F 30/398* | (2020.01) |

(52) U.S. Cl.
CPC .......... *G06N 3/063* (2013.01); *G06F 17/153* (2013.01); *G06F 17/16* (2013.01); *G06N 20/00* (2019.01); *G06F 30/392* (2020.01); *G06F 30/398* (2020.01)

(58) Field of Classification Search
CPC ...... G06N 3/063; G06N 20/00; G06F 17/153; G06F 17/16
See application file for complete search history.

(56) References Cited

U.S. PATENT DOCUMENTS

| | | | | |
|---|---|---|---|---|
| 2011/0174958 A1* | 7/2011 | Weststrate | ...... | H01L 31/035281 250/200 |
| 2018/0344291 A1* | 12/2018 | Martins | ................. | A61B 8/445 |

(Continued)

FOREIGN PATENT DOCUMENTS

CN 108961392 A * 12/2018

*Primary Examiner* — Corey S Faherty
(74) *Attorney, Agent, or Firm* — Donald R. Boys; Central Coast Patent Agency LLC

(57) ABSTRACT

An integrated circuit (IC) implements an L by M by N three-dimensional aperture function throughout a P by R by C three-dimensional source array. The IC has an input port receiving an ordered stream of independent input values from the source array, an output port producing an ordered stream of independent output values, an array of n compositor circuits, where n=L×M×N, each compositor circuit implementing a sub-function of the aperture function, dedicated pathways between the compositor circuits, delay circuits on the IC receiving values on the dedicated pathways from individual ones of the compositor circuits and providing the delayed values at later times to other compositor circuits downstream, a finalization circuit, and a control circuit operating counters and producing control signals coupled to the compositors, the delay circuits, and the finalization circuit.

10 Claims, 47 Drawing Sheets

Related U.S. Application Data which is a continuation-in-part of application No. 17/231,711, filed on Apr. 15, 2021, now Pat. No. 11,099,854, which is a continuation-in-part of application No. 17/071,875, filed on Oct. 15, 2020.

(56) References Cited

U.S. PATENT DOCUMENTS

2019/0391796 A1* 12/2019 Brady ............... G06F 8/456
2020/0134429 A1*  4/2020 Parker ............. G06N 3/0472

* cited by examiner

| Node | Channels | Width | Height | Frequency |
|---|---|---|---|---|
| 1UP Input Channels | 1 X RGB = 3 | 1920 | 1080 | 500 MHz |
| 1UP 7 X 7 Convolution | 64 | 1920 | 1080 | 500 MHz |
| 1UP 1 X 1 Convolution | 64 | 1920 | 1080 | 500 MHz |
| 1UP 3 X 3 Convolution | 64 | 1920 | 1080 | 500 MHz |
| 1UP 1 X 1 Convolution | 64 | 1920 | 1080 | 500 MHz |
| 1UP Concatenation | 128 | 1920 | 1080 | 500 MHz |
| 1UP 2 X 2 MaxPool | 128 | 1920/2 = 960 | 1080/2 = 540 | 125 MHz |
| 1UP 1 X 1 Convolution | 128 | 960 | 540 | 125 MHz |
| 1UP 3 X 3 Convolution | 128 | 960 | 540 | 125 MHz |
| 1UP 1 X 1 Convolution | 128 | 960 | 540 | 125 MHz |
| 1UP Concatenation | 256 | 960 | 540 | 125 MHz |
| 1UP 2 X 2 MaxPool | 256 | 960/2 = 480 | 540/2 = 270 | 31.2 MHz |
| 1UP 1 X 1 Convolution | 256 | 480 | 270 | 31.2 MHz |
| 2UP 3 X 3 Convolution | 256 | 480 | 270 | 31.2 MHz |
| 2UP 1 X 1 Convolution | 256 | 480 | 270 | 31.2 MHz |
| 1UP Concatenation | 512 | 480 | 270 | 31.2 MHz |
| 1UP 2 X 2 MaxPool | 512 | 480/2 = 240 | 270/2 = 135 | 7.8 MHz |
| 1UP 1 X 1 Convolution | 512 | 240 | 135 | 7.8 MHz |
| 2UP 3 X 3 Convolution | 512 | 240 | 135 | 7.8 MHz |
| 2UP 1 X 1 Convolution | 512 | 240 | 135 | 7.8 MHz |
| 1UP Concatenation | 1024 | 240 | 135 | 7.8 MHz |
| 1UP Global Average | 1024 | 1 | 1 | 60 Hz |
| 1UP Output Channels | 1024 | 1 | 1 | 60 Hz |

Fig. 19

| Node | Channels | Width | Height | Frequency |
|---|---|---|---|---|
| 4UP Input Channels | 4 X RGB = 12 | 1920/4 = 480 | 1080 | 125 MHz |
| 4UP 7 X 7 Convolution | 4 X 16 = 64 | 1920/4 = 480 | 1080 | 125 MHz |
| 4UP 1 X 1 Convolution | 4 X 16 = 64 | 1920/4 = 480 | 1080 | 125 MHz |
| 4UP 3 X 3 Convolution | 4 X 16 = 64 | 1920/4 = 480 | 1080 | 125 MHz |
| 4UP 1 X 1 Convolution | 4 X 16 = 64 | 1920/4 = 480 | 1080 | 125 MHz |
| 4UP Concatenation | 4 X 32 = 128 | 1920/4 = 480 | 1080 | 125 MHz |
| 4UP to 2UP 2 X 2 MaxPool | 2 X 64 = 128 | 960/2 = 480 | 1080/2 = 540 | 62.5 MHz |
| 2UP 1 X 1 Convolution | 2 X 64 = 128 | 960/2 = 480 | 540 | 62.5 MHz |
| 2UP 3 X 3 Convolution | 2 X 64 = 128 | 960/2 = 480 | 540 | 62.5 MHz |
| 2UP 1 X 1 Convolution | 2 X 64 = 128 | 960/2 = 480 | 540 | 62.5 MHz |
| 2UP Concatenation | 2 X 128 = 256 | 960/2 = 480 | 540 | 62.5 MHz |
| 2UP to 1UP 2 X 2 MaxPool | 1 X 256 = 256 | 480/1 = 480 | 540/2 = 270 | 31.2 MHz |
| 1UP 1 X 1 Convolution | 1 X 256 = 256 | 480 | 270 | 31.2 MHz |
| 2UP 3 X 3 Convolution | 1 X 256 = 256 | 480 | 270 | 31.2 MHz |
| 2UP 1 X 1 Convolution | 1 X 256 = 256 | 480 | 270 | 31.2 MHz |
| 1UP Concatenation | 1 X 512 = 512 | 480 | 270 | 31.2 MHz |
| 1UP 2 X 2 MaxPool | 1 X 512 = 512 | 480/2 = 240 | 270/2 = 135 | 7.8 MHz |
| 1UP 1 X 1 Convolution | 1 X 512 = 512 | 240 | 135 | 7.8 MHz |
| 2UP 3 X 3 Convolution | 1 X 512 = 512 | 240 | 135 | 7.8 MHz |
| 2UP 1 X 1 Convolution | 1 X 512 = 512 | 240 | 135 | 7.8 MHz |
| 1UP Concatenation | 1 X 1024 = 1024 | 240 | 135 | 7.8 MHz |
| 1UP Global Average | 1 X 1024 = 1024 | 1 | 1 | 60 Hz |
| 1UP Output Channels | 1024 | 1 | 1 | 60 Hz |

*Fig. 20*

PARALLEL IMPLEMENTATION OF DEEP NEURAL NETWORKS APPLIED TO THREE-DIMENSIONAL DATA SETS

CROSS-REFERENCE TO RELATED APPLICATIONS

The instant application is a continuation-in-part of co-pending application Ser. No. 17/373,497, filed on 12 Jul. 2021, which is a continuation-in-part of application Ser. No. 17/231,711 filed on 15 Apr. 2021, now issued as U.S. Ser. No. 11/099,854 on Aug. 24, 2021, which is a continuation-in-part of co-pending application Ser. No. 17/071,875 filed on 15 Oct. 2020. All disclosure of the parent applications is incorporated at least by reference.

BACKGROUND OF THE INVENTION

1. Field of the Invention

The present invention is in the technical area of computer operations involving matrix inputs and outputs and pertains more specifically to circuits designed for mass multiplication in matrix operations.

2. Description of Related Art

Use of computers in matrix operations is well-known in the art, specific examples being image processing and development and use of neural networks. Neural networks are part and parcel of artificial intelligence, and as such are, at the time of filing the instant patent application, a very popular subject in development of intellectual property. Generally speaking, in computer operations of this sort, substantial numbers of input values are processed in a regular pattern, the pattern being in most instances a matrix. Processing of input values may involve biasing and applying weights by which individual input values may be multiplied.

The present inventor believes that the sophisticated and computationally intense operations in the technology of neural networks wherein incoming values are multiplied by each of a plurality of weight values, is a step open to innovation to provide distinct advantages in the technology. The inventor also believes that there are advantages to be gained in revising the order of mathematical processes to be applied.

The present inventor believes that he has determined a general change in the order and manner of mathematical processes to be implemented in such applications that may well produce a very significant reduction in time and cost in such operations.

BRIEF SUMMARY OF THE INVENTION

In one embodiment of the invention, an integrated circuit (IC) implementing an L by M by N three dimensional aperture function throughout a P by R by C three-dimensional source array is provided, the IC comprising an input port receiving an ordered stream of independent input values from the source array, an output port producing an ordered stream of independent output values, an array of n compositor circuits, where $n=L \times M \times N$, each compositor circuit implementing a sub-function of the aperture function, dedicated pathways between the compositor circuits, delay circuits on the IC receiving values on the dedicated pathways from individual ones of the compositor circuits and providing the delayed values at later times to other compositor circuits downstream, a finalization circuit, and a control circuit operating counters and producing control signals coupled to the compositors, the delay circuits, and the finalization circuit.

In one embodiment of the IC, input values are ordered from a first input point at a first column of a first row of a first plane of the source array, taken across columns of the first row of the first plane, then down row by row and across columns of the rows to a final point at the last column of the last row of the first plane, and then column by column and row by row through a second plane, and plane by plane to and through a last plane. Also, in one embodiment, output values are posted to the output port by the finalization circuit in order of receiving and processing a complete composition of values for an output of the aperture function at each specific position of the P by R by C array of input values. In one embodiment, the IC further comprises a mass multiplier circuit multiplying each input value in the input stream, as received, by each weight of the aperture function, and providing products to individual ones of the compositor circuits for further processing. And in one embodiment all circuitry is active simultaneously, and the output stream of the IC at the output port is produced while inputs are being received at the input port.

In one embodiment, the IC further comprises a mass multiplication circuit coupled to the input port and adapted to multiply each input value as received by all weights of the 3D aperture function simultaneously and to provide products of the multiplications to the compositor circuits on dedicated pathways, the compositor circuits performing remaining steps of the sub-function and passing partial results along the dedicated pathways between the compositor circuits. In one embodiment, the IC further comprises L register circuits coupled to the input port, one for each plane of the aperture function, each register circuit capturing all input data for one plane of the aperture function at each position of the aperture function and presenting the data from all three planes simultaneously to each compositor for sub-function computation. In one embodiment, the input port receives an ordered stream of input values from the P by R by C source array in sets of values from A adjacent input positions in each input interval. In one embodiment, C is not an integral multiple of A. And in one embodiment, the IC further comprises mass multiplier circuitry wherein each input value in the input stream is multiplied by all weights of the aperture function on receipt and the products are provided on dedicated pathways to the compositors.

BRIEF DESCRIPTION OF THE SEVERAL VIEWS OF THE DRAWINGS

FIG. 19 is a table illustrating array stream size for the DNN of FIGS. 17A and B.

FIG. 20 is a table illustrating array stream size for the DNN of FIGS. 18A and B.

DETAILED DESCRIPTION OF THE INVENTION

Figure 1:
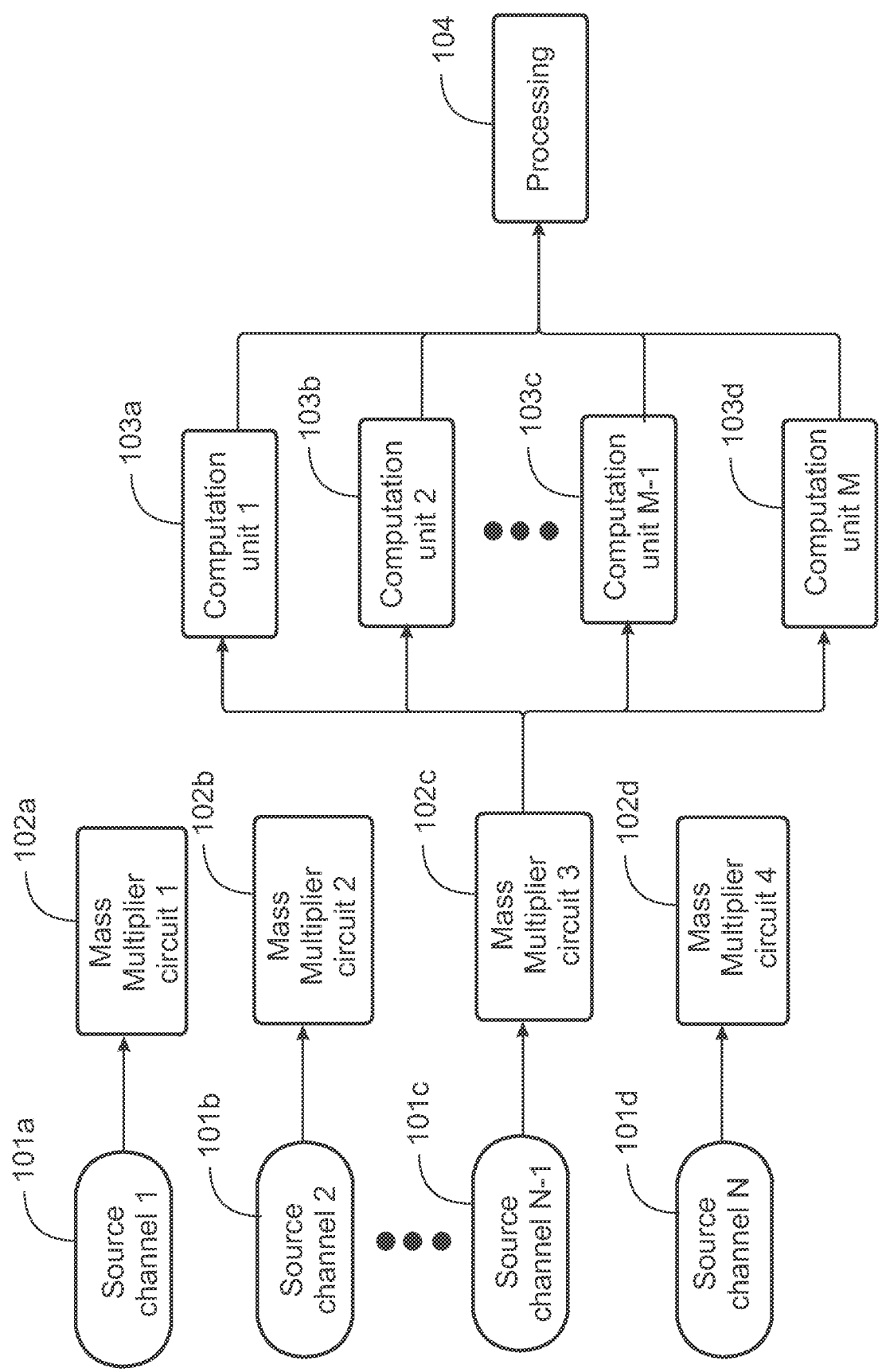
FIG. 1 illustrates an embodiment where mass multipliers applied to each common source are fixed and wired directly into a processing circuit.

A wide variety of image and data algorithms make extensive use of matrix forms of linear algebra both to prove propositions and to calculate results. In the instant application by "an algorithm" is meant a process or set of rules to be followed in calculations or other problem-solving operations, especially by a computer. Algorithms are not to be universally construed as software in this application. Algorithms as described in the instant application may, and typically are preferably, implemented in hardware.

Matrix operations are defined as orthogonal collections of one or more dimensions and are generally conceived as having the same number of elements in every iteration of each given dimension. By way of example, an M by N matrix is frequently depicted by an array of values such as:

$$A = \begin{bmatrix} a_{1,1} & a_{1,2} & \cdots & a_{1,N-1} & a_{1,N} \\ a_{1,1} & a_{1,2} & \cdots & a_{1,N-1} & a_{1,N} \\ \vdots & \vdots & & \vdots & \vdots \\ a_{M-1,1} & a_{M-1,2} & \cdots & a_{M-1,N-1} & a_{M-1,N} \\ a_{M,1} & a_{M,2} & \cdots & a_{M,N-1} & a_{M,N} \end{bmatrix}$$

Conceptually, a matrix may have any number of dimensions and the matrices may be depicted as sets of tables showing the values for each dimension.

The subset of matrices of the forms M by 1 or 1 by N may be referred to as vectors which have their own specific properties and operations defined and are used extensively in 2D and 3D graphic simulations.

A degenerate subset of matrices of the form 1 by 1 may be referred to as scalars and constitute numbers quite familiar to the skilled person.

When the values of a matrix are constants, and the matrices are of compatible dimensions, certain operations such as multiplication are well defined. A 3 by 4 matrix A can be multiplied by a 4 by 5 matrix B to form a 3 by 5 matrix C which may often be written as:

$$A \times B = C$$
$$c_{i,j} = \sum_{k=1}^{4} a_{i,k} b_{k,j}$$

However, the operation B×A is not well defined because the inner dimensions do not match (5≠3), and k would not have a single range that is compatible with the indices of B and A.

A matrix whose elements are vectors or other matrices is known as a tensor (from which the name of TensorFlow is derived). A familiar form of a tensor may be an RGB image. One form of an RGB image is an HDMI frame as a 1080 by 1920 matrix of RGB values each pixel of which is a 3 by 1 vector of color components. A pixel is considered a true vector because no linear operation of the Red component affects Green or Blue and vice versa.

An HDMI frame is not generally considered a five-dimensional matrix because the treatment of positions of pixels in the image is not related to treatment of the colors. It is valid and quite meaningful to crop an image by discarding parts of the image that are not of interest but there is no corresponding operation to crop color components. Likewise, there may be many operations on the colors with easily comprehensible effects that would be meaningless if applied to the elements of the containing array. So the HDMI frame is clearly a 2,3 tensor and not a 5D array.

There are many image processing algorithms known that may be expressed as matrix operations. A matrix operation is a succinct way of expressing repetitive operations and the rules of matrix mathematics are instrumental in proving specific propositions.

Execution of matrix-based algorithms on general purpose computer processors is generally accomplished by looping mechanisms, and both computer languages and hardware CPUs may have features to make such loops efficient. However, there is nothing inherent in the mathematics of matrix definitions that requires that operations be executed by any specific method or plan in order to compute correct results.

A modern hybrid of image processing and cognition is a convolutional neural network (CNN). While training such networks has been quite challenging for years, actually executing trained networks is relatively trivial.

In CNNs each convolutional output element operates by passing an independent kernel over an input tensor to produce each component of an output tensor. Typically, when a neural network is used to process images, the first layer of the network operates on an input array of the RGB pixels of the image and produces an output array of related size containing an arbitrary vector of output components that is structurally unrelated to the RGB vector of input components. The output vector components are generally described as features or activations and represent the response strength (degree of recognition) of each kernel. Subsequent layers in the CNN take output from preceding layers as their input, so only the very first layer acts on the pixel values; all the rest act on features to produce more features. Each output feature of the convolution is unrelated and distinct from every other feature just as the color components are distinct from one another.

A common form of a CNN layer is a 3 by 3 Convolution. In operation a 3 by 3 kernel of constant weights is applied to each specific position of the input tensor (i.e. image) element wise; that is, each of the weights is multiplied by the pixel components at the same relative position in the image and the products are summed to produce a single component of the output for that position. A bias constant (which may be zero) provides the initial value to facilitate solving the model to arrive at optimal weight values.

If there are three input components, as there are in an RGB image, then there are three distinct sets of 3 by 3 weights to be applied to each component value (in the case of the first layer, the colors) but only a single initial bias. Each convolution of the 3 by 3 by 3 weights plus bias forms a single output component value corresponding to the position at the center of a 3×3 patch of pixels. Each output channel applies its own 27 weight values in turn, until all output components for a given patch (the subset of input components at the same position as the output position and corresponding to the relative positions of the kernel weights) have been computed. It is common for a convolution to have between 64 and 256 output components, each of which has a unique specific set of 27 weights plus a bias.

In this example each kernel is multiplying its 27 weights against the same patch of 9 pixels of 3 RGB components. For a relatively small set of 64 output components, each individual input component is multiplied by 64 arbitrary and unrelated weights. After the output components for each patch are computed, an adjacent patch is loaded from the image and the full set of weights of the kernel is applied again. This process continues until the right edge of the image is reached, and then the patch drops down one row and starts over from the left edge.

After the first layer is processed, the next convolution layer processes the output of the first as input to the second layer. So, a 3 by 3 convolution now has 3 by 3 by 64 weights to be applied to the 3 by 3 by 64 input components of the patch. If this layer has 256 outputs, 3×3×64×256=147,456 multiplications must be performed for each output position. The skilled person will understand that this refers to a single layer in a Deep Neural Network that may contain more than 40 layers.

The number of multiplications applied to each element of a patch is equal to the number of channels in the layer. In a standard CPU, these must necessarily be done in some sequence. Many modern CPUs have a capability of executing sets of multiplies simultaneously, especially if the data format is small (i.e. 8 bits). In a GPU or TPU, the number of multipliers available is much higher but each multiplier is designed to produce a product from two distinct and unrestricted factors.

In the current art processors, CPUs, TPUs or GPUs, do not take advantage of the simple fact that in CNN implementations one of the factors for multiplication is common for all the weights applied to an input channel during the processing for a patch.

The inventor in this application proposes a mass multiplier that performs all multiplications, otherwise conventionally done sequentially, in a single step. When the weights of a set of multiplications are all of some small precision (8 bits is typical for a TPU), there are a limited ($2^8$=256) number of distinct weights, and a corresponding number of distinct multiples of the common input (which may be of any size; no matter what precision the common factor is, there are still only 256 possible multiples when 8 bit weights are applied.) In this case there is a distinct advantage to implementing a circuit that produces all the required outputs at once with many fewer elements than the same number of unrestricted multipliers.

In an embodiment of the invention an equivalent mass multiplier is dedicated to a single input channel and is not always shared. So, the operation has an option of using several clock cycles and multiple register stages. This allows the operation to take very simple and efficient forms without impacting overall throughput of the system.

In common cases where a single dynamic value is multiplied by many constants, substituting a single multi-stage mass multiplier circuit, as in an embodiment of the present invention, for the equivalent set of independent single stage multiplier circuits results in a system that performs the same calculations with substantially higher throughput and substantially lower power and footprint. Even if the set of outputs is less than the number of actual multiples used, there may still be considerable savings in power and space.

Having established a distinct advantage of a unique mass multiplier in an embodiment of this invention over independent multipliers, reordering the sequence of operations can increase the advantage further.

There is nothing in the mathematics of a neural network (or other similar image processing) algorithm that requires any specific sequence of operations. If the same operations are done in any order, the same correct computation will be made. The inventor observes that the usual order for software executing on a CPU, GPU, or TPU-based design is to produce all output channels for a given position at the same time by multiplying the weights by the inputs and summing them immediately. Producing all output channels for a given position at the same time by multiplying the weights by the inputs and summing them immediately minimizes the number of times the inputs must be read from RAM as well as limiting the number of times the weights must be read, also from RAM. It does not eliminate reading the inputs multiple times because there is no place to retain them when processing the next row down other than RAM.

However, if, in an embodiment of this invention, the order of operations of a kernel or other aperture function defined to operate on an M by N patch of array inputs, is everted, that is, effectively turned inside out, then each input value is utilized only once, and no RAM buffers are required. Instead of producing outputs one at a time by reading the inputs redundantly as the aperture function passes over each row, this unique operation processes the inputs one at a time only when initially presented and retains partial sums for all incomplete outputs. The partial sums may be retained in hardware shift registers or standard hardware first-in first-out registers (FIFOs), and the number of registers required to hold the values retained is proportional to the height of the kernel and the width of the input rows.

As the function that implements an aperture function can be decomposed into a series of sub-functions, each of which operates on the result of the immediately prior sub-function, the implementation of the kernel may be accomplished by composing the sub-functions in sequence over time such that each operates on the data immediately as received and results in the identical sequence of operations as applying the kernel in the abstract. We refer to this recomposed function, including any initialization, as an aperture function, and the individual steps as sub-functions. An aperture function, as used herein, refers to any M by N calculation to be implemented at a plurality of positions on a sliding window, or patch, of M by N inputs of a larger R by C array of inputs. An aperture function, as with implementation of a full CNN kernel, may also include an initialization and finalization operation. In the case of a CNN the initialization preloads a bias value into the accumulators and the finalization transforms the raw output of the kernel via an arbitrary activation function.

In this example of this invention, as components of each new input position are presented, the components at that position represent the first element of the patch down and to the right, and simultaneously the last element of the patch up and to the left and intermediate elements of all other patches that intersect the current position. This allows a computational circuit to be developed as an embodiment of this invention that has a fixed number of elements in process at all times (with some possible exceptions near the edges of the input) and produces outputs at the same rate as it accepts inputs.

Where the guiding algorithm requires evaluation of the aperture function over a patch that extends past an edge of the input array, many special cases and issues arise, but they are not insurmountable. Special case logic may be added such that the overlapping patch's partial results are made compatible with the normal case without affecting overall throughput.

In embodiments of the invention this everted form of aperture function operations accepts inputs as a stream and produces outputs as a stream. Inputs need not be buffered in RAM because they are each referenced only once. Since the outputs are also in a stream, they also can be processed by subsequent layers without RAM buffering, which is a result attributable to this invention that substantially increases processing speed over many otherwise necessary read and write operations to RAM.

In an embodiment of the invention, in place of many layers sharing a single set of independent multipliers executing, storing and then reading back the results to process the next layer in sequence, a pipeline may be produced using dedicated mass multipliers that processes all layers simultaneously, feeding the output stream of each layer into the input of the next layer without waiting for any layers to be complete.

A fully implemented pipeline in an embodiment of the invention thus may reach an effective throughput measured at two orders of magnitude greater than a conventional output-centric ordering process and eliminates contention for RAM (because it doesn't use RAM). It is this contention for RAM that forms a primary bottleneck for GPU and TPU-based processing.

Latency of such a system in an embodiment of this invention is reduced to the time from input of last pixel to output of last result. Since the last pixel of the image, by definition of the algorithms, must necessarily be the last datum required to complete all of the final computations for all layers, the latency of the system is strictly the clocking rate times the number of distinct clock stages in the pipeline including the final output.

Using a single dedicated mass multiplier for each input channel throughout a neural network in an embodiment of this invention (in place of a limited set of independent multipliers that must be reused and dynamically assigned) makes it possible to build a pixel-synchronous pipeline where all multiplications are executed in parallel because it only takes a single mass multiplier to process an arbitrary number of weights applied.

Having described the essential features of the innovation of mass multipliers, and also advantages of eversion, the inventor posits specific examples below:

FIG. 1 is a diagram illustrating an embodiment of the invention wherein each of a plurality of one or more source channels 1 through N, labeled 101a through 101d has a dedicated mass multiplier 102a through 102d assigned. Since each source channel in this example has a dedicated mass multiplier circuit to create the set of multiples of that channel's values, the source channel formats may vary between signed, unsigned, fixed or floating point in any precision convenient for the processing algorithm implemented in hardware. Specific outputs of each mass multiplier circuit, such as mass multiplier circuit 102c, may be fed directly into one or more computation units 103a through 103d that may perform calculations that require multiples of any or all of the source channels. Such computation units may be used to implement independent output channels of a single algorithm or unrelated algorithms to be computed on the same source channels. The outputs of the computations may be forwarded for further processing as shown at 104 as may be required by the algorithm, or algorithms, implemented in hardware. This situation arises, for example, when implementing a Neural Network in a Field Programmable Gate Array (FPGA) where the weight values applied as multiplicands will not change.

Figure 2:
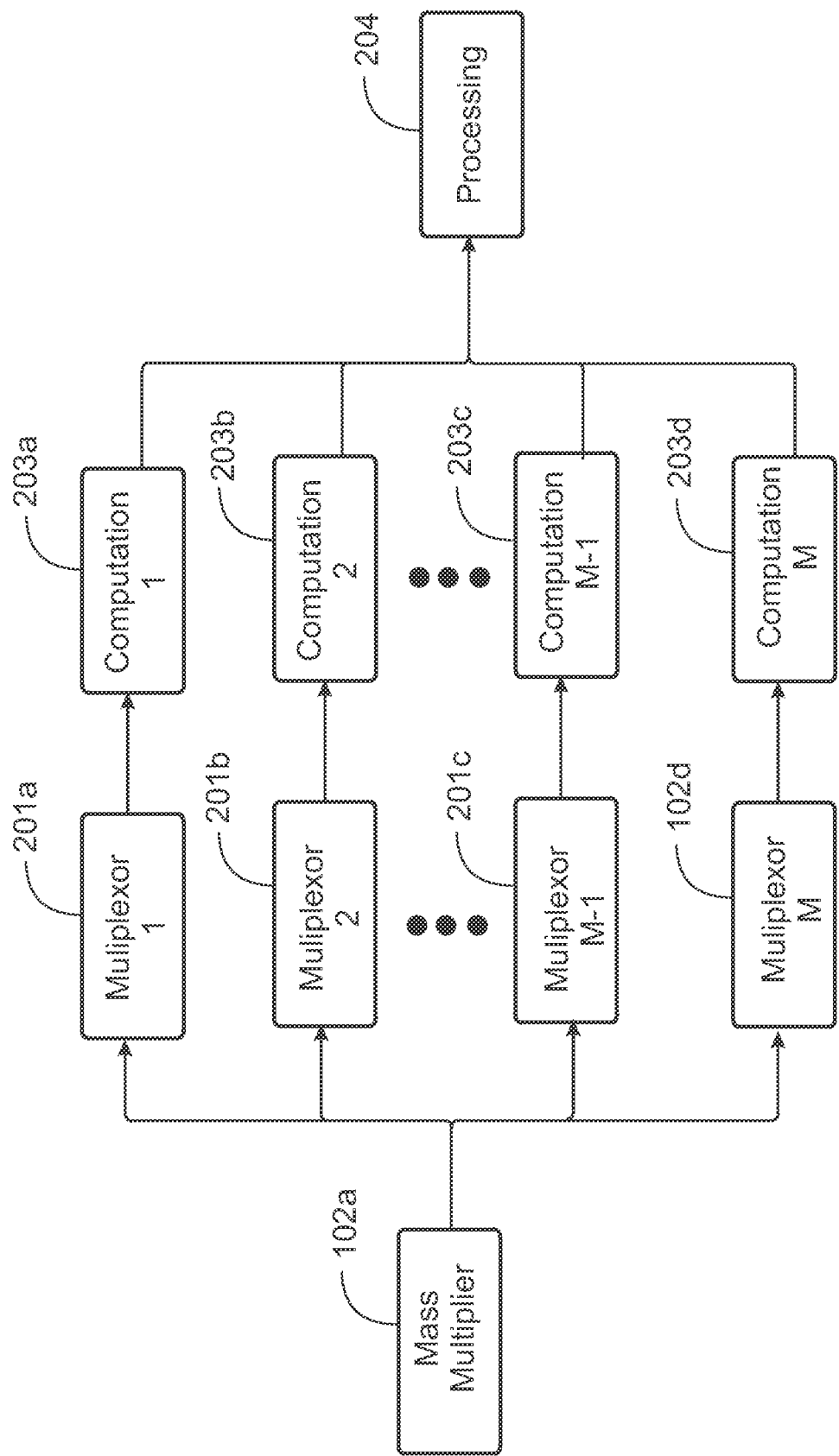
FIG. 2 illustrates an embodiment where the mass multipliers applied to each common source are dynamic and routed through multiplexors to the processing circuit.

FIG. 2 illustrates an embodiment of the invention wherein the outputs of each mass multiplier, such as mass multiplier 102a of FIG. 1, are fed through a set of multiplexors 201a through 201d into computation units 203a through 203d such that the multiple selected may be chosen either on initialization of the system, or dynamically as it operates. The outputs of the computations may then be forwarded for further processing at 204 as before. This situation arises when implementing a Neural Network in an application specific integrated circuit (ASIC) where the structure of the computation is committed but the weight values used need to be alterable.

Figure 3:
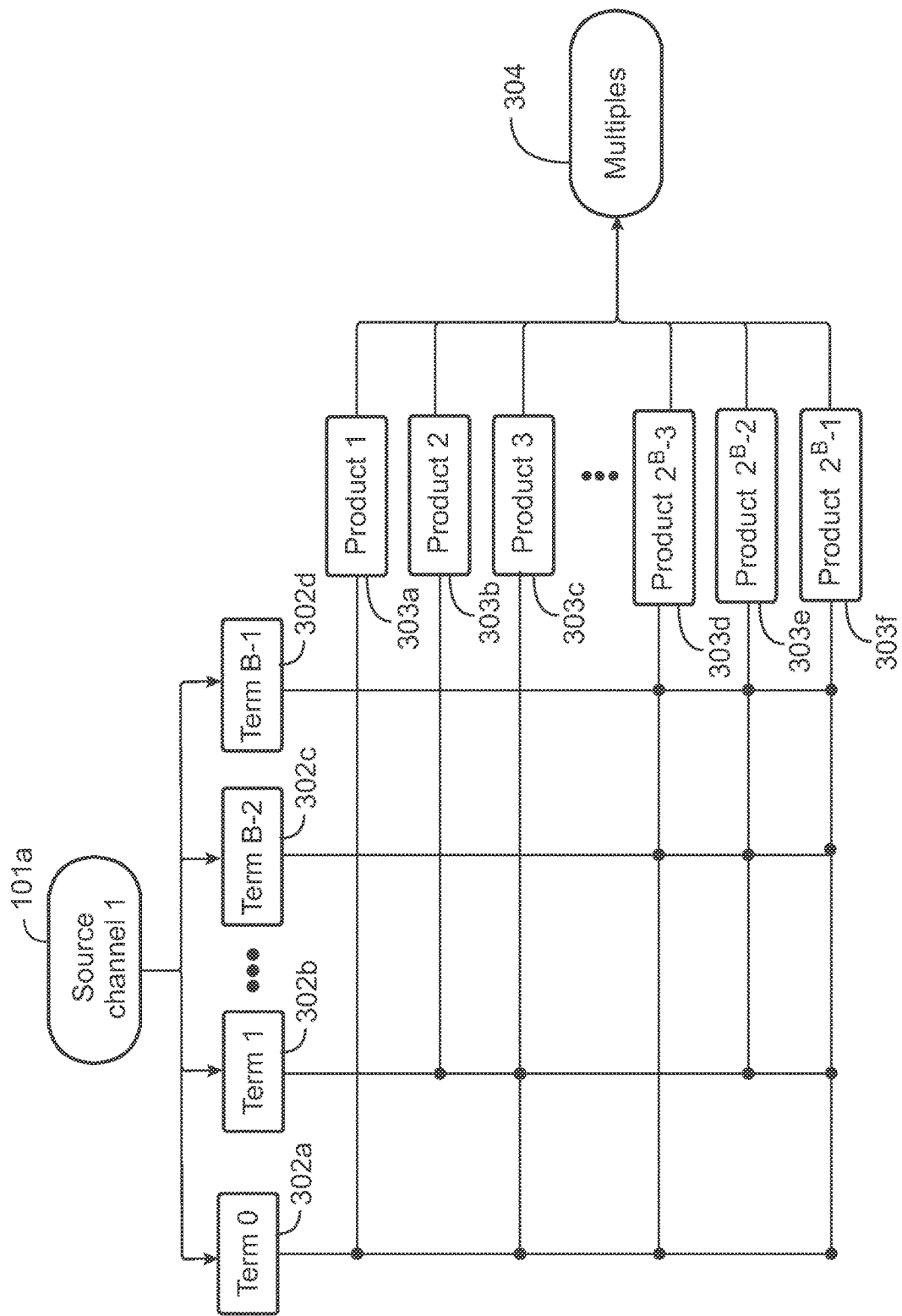
FIG. 3 illustrates a simple embodiment where shifted terms corresponding to bits set in each mass multiplier are summed to form a product.

FIG. 3 illustrates internal structure of mass multiplier 102a of FIG. 1 and FIG. 2 in one embodiment. This structure may be common to mass multipliers 102b, 102c, and 102d, as well as to other mass multipliers in other embodiments of the invention. In this structure products 303a through 303f of source channel multiplicand 101a of A bits by all possible multipliers of B bits are produced in parallel and delivered to multiples 304. In this example the A bits of source multiplicand 101a are duplicated and shifted up by appending 0 bits to the least significant position and padded by prepending 0 bits to the most significant position such that a full set of all required shifted values from 0 to B−1 are available in form of a vector of A+B bit terms 302a through 302d. These terms may be formed simply by routing circuit connections and no register or logic circuitry is required. In a case where the clock period is sufficient to allow a maximum of B terms of A+B bits to be composed in a single period, no registers or sub-composition may be required. Individual products 303a through 303f of the summed terms may be registered locally or forwarded for further processing as combinatorial logic. Each product of 1 to 2^B−1 times a source multiplicand 101a may be formed by adding any or all of the B corresponding terms 302a through 302d wherever a 1 bit in each multiplier occurs. The multiple 0 of any and all sources is a constant of all 0 bits and may be included in multiples 304 for completeness when using multiplexors but otherwise requires no circuitry. Any unused products 303a through 303f may be omitted either by leaving them out of the circuit specifications, allowing the synthesis tools to delete them, or by any other method. Unused terms 302a through 302d may also be omitted but as they do not occupy logic this is generally without effect. In this fashion, all required multiples 304 of a source multiplicand 101 may be formed as a single stage pipeline or as combinatorial logic.

Figure 4:
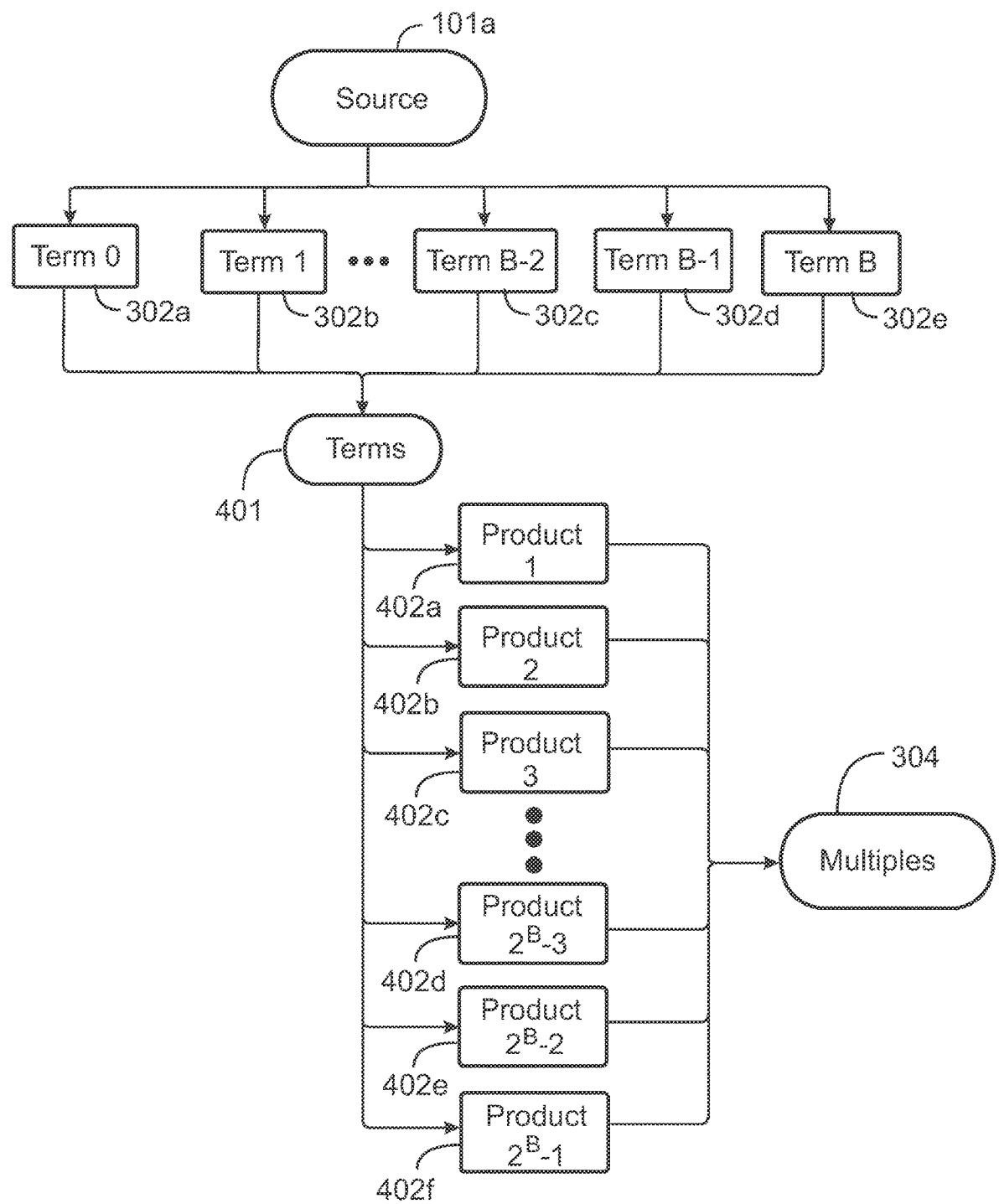
FIG. 4 illustrates an enhanced embodiment where addition and subtraction of shifted terms from each other are mixed to form an equivalent solution of lower complexity.

FIG. 4 shows an optimized embodiment wherein a set of terms 401 is comprised of all required individual terms 302a through 302e from 0 to B inclusive formed of A+B+1 bits. This allows for products 402a through 402f to include subtraction from a larger term in lieu of addition of smaller terms and may be used to reduce the overall size of a circuit which may also increase maximum allowed clock frequency. For example, for any given input a and multiplier 15, 8a+4a+2a+1a=15a combines four components while 16a−1a=15a combines only two and may be generally expected to be more compact and efficient. Each product 402a through 402f may be composed of any additions and subtractions of terms 302a through 302e that yield the correct result, and each specific variant may be chosen based on optimal tradeoffs for the specific implementation technology. For example, a subtraction of two N bit quantities may require more logic than an addition of two N bit quantities, but in general an addition of three N bit quantities will always require more logic than a subtraction of two. The treatment of required multiples 304 is unaltered by details of composing individual products 402a through 402f.

Figure 5A:
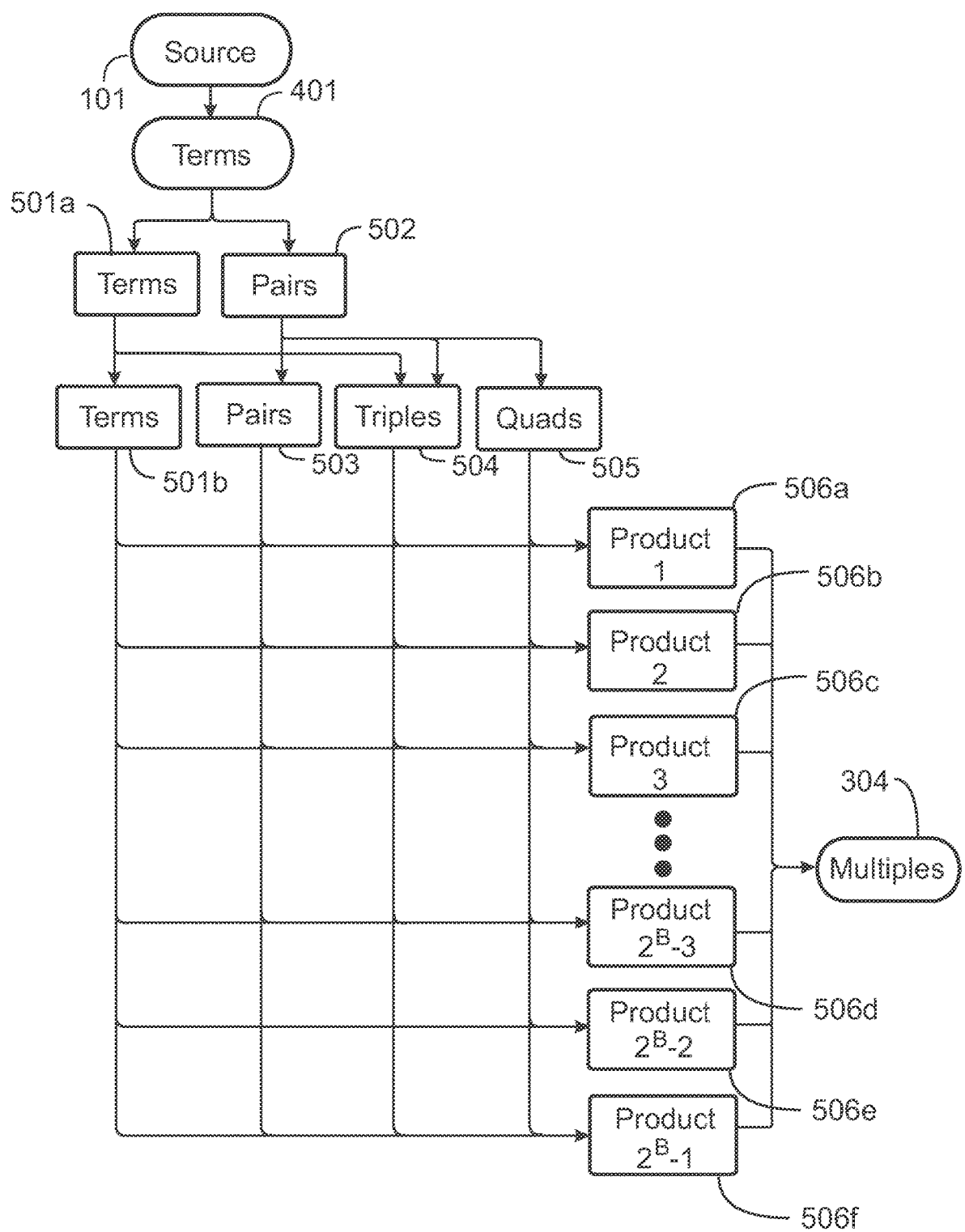
FIG. 5A illustrates a pipelined embodiment that maximizes clock frequency by building sub-compositions from only pairwise operations.

FIG. 5A illustrates an embodiment of a mass multiplier wherein the clock period is such that only a single addition of A+B bit values (or A+B+1 if subtractions are used) is possible per period. In this case, in order to accommodate multiples where more than two terms are utilized, it is necessary to arrange required elements into a multi-stage pipeline. Terms 401 are formed from each source channel 101 as before but are retained one or more times in pipeline registers 501a and 501b for later reference. Pairs 502 of two terms summed are computed and registered and then preserved 503 as necessary. Triples 504 are formed as sums of pairs 502 and retained terms 501. Quads 505 of term values are formed as sums of pairs 502. Any and all unused elements may be omitted and to increase overlap only descending sequences of addends may be specified. This ensures that redundant sums, e.g. a+b and b+a, are not both utilized and retained in the final circuit. Products 506a through 506f may utilize any addition or subtraction operation of any pair of registered sub-compositions that meet timing constraints. By consistently using the largest element available total size and hence power may be reduced but any combination of operations that yield correct results are acceptable.

The embodiment of FIG. 5A is sufficient to produce all required multiples where B=8. For larger multiple sets, sub-compositions shown may be recombined in further pipeline stages such that all required multiples 506a through 506f for any value of B may be composed from single clock operations on the extended set of sub-compositions that includes the previously disclosed retained terms 501b, retained pairs 503, triples 504, and quads 505 together with such other sub-compositions as required to form a set of terms sufficient to form the multiples 506a through 506f by single clock operations.

Figure 5B:
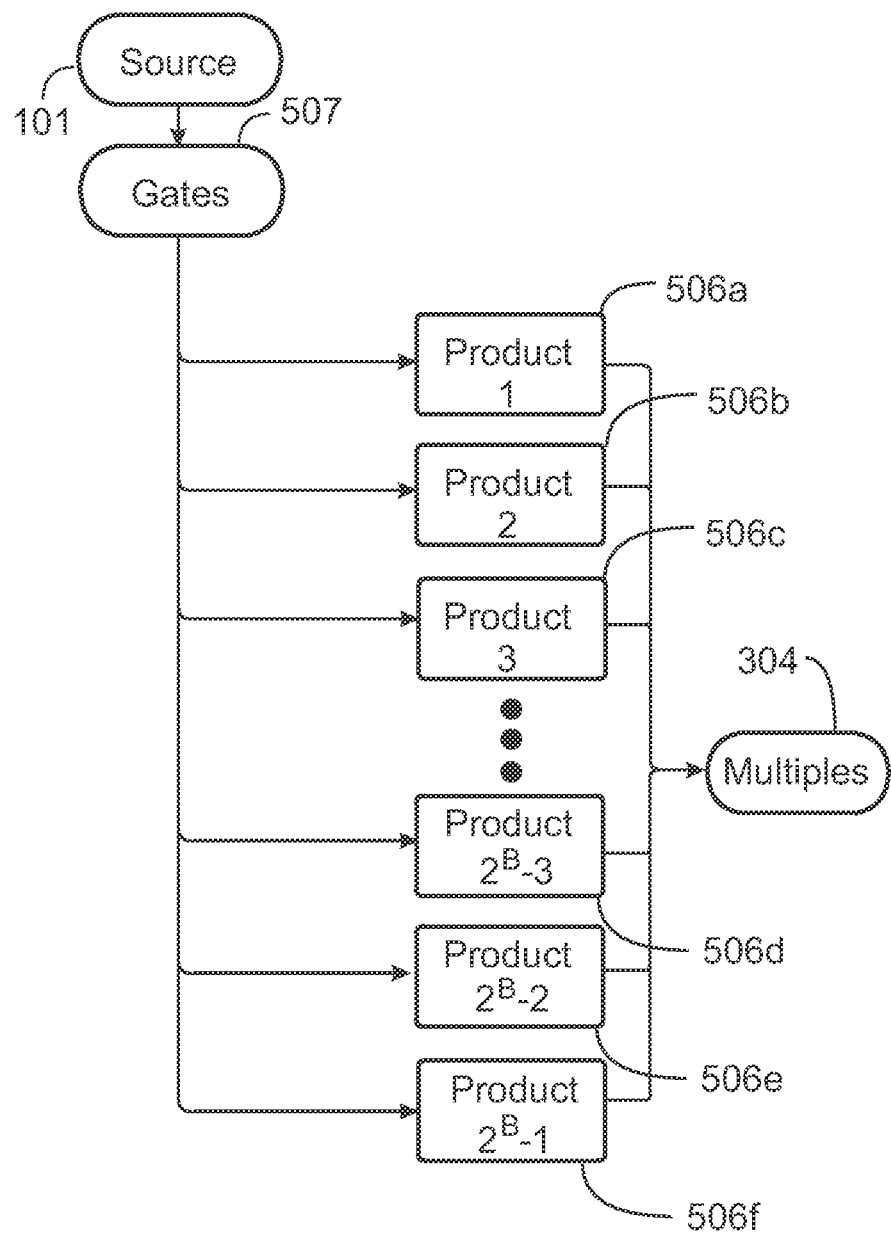
FIG. 5B illustrates an embodiment wherein the multiples are formed directly by a fixed set of cases without reference to standard arithmetic operations.

FIG. 5B illustrates an embodiment wherein the multiples are formed directly by a fixed set of cases without reference to standard arithmetic operations. For each of the required multiples the set of output values a*b is enumerated for each source channel value a. This allows for hardware circuit synthesis tools to determine an optimal logic circuit 507 to produce the full set of required multiples. Specification of the required output values for any given input value is typically made by enumeration in Verilog 'case' or 'casex' statements. This is distinct from a lookup table where the output values are stored and accessed via an index formed from the inputs because logic gates are used to implement the minimum subset of operations required to produce the full set of output values and redundant logic used to produce related subexpressions will be combined.

Which of methods 5A and 5B is most efficient in terms of space, frequency and power depends on specific values of A and B as well as the core efficiency of arithmetic operations vs arbitrary logic. Choice of which method to use may be based on direct observation, simulation or other criteria.

Figure 6:
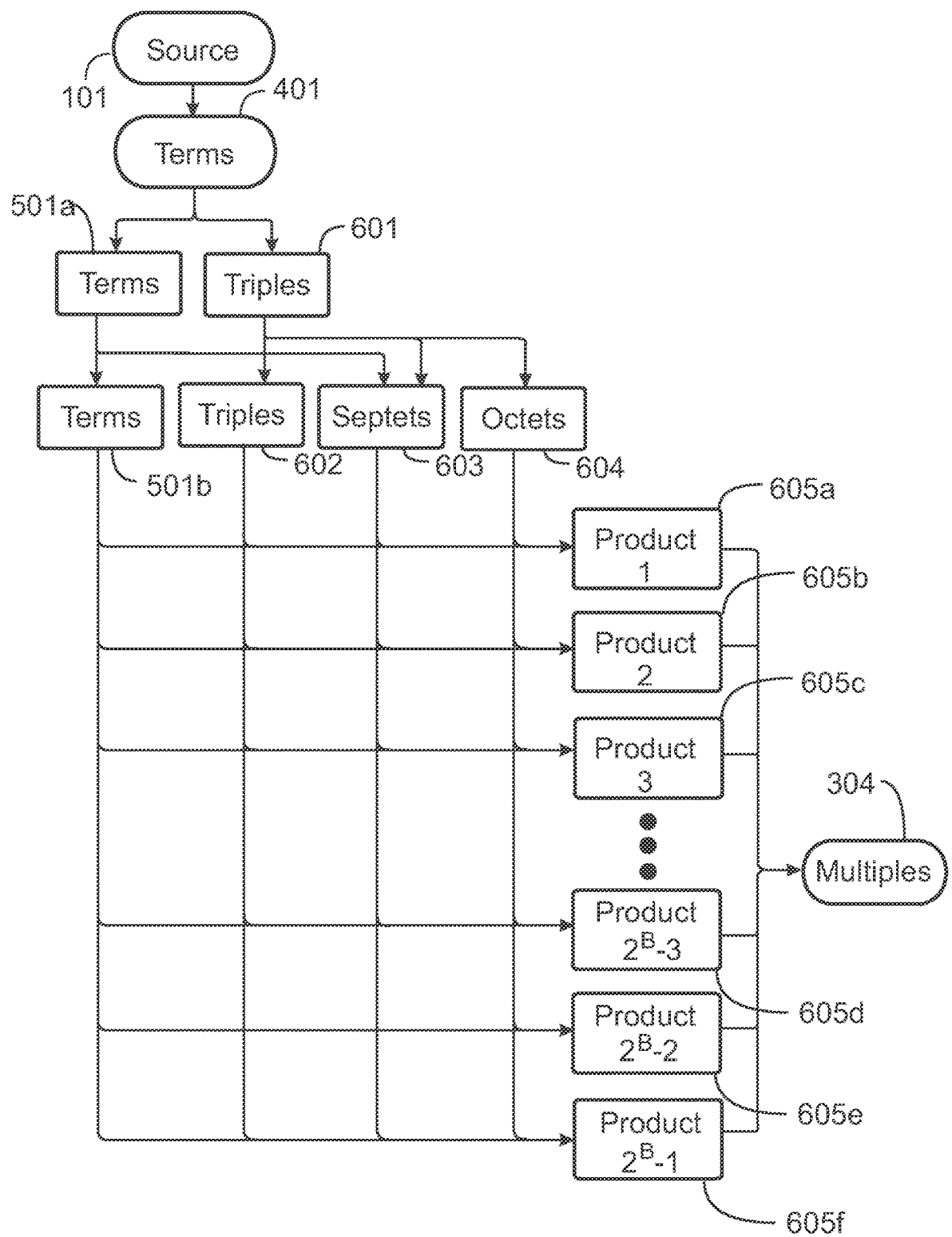
FIG. 6 illustrates a pipelined embodiment that maximizes circuit density by building sub-compositions from up to four-wise operations.

FIG. 6 illustrates an embodiment wherein the clock period is such that sufficient levels of logic allow for composition by addition and/or subtraction of four elements during each single clock period. By selecting from a set of sub-compositions, each product 605a though 605f may be produced by combining no more than four registered elements. As before, terms are retained in registers 501a and 501b, but triples 601 retained in 602 are composed directly from terms 401 and no pairs are used. Septets 603 and octets 604 are formed from triples 601 and retained terms 501a.

The example embodiment of FIG. 6 is sufficient to produce all required multiples where B=32. For larger multipliers, sub-compositions shown may be recombined four at a time in further pipeline stages to produce all required multiples for any value of B. The sub-compositions of elements shown are necessary and sufficient to produce all products where B=32 but other sub-compositions (perhaps chosen for consistency across different values of B) are acceptable.

When the set of multipliers is fixed, as is common for FPGA applications, then even a large, sparse set of multipliers may be efficiently implemented since common elements are merged and unused elements may be omitted. When synthesis tools perform this function automatically, an expression of a circuit may include all possible elements without explicitly declaring which multiples are used.

If operations on A+B or A+B+1 bit values cannot be completed in a single clock cycle, a multistage pipeline adder may be inserted for any single stage composition logic if extra pipeline registers are inserted as necessary such that all paths have the same number of clock periods. Pipeline stage periods may be instances of a single edge to edge clock transition, or a multicycle clock if throughput constraints allow. Neither multiple clock stages per operation nor use of multicycle clocking requires structural alteration to any embodiment other than the issues mentioned immediately above.

An important object of the invention is to provide to the industry mass multipliers implemented in integrated circuits, to be used in a variety of applications. Toward this end the inventor provides in one embodiment a mass multiplier implemented as an integrated circuit, the integrated circuit having a port receiving a stream of discrete values, and circuitry multiplying each value as received at the port by a plurality of weight values simultaneously, and an output channel providing products of the mass multiplier as produced.

In one version the discrete values received may be unsigned binary values of fixed width, the weight values may be unsigned binary of fixed width of two or more bits, and each multiple may be composed as a summation of bit-shifted duplicates of the input. In another version the set of shifted duplicates may be increased to allow the use of subtraction operations to reduce or otherwise optimize the circuit. Unused outputs of the set may be omitted either explicitly or implicitly.

In one embodiment the set of output products may be produced by combinatorial logic. In another the set of output products may be produced by a single stage pipeline, using single or multiple clock cycles. In another the set of output multiples may be produced by a multi-stage pipeline by combining no more than two addends per stage. Unused elements of the intermediate sub-compositions may be eliminated from the circuit either explicitly or implicitly.

In one embodiment the set of output products may be produced by a multi-stage pipeline by combining three or more addends per stage and the sub-compositions may be adjusted accordingly. Unused elements of the intermediate sub-compositions may be eliminated from the circuit either explicitly or implicitly.

Another object of the invention is to provide mass multiplication in integrated circuits to implement substantially improved convolutional neural networks in the ongoing evolution of deep learning and artificial intelligence. The inventor in this effort provides a first convolutional neural network (CNN) node, implemented as an integrated circuit, which has a first input channel defined as a stream of discrete values of a first component of an element of an array.

In this description the inventor intends the nomenclature of an element of an array to mean an element that may have a single component, or multiple components. A good example is an image, which may have pixels as elements, and each pixel may have a single component, if the image is monochrome, or three color values in one example, if the image is in RGB color. Each color value in this example is a component of the element, which is a pixel.

Continuing with the description above, of a first convolutional neural network (CNN) node, implemented as an integrated circuit, with a first input channel defined as a stream of discrete values of a first component of an element of an array, there is further in this CNN a first mass multiplier circuit multiplying the discrete values of the first component, as received, by a plurality of weight values simultaneously. An output channel provides an output stream of discrete values.

In one embodiment of the CNN node the first output stream is formed from products of the first mass multiplier circuit in some circumstances by combining products with constants and in some circumstances by applying an activation function.

In another embodiment the CNN node further comprises a second input channel defined as a stream of discrete values of a second component of the element of the array, and a second mass multiplier circuit multiplying the discrete values of the second component, as received, by a plurality of weight values simultaneously. In another embodiment there may be a third input channel defined as a stream of discrete values of a third component of the element of the array, and a third mass multiplier circuit multiplying the discrete values of the third component, as received, by a plurality of weight values simultaneously.

Having described a CNN node having one, two or three input component streams and dedicated mass multipliers, the inventor further provides a convolutional neural network (CNN) that has a first convolutional neural network (CNN) node, implemented as an integrated circuit, comprising input channels defined as streams of discrete values of components of elements of an array, mass multiplier circuits dedicated to individual input channels, multiplying the discrete values of components, as received, by a plurality of weight values simultaneously, and an output channel providing an output stream of discrete values, and a second CNN node having input at least partially dependent on output of the first node. This CNN may have successive nodes and may operate as a deep neural network (DNN). There is no requirement that successive nodes after the first node be CNN nodes.

Pipelined Aperture Function Operations

Referring now back to earlier description in this specification, discussing order of operations in processing a CNN or other similarly chosen aperture function that passes an array of computation sub-functions over an array of inputs to produce a net result, specific description is now provided of an everted form of aperture function operations in an embodiment of the present invention that accepts inputs as a stream and produces outputs as a stream. In this embodiment of the invention inputs are not, and need not be, buffered in RAM because each input is referenced only once. Outputs are also produced in a stream, so the output stream may be processed by a subsequent layer without RAM buffering. The inventor believes this innovation substantially increases processing speed over many otherwise necessary read and write operations to RAM in other systems of processing.

Apparatus and a method are provided in an embodiment of the invention wherein action of passing a two-dimensional aperture function over a two-dimensional array is accomplished by acting on an incoming stream of inputs such that all inputs are processed immediately and partially completed computations are retained until such time as all required inputs are received and processed, and the output is produced in a conformant stream with typically identical or lower data rates to the input stream. All inputs are accepted and processed at the rate provided and are not required to be stored or accessed in any order but in the order presented. If the application of the aperture function is defined such that more outputs are produced than inputs, the circuit can still operate at incoming data speed by selecting a processing clock rate at a sufficient increase such that the system never fails to accept and process an input when presented.

The conventional way to implement a convolution of a kernel or more general aperture function against a larger input array is to gather the required input patch, apply the function to the inputs and output the result. As the aperture is passed over the input array, each succeeding patch will overlap with the one just processed so some inputs may be retained and reused. Various mechanisms such as FIFOs may be used to avoid reading the inputs redundantly from source storage as the patch advances to each new row, but the source data will still be applied to each position in the kernel in turn to produce each output whose input patch overlaps with each specific data input position.

If there are many output channels and many independent aperture functions to be computed, a mass multiplier may be used to provide products of the patch of input values under consideration to all of the aperture functions in parallel. But with this arrangement and order of operations, each position of source data will require a set of products for each position in the kernel as it is combined into the various output positions that overlap.

A mechanism of the instant invention is to evert, that is, to turn inside out, the order of operations for specific advantage of using a single mass multiplier per input channel applied to a given input value only once. Rather than retaining or rereading source values for later use in the form of computing later products, the process in an embodiment of the instant invention computes all required products of each input when presented and retains a running total for each element of the aperture function that is complete up to the point in which the current input appears.

Any aperture function that can be mathematically decomposed into a series of sub-functions that are applied in sequence can be implemented in this fashion. Since CNN kernels are simply a sequence of additions of the products of weights times inputs, and the order of the operations is compatible with the order of the source inputs taken left to right, top to bottom, the mechanism can easily be applied.

In an embodiment of the invention an array of compositors is implemented on an IC, corresponding to the sub-functional elements of the aperture function, each keeping a running total of the value of the aperture function as it progresses over the input stream. The final compositor in the array outputs the complete value of the function, and all other compositors output a partial value of the function.

In the simple case of application of a 3 by 3 kernel, the output of the upper left compositor reflects the first element of the kernel applied to current input plus any initialization constant, the output of upper middle compositor reflects the first two steps, and the output of the upper right compositor reflects the first three steps. The output of the upper right compositor needs to be delayed until it can be used again by the next row. The next row of compositors continues the pattern of accepting a partially completed function value adding the contribution of each new input and passing it forward. The last row of compositors completes the last steps of the function and outputs the completed value for any further processing.

Noting that the progression of partial values of the function between compositors is generally from left to right in a first row, then left to right in succeeding rows, to finally a last compositor in the last row, one may consider the flow of partial values is a stream and refer to compositors and flow as upstream or downstream.

At all times, each compositor maintains the partial sum of the aperture function up to and including the current source input. Each compositor is always working on a different patch position of the output, specifically that patch where the current input appears in the compositors' relative position in the aperture sub-function array.

If a 3×3 kernel W is expressed as a function of inputs A as $$A = \begin{bmatrix} a_{11} & a_{12} & a_{13} \\ a_{21} & a_{22} & a_{23} \\ a_{31} & a_{32} & a_{33} \end{bmatrix} \quad W = \begin{bmatrix} w_{11} & w_{12} & w_{13} \\ w_{21} & w_{22} & w_{23} \\ w_{31} & w_{32} & w_{33} \end{bmatrix}$$

$$u = k + a_{11}w_{11} + a_{12}w_{12} + a_{13}w_{13} + a_{21}w_{21} + a_{22}w_{22} + a_{23}w_{23} + a_{31}w_{31} + a_{32}w_{32} + a_{33}w_{33}$$

the function implementing the kernel can be decomposed into equivalent sub-functions.

$$v_0(a) = k + aw_{11}$$
$$v_1(t,a) = t + aw_{12}$$
$$v_2(t,a) = t + aw_{13}$$
$$v_3(t,a) = t + aw_{21}$$
$$v_4(t,a) = t + aw_{22}$$
$$v_5(t,a) = t + aw_{23}$$
$$v_6(t,a) = t + aw_{31}$$
$$v_7(t,a) = t + aw_{32}$$
$$v_8(t,a) = t + aw_{33}$$

$$u = v_8(v_7(v_6(v_5(v_4(v_3(v_2(v_1(v_0(a_{11}),a_{12}),a_{13}),a_{21}),a_{22}),a_{23}),a_{31}),a_{32}),a_{33})$$

$$u = ((((((((k+a_{11}w_{11})+a_{12}w_{12})+a_{13}w_{13})+a_{21}w_{21})+a_{22}w_{22})+a_{23}w_{23})+a_{31}w_{31})+a_{32}w_{32})+a_{33}w_{33}$$

$$u = k + a_{11}w_{11}+a_{12}w_{12}+a_{13}w_{13}+a_{21}w_{21}+a_{22}w_{22}+a_{23}w_{23}+a_{31}w_{31}+a_{32}w_{32}+a_{33}w_{33} = u(A,W)$$

The circuitry required to compute those sub-functions is then arranged in a corresponding array of compositors $$\begin{bmatrix} v_0 & v_1 & v_2 \\ v_3 & v_4 & v_5 \\ v_6 & v_7 & v_8 \end{bmatrix}$$

and the partially completed sums are maintained as the output value of the compositors $$\begin{bmatrix} k+a_iw_{11} & k+a_{i-1}w_{11}+a_iw_{12} & k+a_{i-2}w_{11}+a_{i-1}w_{12}+a_iw_{13} \\ k+a_{i-3}w_{11}+a_{i-2}w_{12}+a_{i-1}w_{13}+a_iw_{21} & k+a_{i-4}w_{11}+\ldots+a_{i-1}w_{21}+a_iw_{22} & k+a_{i-5}w_{11}+\ldots+a_{i-1}w_{22}a_iw_{23} \\ k+a_{i-6}w_{11}+\ldots+a_{i-1}w_{23}+a_iw_{32} & k+a_{i-7}w_{11}+\ldots+a_{i-1}w_{31}+a_iw_{32} & k+a_{i-8}w_{11}+\ldots+a_{i-1}w_{32}a_iw_{32} \end{bmatrix}$$

Where a is the current value from the input stream and $a_{i-1}$ through $a_{i-8}$ in each case are the previously processed inputs for the specific patch where $a_i$ appears in the position relative to the output of each individual compositor. Each compositor will compute the value of the aperture function up to and including the position that the compositor corresponds to in the aperture array. Each compositor takes the current value of the input stream and combines it with previous values to produce a different partial sum corresponding to the partially processed patch in the input array where the current input value appears in the relative position of that patch corresponding to the position of each compositor in the aperture function.

In this way the partial values of the aperture function, computed in the standard order and precision, will be maintained over time on the input stream until the completed values are ready to output.

While this technique is quite straightforward within the interior of the input array, complications arise when applied to patches that overlap the edges of the input array as the aperture function is defined differently when all inputs are not available. In the case of a CNN kernel, the additional operations are dropped, equivalent to using zeros as inputs. The instant invention is concerned with maintaining a steady flow of partial sums through the compositors while processing those exceptions, as described below.

Figure 7:
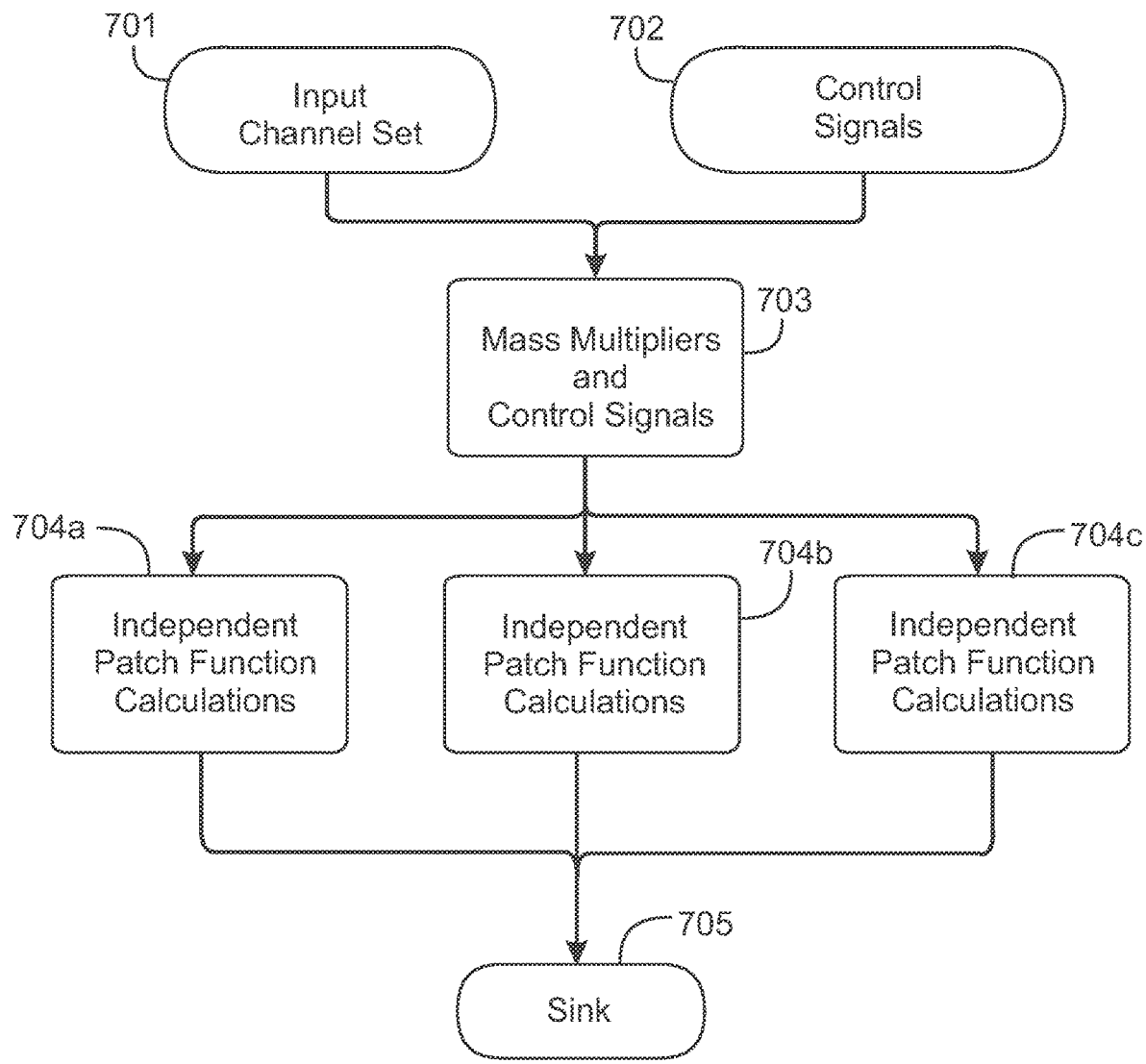
FIG. 7 is a diagram illustrating structure and connectivity in an embodiment of the invention receiving an input stream, preprocessing the input stream, and feeding results through a unique digital device to produce an output stream.

FIG. 7 is a diagram illustrating structure and connectivity in an embodiment of the invention receiving an input stream, preprocessing the input stream, and feeding results through a unique digital device to produce an output stream.

Input channel set 701 and associated control signals 702 are used by common circuitry 703 to produce any and all products of the input channel set with weights for subsequent sub-functions. The source channel products are then distributed to a bank of sub-function calculation circuits 704a, 704b, and 704c, each of which produces a single channel of an output channel set 705. Any number of independent output channels may be supported by the common circuitry 703.

Figure 8A:
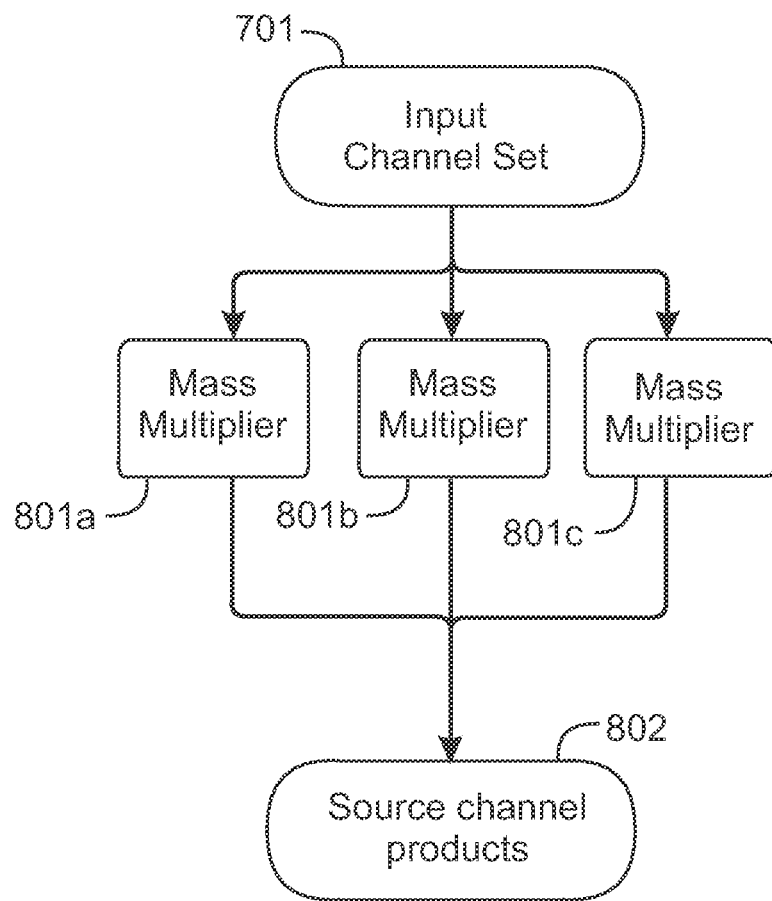
FIG. 8A is a diagram illustrating structure and connectivity producing source channel products.
Figure 9A:
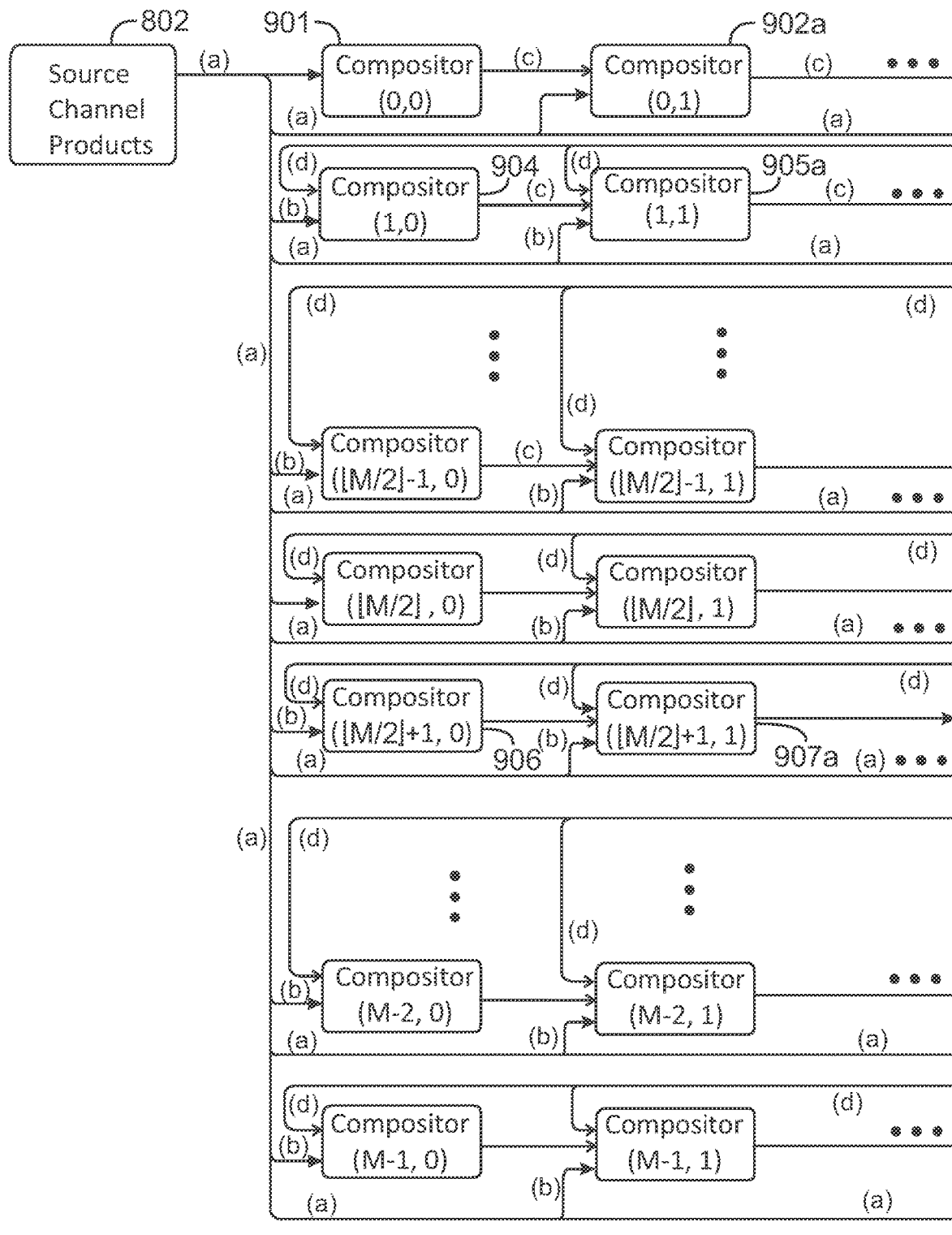
FIG. 9A is a partial illustration of a general case of pipelined operations in an embodiment of the invention.
Figure 9B:
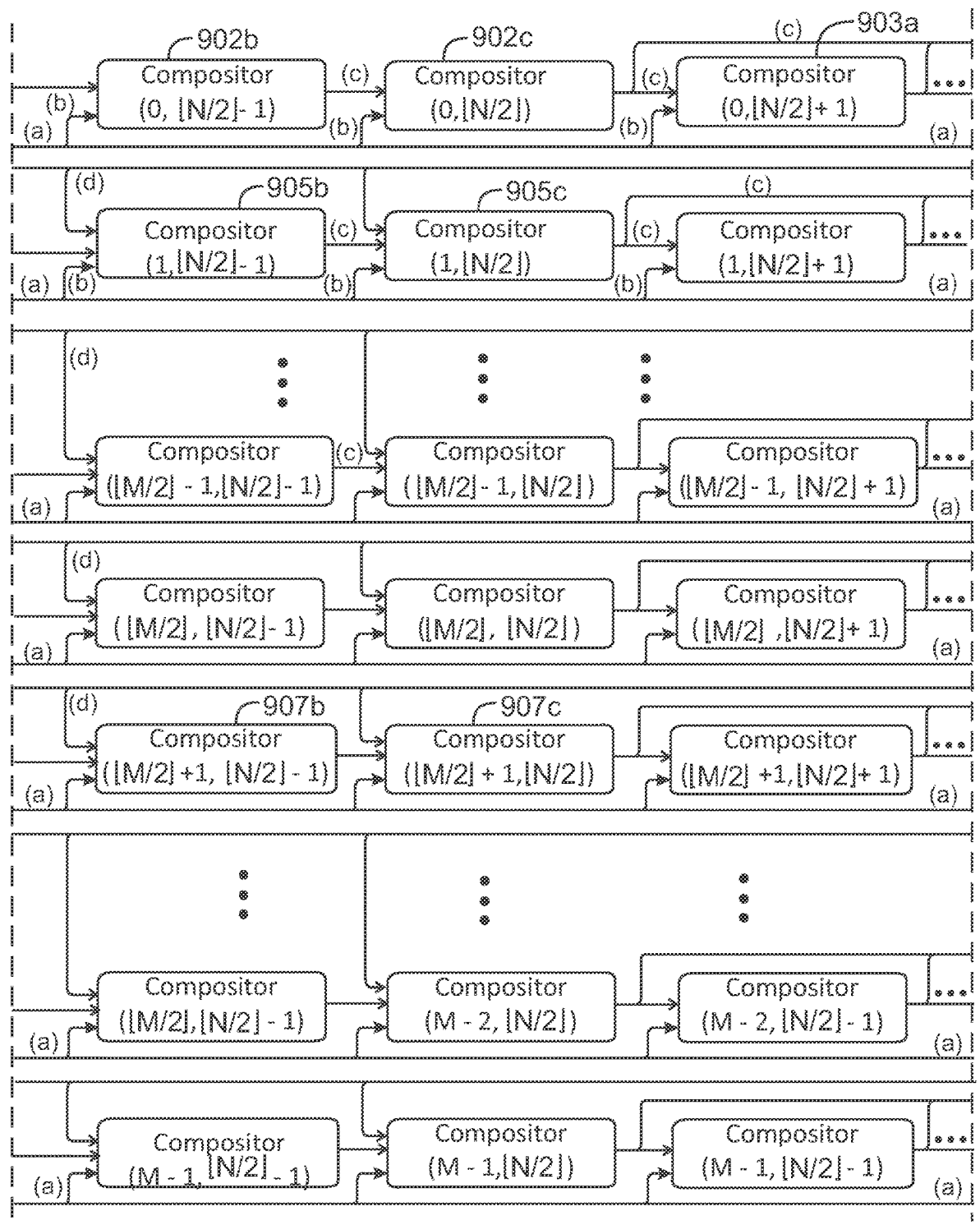
FIG. 9B is another partial illustration of the general case of pipelined operations in an embodiment of the invention.
Figure 9C:
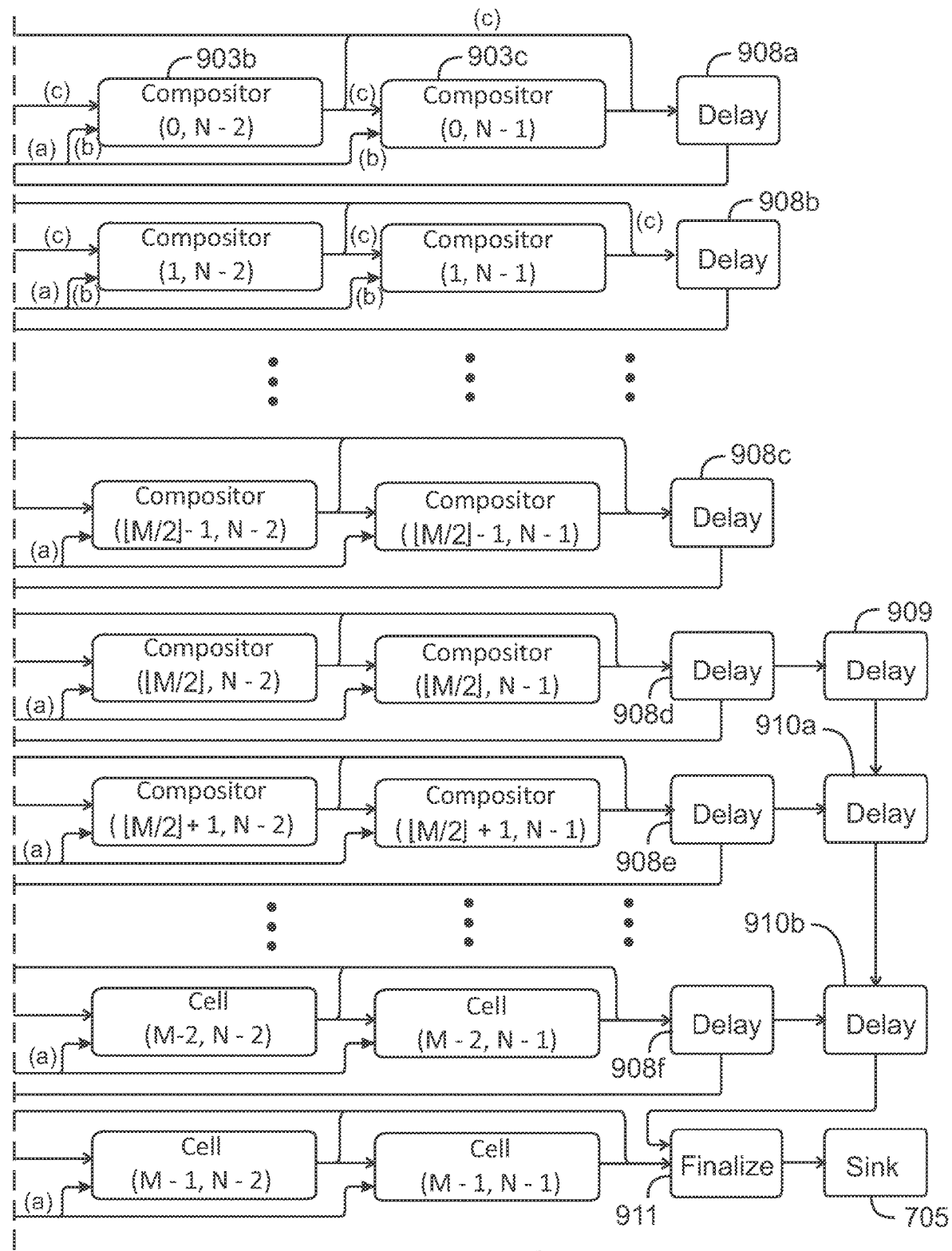
FIG. 9C is another partial illustration of the general case of pipelined operations in an embodiment of the invention.

FIG. 8A is a diagram illustrating mass multipliers 801a, 801b, and 801c, in common circuitry 703 of FIG. 7, that take each channel of input channel set 701 and produce either a sparse or a complete set of multiples as required by the defined sub-functions. It is to be noted that this illustration assumes three channels in an input channel set, as may be the case for such as red, green and blue pixel values in processing RGB images. In other embodiments there may be one, two, or more than three channels. Any or all of products 802 (multiples of source input array values constructed by the mass multipliers) may be made available to compositors as shown in FIGS. 9A, 9B, 9C described in enabling detail below. Compositors are instances of hardwired circuitry in the unique device of the invention that perform sub-functions on the source channel products produced by the mass multipliers of FIG. 8A.

Figure 8B:
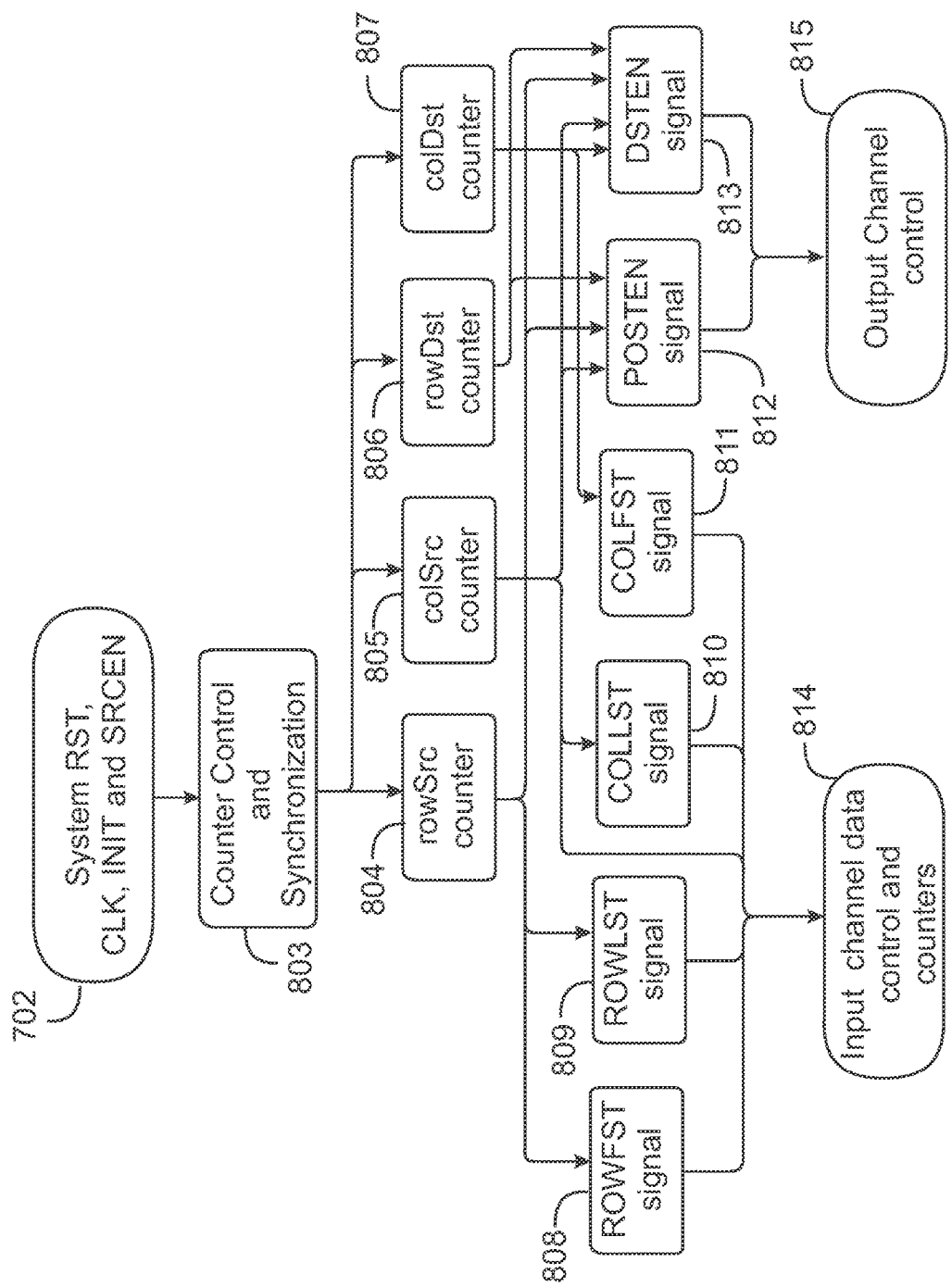
FIG. 8B is a diagram illustrating additional detail of control apparatus and functions in an embodiment of the invention.

FIG. 8B is a diagram illustrating structure of synchronization circuitry that provides both normal and exception handling signals to all compositors of all output channels.

Control circuitry 803 synchronizes all output and control counters to the source input stream and implements setting the output and control counters to an initial state whenever RST or INIT is asserted.

A colSrc counter 805 in this example counts out the inner dimension of the array column by column across a row and advances as each set of source channel products is processed. At the end of each row the colSrc counter returns, in this example, to the leftmost position (0) and a rowSrc counter 804 is advanced by one. At the end of the source array stream, the rowSrc and colSrc counters are returned to the initial state and are prepared to receive a new array of inputs.

In this example a colDst counter 807 and rowDst counter 806 together act in a similar manner as the counters for all output channels. The colDst and rowDst counters are enabled by an output enable signal (DSTEN) 813 and determine when a post processing enable signal (POSTEN) 812 is asserted.

It is to be noted that the system depicted in this example produces a single output of an aperture function but will normally be used to produce a stream set of channel outputs compatible with the dimensions of the source input stream. Each independent output channel will share at least some of computation circuitry via the mass multipliers and common control logic.

An output-enable (DSTEN) signal 813 controls when a finalization function accepts and processes results from the compositors. While the first several rows are accepted from the source input array, no valid results are presented to the finalization function (see FIG. 9C). Output enable signal 813 (DSTEN) is asserted when either the rowDst and colDst counters indicate that valid results are available or alternatively when processing delayed truncated results. POSTEN signal 812 is asserted continuously or periodically to conform to the timing of the SRCEN signal 801. These signals are required to sequence final outputs of all truncated compositors when processing the last row of the source input stream array. Each row of compositors from [M/2] to M−2 will produce final truncated outputs simultaneously with the last full outputs which must be retained and emitted sequentially after all full patch outputs in order to conform to the array stream format.

In this example the POSTEN and DSTEN signals, and colDst, and rowDst counter values are independent of the SRCEN signal and colSrc and rowSrc counter values and continue to process delayed results until all delayed results have been finalized and sent to the output stream. The system may accept new inputs while the previous outputs are completed, thus allowing the system to process multiple frames of the source input stream without pausing between the frames. While source stream data has not reached the end of the array, POSTEN is not asserted, and final results are taken from the compositors. Immediately after reaching the end of the source array, the POSTEN signal is asserted for each additional output and final results are taken from truncated delay lines 909, 910a, and 910b as shown in FIG. 9C described below, until the rowDst counter reaches the full number of output rows, whereupon rowDst and colDst are reset to initial conditions in preparation for a next frame of data.

A first row signal 808 (ROWFST) is asserted when the rowSrc counter indicates that the source data set from the stream represents the first row of the array.

A last row signal 809 (ROWLST) is asserted when the rowSrc counter indicates that the source data set from the stream represents the last row of the array.

A first column signal 810 (COLFST) is asserted when the colSrc counter indicates that the source data set from the stream represents the first column of each row of the array.

A last column signal 811 (COLLST) is asserted when the colSrc counter indicates that the source data set from the stream represents the last column of each row of the array.

FIGS. 9A, 9B and 9C illustrate the unique device mentioned above in a general case wherein M by N sub-function elements of an aperture function are applied to each overlapping M by N patch of an array of R by C inputs, including those that overlap the edges, the inputs presented as a stream of associated components at regular or irregular time intervals to produce a corresponding stream of R by C outputs wherein each output is the aggregate effect of the M by N functional elements applied to the input patch as specified by rules of an aperture function. The functional elements applied to each position in the array is in this device a hardwired compositor for each of the M by N sub-functions, as shown in the composite of FIGS. 9A, 9B and 9C.

The effect of the circuit is to compute the recomposed value of an aperture function at each position of the array of R by C inputs with an identical sequence of operations as would be used to compute an aperture function over each patch individually. If any positions are not desired in the output stream, circuitry can be added to omit them to produced tiled or spaced outputs rather than fully overlapping.

Source channel products 802 and source control signals 814 are made available to each of compositors 901, 902a, 902b, 902c, 903a, 903b, 903c, 904, 905a, 905b, 905c, 906, 907a, 907b, and 907c. Source control signals are also connected to delays 908a, 908b, 908c, 908d, 908e, and 908f. Output channel control and counters 815 are made available to delays 909, 910a, and 910b, as well as finalization function 911. Additional pipeline stages may be inserted by hand or by automated tools to make circuit routing feasible for a given clock frequency if and only if the order of operations is not altered. The timing control and counter signals are available to all elements of the circuit and are not individually shown.

Each compositor has a dedicated direct connection to either specific input products, or alternatively to a programmable multiplexor that selects one of the products for each input value in the set and is preconfigured before execution of the circuit. Each dedicated connection is a parallel pathway with a plurality of wires sufficient to carry the bits expressing the products required in a single input interval. The use of an optional preconfigured multiplexor to select which product for each set element is sent to each compositor allows for upgrade of the weight values in the field. A fixed connection is used when the weights are not to be upgraded and remains fixed for the lifetime of the device. As the selection of weights does not change during operation, the choice of fixed or variable product selection does not affect the operation of the circuits.

Each compositor receives the set of products corresponding to the weights of the sub-function, one per input channel, from the mass multiplier and performs the sub-function computation, typically simply adding them all together, to form the contribution of this compositor to the value of the overall aperture function. Each compositor, except those corresponding to the left column of the aperture function, also receives partially completed results from the compositor to the immediate left. Each compositor, except those corresponding to the top row of the aperture function, may also receive delayed partially completed results from the compositor on the row above. Each compositor has, at most, one connection from the left, and one delayed connection from above, each connection of which is a parallel pathway with a plurality of conductors sufficient to carry the bits expressing the partially completed results as input to the compositor. As per the definition of the subfunction with respect to the position of the current input patch relative to the edges of the input array, each compositor performs one of three operations: combination of this compositor's partial result with initialization values, if any, or combination of this compositor's partial result with partial results from the compositor to the left, or combination of this compositor's partial result with delayed partial results. The amended result is placed into an output register of a plurality of bits sufficient to contain the result and make that available in the succeeding input interval to the compositor to the right and/or the delay and finalization circuitry. This amended result may be either a partial result, a complete result, or a truncated result, depending on the position of the compositor in the aperture function and the state of the input stream position.

Compositor (0, 0) is unique in that no compositors exist to the left or above in the aperture function and so always initializes the computation with each input set received.

Compositor (M-1, N-1) is unique in that the result produced is always a final result but is structurally identical to all other compositors 903a, 903b, or 903c.

Some compositors' outputs are tapped for delay or post processing in which case the width of the pathway through such delay or post processing is sufficient to transport the bits expressing the partial, truncated, or completed result. Some compositor's outputs are only used by the compositor to the right. The computation internal to the compositor and output data format does not require alteration depending on the use of the output.

The finalization circuit takes the result from the several possible sources and multiplexes them to select which to process on any interval. After applying the finalization function, if any, the width of the final output may be reduced and will form the output stream of the instant embodiment which may either be the input stream of the next, the final outputs of the system containing the invention or may be used in further processing.

Data paths on the unique device in embodiments of the invention are indicated in FIGS. 9A, 9B and 9C by bold lines with direction indicated by arrowheads, and an ellipsis indicates where the last column or row in the range is repeated in its entirety. Data path (a) from source channel products 802 is a set of parallel conductive pathways, one pathway dedicated to each product of an input component, each product being the value of the input component multiplied by one of the plurality of weight values of the aperture function. It should be apparent that a 5 by 5 aperture function has 25 weight values for each input component. For the circumstance of an aperture function for an R by C input array of R, G and B color pixels, then, there are 75 weight values. Line (a) thusly, in this circumstance has 75 parallel pathways, each pathway a set of parallel conductors of a width to accommodate the desired number of bits for accuracy. Line (a) is termed in the art a set of point-to-point connections, as opposed to a bus.

Data paths (b) in FIGS. 9A, B and C are not extensions of line (a), but dedicated connections to a specific subset of the pathways in line (a). Lines (b) are not marked in every instance in FIGS. 9A, B and C, but every connection from line (a) directly to an individual one of the compositors is a dedicated line (b). The dedication is that each compositor is connected to that subset of pathways that carry the products of each input component and weight values required by that compositor.

Data paths (c) in FIGS. 9A, B and C are point-to-point paths between output registers in each compositor and a next compositor to the right. These are dedicated pathways of the accuracy width that carry typically a partial sum, as is described in enabling detail elsewhere in the specification. Not every path (c) is marked in the figures, but it may be assumed that in this example that every direct connection from one compositor to another is a pathway (c). Note that there are instances where output pathways (c) branch to alternative circuitry.

Another distinct data path in an embodiment of the invention is marked (d) in FIGS. 9A, B and C. These are dedicated data paths from delay circuits such as circuits 908A thru 908f, either back to compositors down a row and to the left, or directly to other delay circuits. The delay circuits are fashioned to accept partial sums at a right end of a row of compositors, to delay passing on the partial sums for a specific number of source intervals, and then to pass those partial sums to another compositor and/or other processing at a proper time. The overall functionality is described in enabling detail elsewhere in this specification. Pathways (d) between delay circuitry are similarly dedicated pathways for typically partial sums to be passed at certain source intervals.

If either of M or N is reduced such that no last rows or columns of a range are required, the ending elements are omitted and the implementation of the first row or column in the range is retained. In a degenerate case where one or both of M or N is reduced to 2, the first and last rows or columns are retained, and the intermediate rows or columns are omitted. In a degenerate case where one of M or N is reduced to 1, the implementations of first and last compositor are combined, and special initialization is not required. In the specific case where both M and N are 1, eversion of the aperture function is not required but the usage of the mass multiplier still affords distinct advantage.

Source channel products 802 may be any set of binary values presented contemporaneously associated with a specific position of the R by C array and in some predefined sequence. The source channels of the input stream can be any combination of integer or fractional values in any format of whatever nature is defined for the inputs of an aperture function. One example is pixel values from one or more video frames and/or any other sensor values scaled to match the array size R by C as well as feature component values produced as output of CNN layers. It is emphasized that each node that embodies this invention may accept output from other nodes in addition to or in place of primary source inputs. While it is common for the first node, or nodes, in an embodiment of the invention to accept image pixels as the primary input of the system, there is no restriction on the nature of the data processed if it can be formatted into a stream representing an R by C array.

In one embodiment of the invention, source stream element sets may be presented in row-first order with each succeeding column presented in strictly ascending order. In some embodiments of the invention the rows and columns need not correspond to horizontal or vertical axes, but may be arbitrary, as in scanning up or down the columns and right to left. Rows R and columns C here simply refer to the major and minor axes of the stream format. The circuitry need not be adjusted for input signals that produce the input stream in orientations other than standard video left-to-right, top-to-bottom ordering. The orientation of the aperture sub-functions can be made to conform to produce identical outputs for each input array position.

In this example source inputs, which are products of source values and weights as required by an aperture function, are presented by a signal (SRCEN See FIG. 8B) indicating when each new set of elements is valid. Input may be paused and resumed at any time. In some instances, a minimum interval between inputs may be defined, and the circuit may use multicycle or higher speed clocks to reduce size, power or otherwise take advantage and the output channel set may use the same minimum interval.

Common control and synchronization circuitry 803 (FIG. 8B) provides counters and control signals that describe the current input position in the R by C array. The counters may continue running for extra rows and columns after the final input to assist a finalization function 911 (FIG. 9C) to output accumulated outputs generated in excess of input columns by the last row of input. (See FIGS. 12, 13, and 14 and description below) Control signals are available to all other elements and are not shown in FIGS. 9A, 9B and 9C.

Compositor circuits 901, 902a, 902b, 902c, 903a, 903b, 903c, 904, 905a, 905b, 905c, 906, 907a, 907b, and 907c each compute that part of the aperture function assigned to their positions in the M by N function. All compositors operate on the same source channel set and on the row and column counter states as provided by control 803. Details of the data handling of the aperture function are described further below with reference to additional figures.

As source input sets are received from the input stream, partially completed computations of the aperture function as applied to all patches that overlap with the current position in the input stream are passed from left to right and top to bottom within the M by N array of compositors. This operation accumulates the full computation of the aperture function over time, and outputs the correct implementation of the aperture function over each patch of the input array producing the same result through the identical order of operations as would be the case if the aperture function were implemented by reading the input values directly from the array. Replacement of random access to the array with stream access is an important feature of the invention and eliminates the requirement for redundant access to a random-access memory.

At the right-side columns [N/2] through N−1 of the compositors, exclusive of the bottom row, partial outputs are passed to delay stages 908a, 908b, 908c, 908d, 908e, and 908f where they are held for the number of input intervals needed, such that they can be utilized in further computations of the same logical patch position when inputs are received corresponding to lower rows of the patch.

When processing the last column C−1 of each input row, all compositors from columns [N/2] to N−1 and rows 0 to M−2 also represent the last computation for that row of the patches that include the last column of the input array, and their values are forwarded to delay stages 908a, 908b, 908c, 908d, 908e, and 908f and require special processing to be inserted in the sequence, such that they will be available at the correct time to continue computing the aperture function when subsequent input rows are received. See FIG. 11 and associated description.

In this example compositor 903c at the (M−1, N−1) position always produces a completed accumulation of the M by N sub-function elements but is otherwise indistinguishable from other compositors of that configuration 903c. As above, when processing the last column C−1 of each input row, all compositors from columns [N/2] to N−1 on row M−1 also represent completed but truncated accumulations of the aperture function elements and are sent directly to finalization function 911 for processing to be inserted into the output stream.

In this example while processing the last row R−1 of inputs, compositors in column N−1 from row [M/2] to M−1 also represent completed but truncated accumulations of the sub-function element computations and are sent to truncated outputs delay lines 909, 910a, and 910b and retained until the primary outputs from row M−1 have been finalized at 911. With control signals as shown in FIG. 8B, additional M−[M/2] rows of truncated outputs are transferred from delay lines 909, 910a, and 910b and finalized 911, and ultimately provided at any required timing interval to the output stream sink 705.

Figure 15:
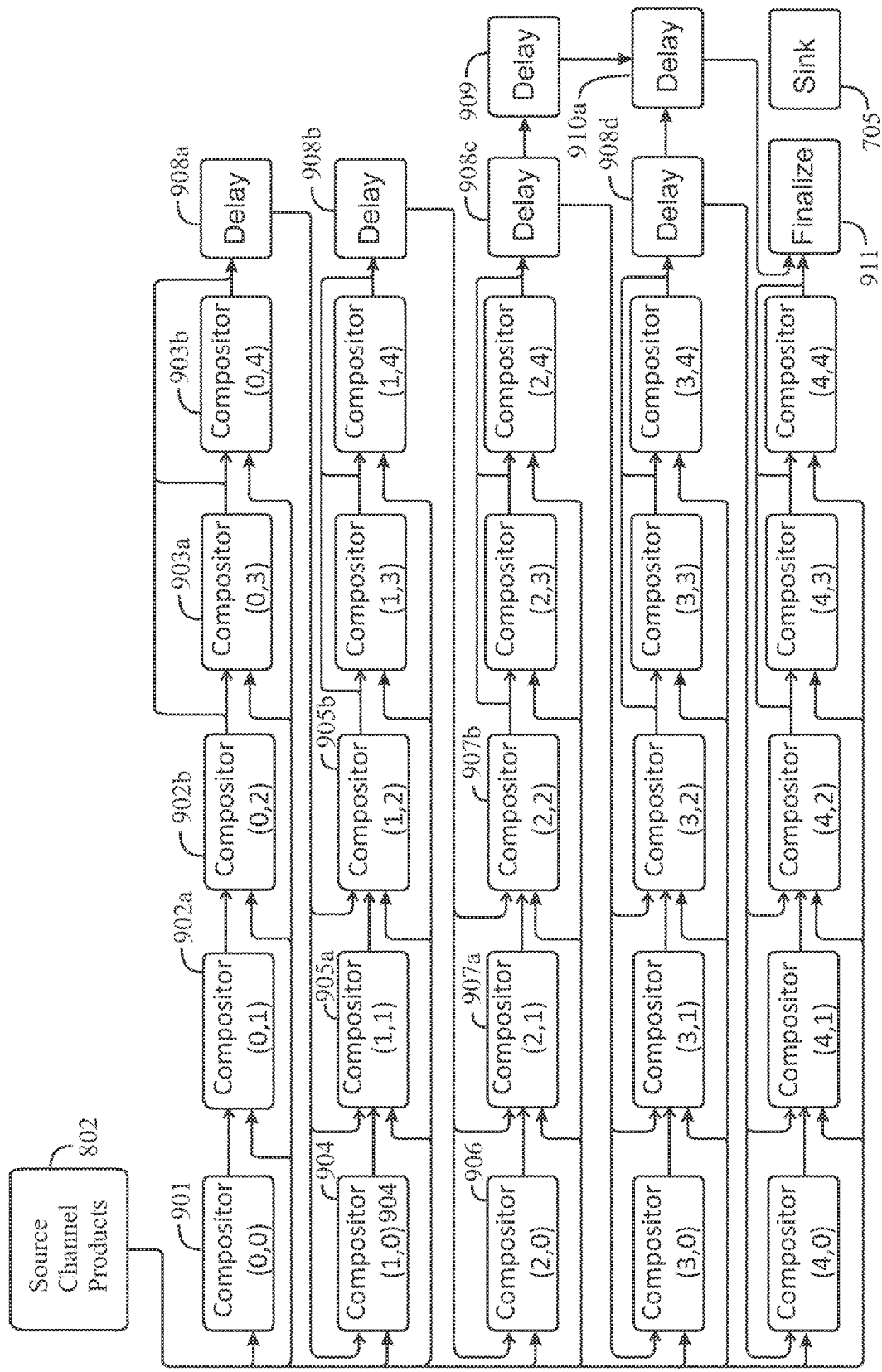
FIG. 15 is a diagram illustrating a specific case of pipelined operations in an embodiment of the invention that implements a 5 by 5 convolution node.

FIG. 15 is a diagram illustrating the specific case of pipelined operations in an embodiment of the invention that implements a 5 by 5 convolution node.

Source channel products 802 and source control signals (not shown here) are made available to each of compositors 901, 902a, 902b, 903a, 903b, 904, 905a, 905b, 906, 907a, and 907b. Source control signals are also connected to delays 908a, 908b, 908c, and 908d. Output channel control and counters are made available to delays 909, 910a, as well as finalization 911. Additional pipeline stages may be inserted by hand or by automated tools to make circuit routing feasible for a given clock frequency if and only if the order of operations is not altered. The timing control and counter signals are available to all elements of the circuit and are not individually shown.

As each set of source channel products is presented in turn, each compositor selects the appropriate product to compute the sub-function that corresponds to the position in the aperture function. Each 5 by 5 patch that intersects with the current position in the input array is amended to include the computation based on the products of that position. The net effect is that the single source stream of inputs is transformed into a parallel set of 5 by 5 streams of partial computations that are passed between the compositors until each time that all operations on a patch are complete, which normally occurs in compositor (4, 4) and sometimes others when processing the right or lower edges of the input array.

Note that only the width of the input array affects the size of the delay elements as each must delay partial results for the number of source input intervals that correspond to receiving an input of one column and the input at the same column on the next row.

Figure 16:
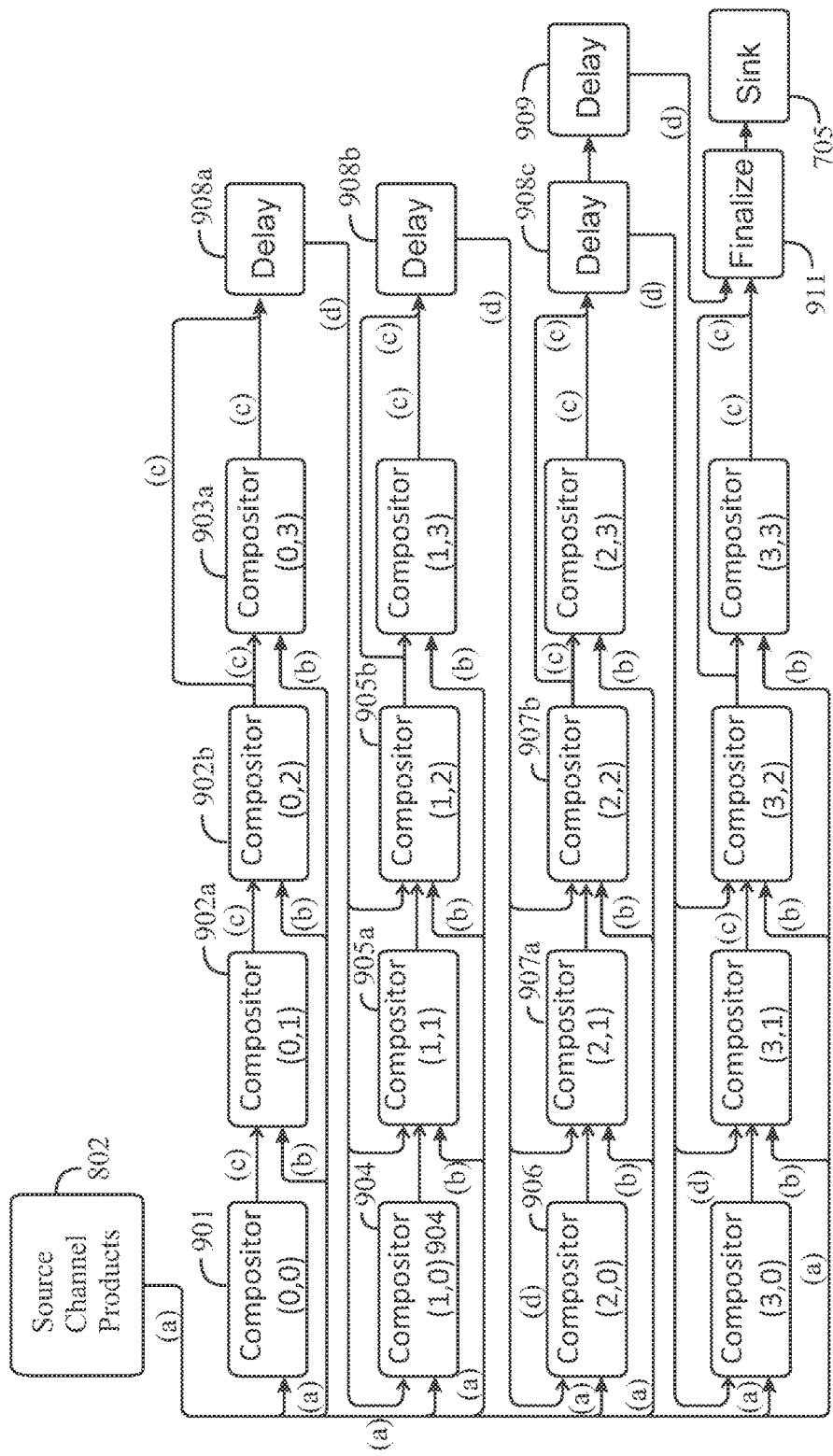
FIG. 16 illustrates an IC in an embodiment of the invention for a 4×4 aperture function.

FIG. 16 illustrates a 4×4 embodiment of the IC of the invention. It is known that kernels may have odd numbers of sub-functions in a row or column, or even numbers. This even version is degenerate in the sense that element 910* as shown in the general case in FIG. 9C, and in FIG. 15 for the specific case of a 5×5 aperture function (an odd number in row and column) does not occur at all because the extra lines of output processing are omitted.

Odd sizes of a kernel, in both directions, are symmetrical around a center, but with even sizes the center is offset. The IC in embodiments of the invention places the center for even sizes to the right of and below the natural division at position ([M/2], [N/2]). In an alternative embodiment of the invention the circuit may be modified to position the center above and left of the natural division.

Other than these comments, the operation of the specific IC of FIG. 16 is as described for the other versions described.

Figure 10A:
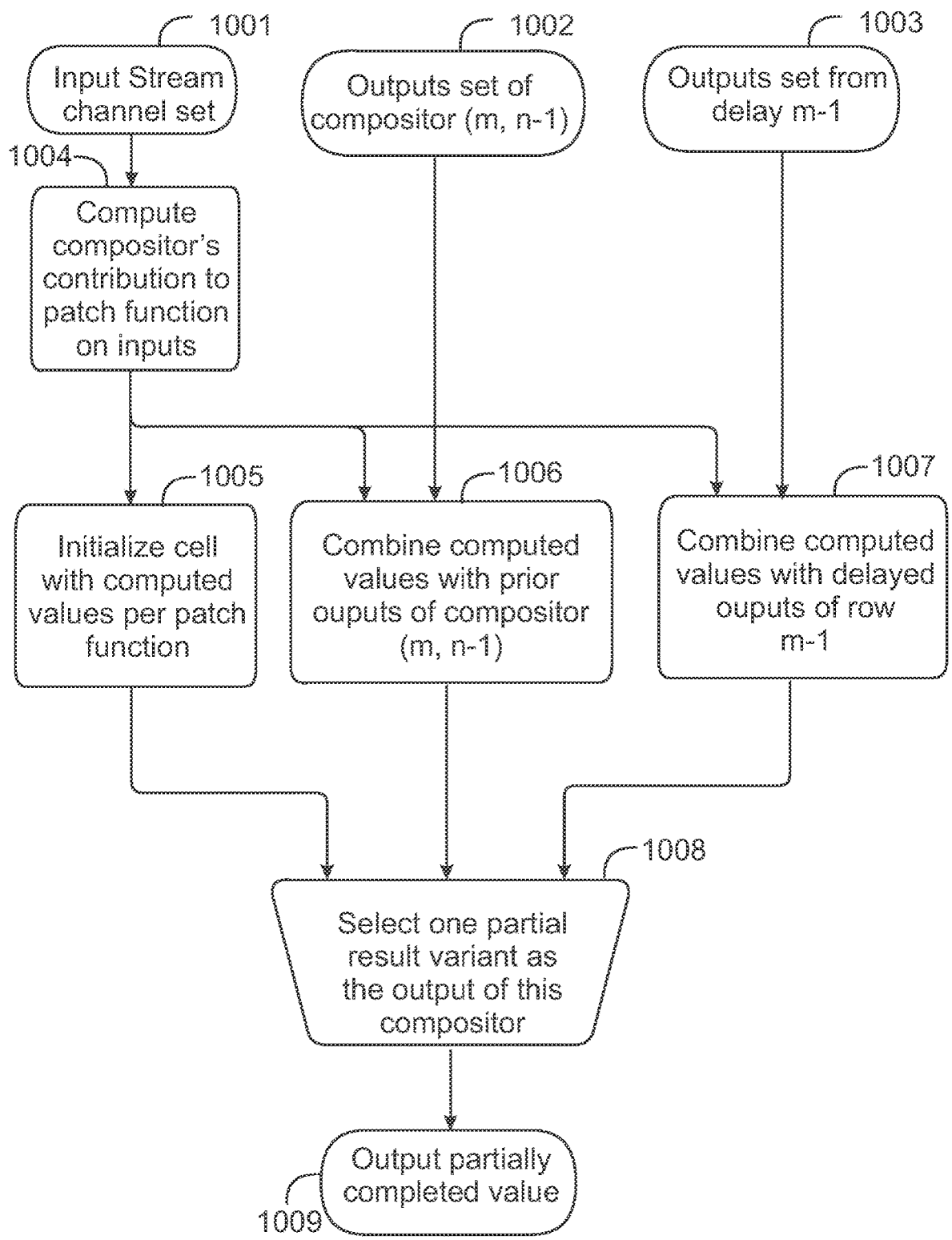
FIG. 10A is a diagram illustrating internal structure of compositors 905a, 905b, and 905c of FIGS. 9A and 9B in an embodiment of the invention.

FIG. 10A is a diagram illustrating internal structure and operation of compositors 905a, 905b and 905c of FIGS. 9A and 9B, or FIG. 15 in an embodiment of the invention. The source input set of stream values in channel set 1001, which may be singular, or a mix of data types as required by the aperture function, is used to compute the contribution of each individual compositor by circuitry 1004.

Circuitry 1005 computes the initial value of the sub-function utilizing the output of 1004. Circuitry 1006 computes the ongoing partial value of the sub-function utilizing the output of 1004 and the partial value previously computed by the compositor immediately to the left 1002. Circuitry 1007 computes the ongoing partial value of the sub-function utilizing the output of 1004 and the partial value previously computed and delayed from one of 908a, 908b, 908c, 908d, 908e, and 908f on the compositor row immediately above 1003.

Operation of circuitry 1005, 1006, and 1007 may be contemporaneous (in the same clock cycle) with the operation of circuitry 1004 using the shared output thereof or may be implemented by a series of pipeline stages synchronized by the same clock.

A multiplexor 1008 selects which variant of partial result is forwarded as the partial value of the sub-function as the output of compositor 1009. If COLFST 811 is not asserted then the output of 1006 is selected, otherwise if ROWFST 808 is not asserted then the output of 1007 is selected, otherwise the output of 1005 is selected.

This conditional processing is a natural consequence of allowing the M by N aperture function to extend over the edges of the source input stream representing the R by C array of value sets. A single position on the leftmost edge or uppermost edge will be the first computable element of the aperture function for the several patches that abut or overlap those edges. As such, it is required that each and every compositor that is in the first computable position of an overlapping patch be initialized with the base value of the aperture function. Furthermore, each and every compositor that is in the first computable position of a subsequent row of the patch must be combined with the prior value of the partial value of the same patch computed from the immediately previous row. In this fashion, the correct computation of all patches that overlap, abut, or are interior to the uppermost and left most edges is ensured using a single circuit.

In FIGS. 10B through 10G, all elements introduced in FIG. 10A and using the same element number are functionally identical to those described with reference to FIG. 10A.

Figure 10B:
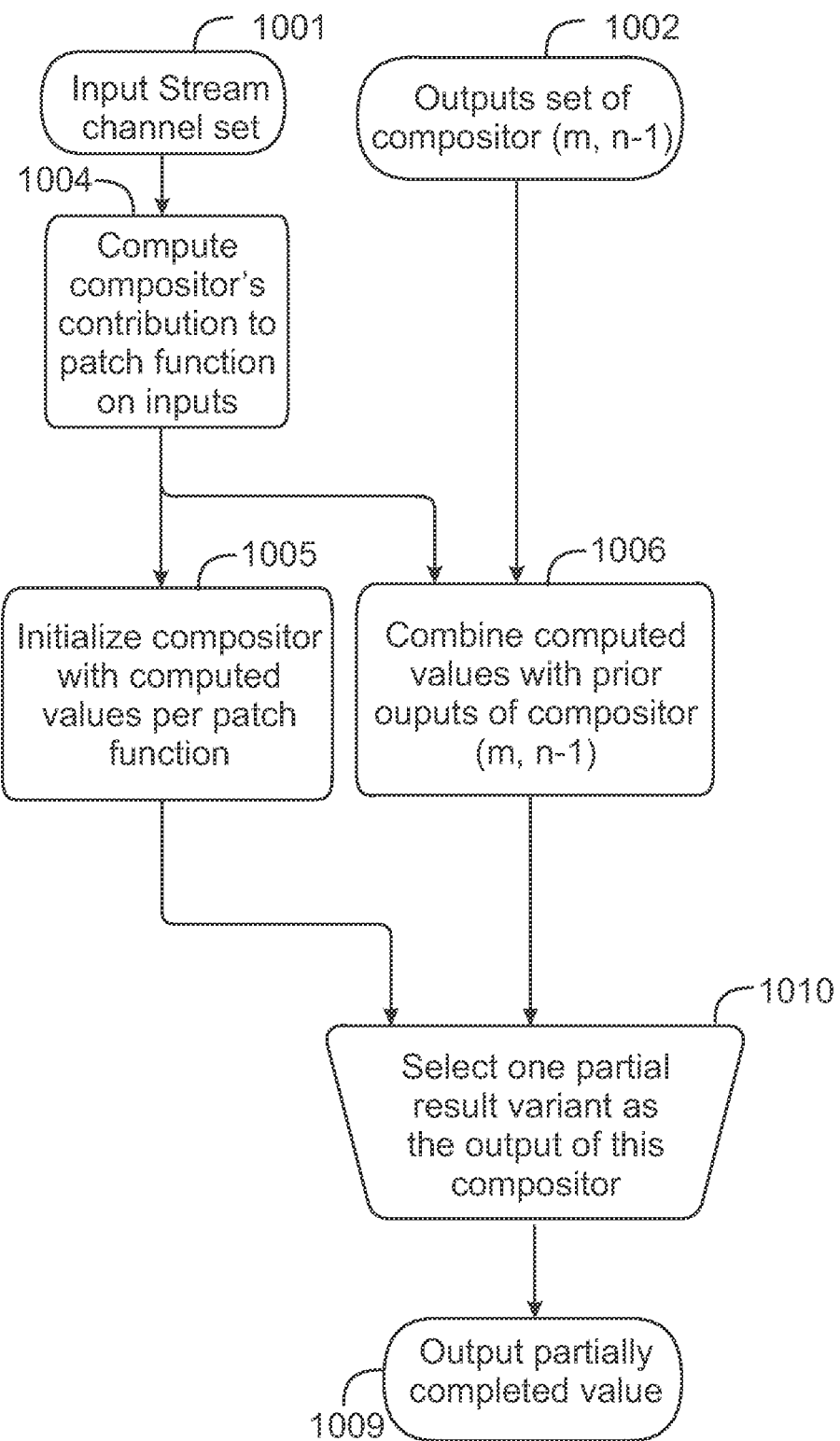
FIG. 10B is a diagram illustrating internal structure of compositors 902a, 902b and 902c of FIGS. 9A and 9B in an embodiment of the invention.

FIG. 10B is a diagram illustrating internal structure and operation of compositors 902a, 902b and 902c of FIGS. 9A and 9B, or FIG. 15 in an embodiment of the invention. The source input set of stream values 1001 is used to by circuitry 1004 to compute the compositor's contribution to the aperture function.

Circuitry 1005 computes the initial value of the sub-function utilizing the output of 1004 and circuitry 1006 computes the ongoing partial value of the sub-function utilizing the output of 1004 and the partial value previously computed by the compositor immediately to the left 1002.

Multiplexor 1010 selects which variant of partial result is forwarded as the partial value of the sub-function as the output of the compositor 1009. If COLFST 811 is not asserted then the output of 1006 is selected, otherwise the output of 1005 is selected.

Figure 10C:
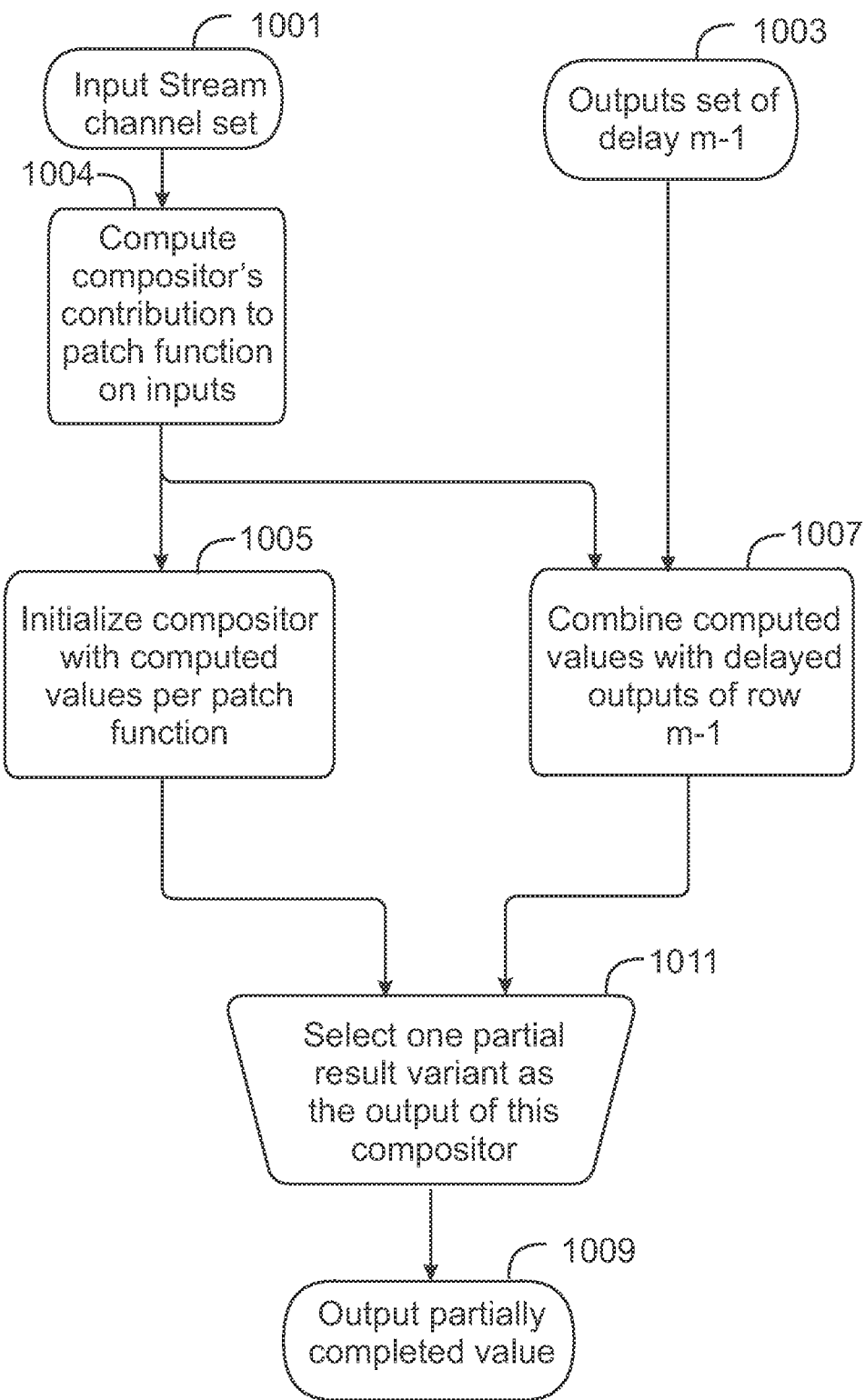
FIG. 10C is a diagram illustrating internal structure of compositor 904 of FIG. 9A in an embodiment of the invention.

FIG. 10C is a diagram illustrating internal structure and operation of compositors 904 of FIG. 9A or FIG. 15 in an embodiment of the invention. The source input set of stream values 1001 is used by circuitry 1004 to compute the contribution of each individual compositor.

Circuitry 1005 computes the initial value of the sub-function utilizing the output of 1004 and circuitry 1007 computes the ongoing partial value of the sub-function utilizing the output of 1004 and the partial value previously computed and delayed from one of 908a, 908b, 908c, 908d, 908e, and 908f on the compositor row immediately above 1003.

Multiplexor 1011 selects which variant of partial result is forwarded as the partial value of the sub-function as the output of the compositor 1009. If ROWFST 808 is not asserted then the output of 1007 is selected, otherwise the output of 1005 is selected.

Figure 10D:
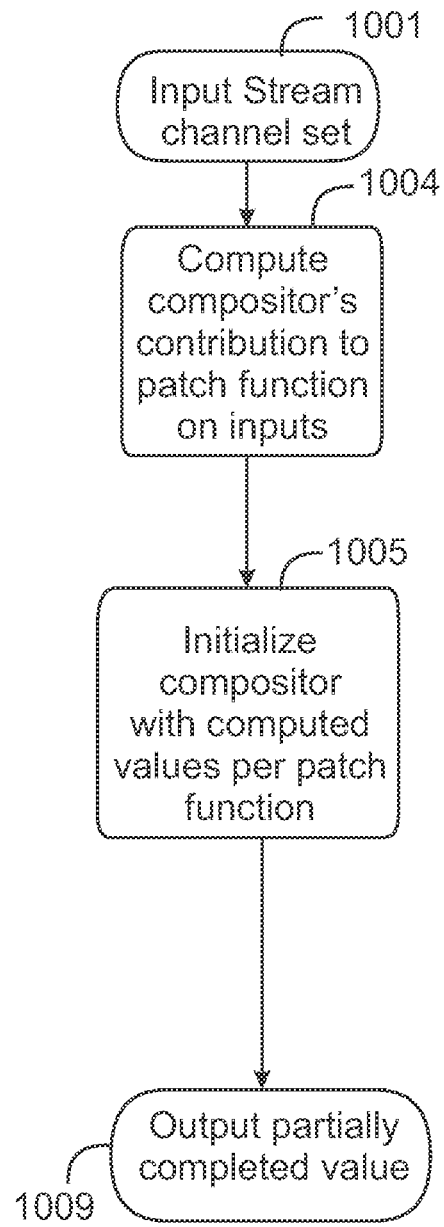
FIG. 10D is a diagram illustrating internal structure of compositor 901 of FIG. 9A in an embodiment of the invention.

FIG. 10D is a diagram illustrating internal structure and operation of compositor 901 of FIG. 9A or FIG. 15 in an embodiment of the invention. The source input set of stream values 1001 is used by circuitry 1004 to compute the contribution of each individual compositor.

Circuitry 1005 computes the initial value of the sub-function utilizing the output of 1004 which is forwarded as the partial value of the sub-function as the output of the compositor 1009.

Cell 901 (FIG. 9A, FIG. 15) is always the first value in any full or truncated patch where utilized and thus always produces an initialization value for the patch.

Figure 10E:
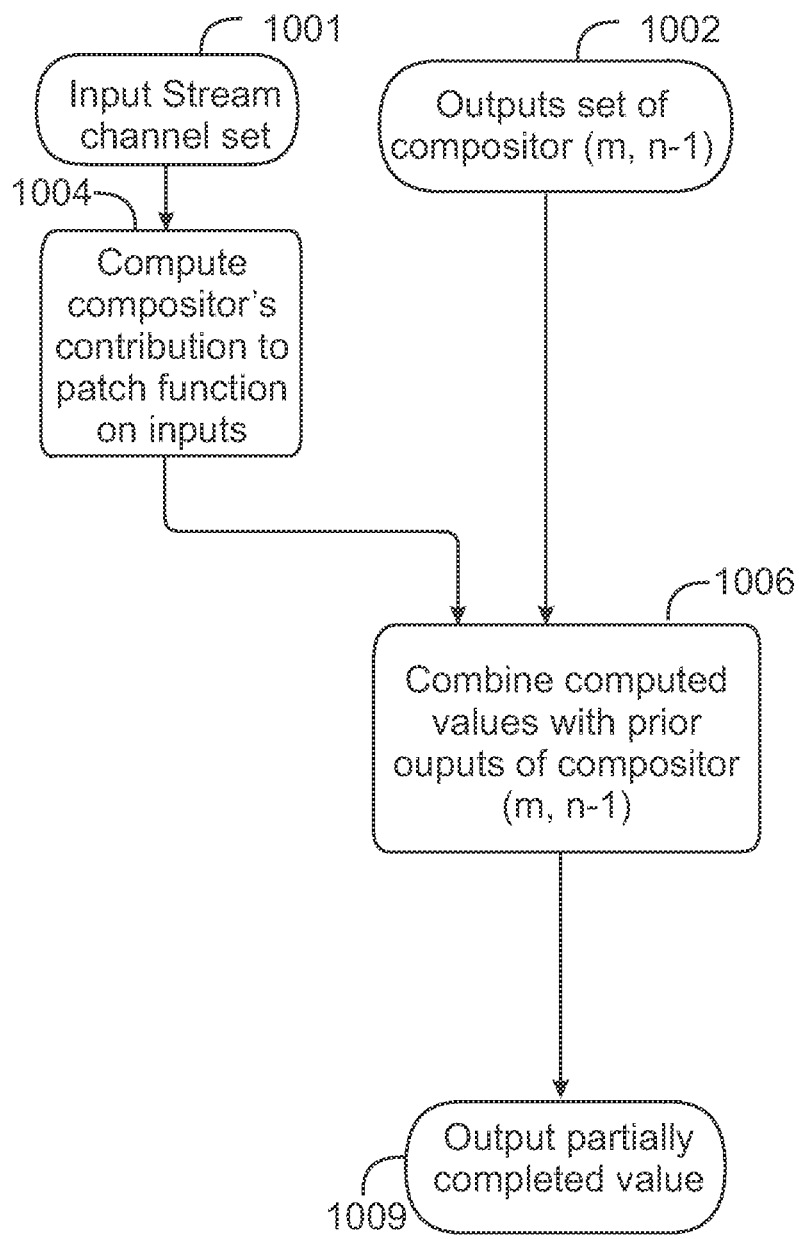
FIG. 10E is a diagram illustrating internal structure of compositors 903a, 903b and 903c of FIGS. 9B and 9C in an embodiment of the invention.

FIG. 10E is a diagram illustrating internal structure and operation of compositors 903a, 903b and 903c of FIGS. 9B and 9C or FIG. 15 in an embodiment of the invention. The source input set of stream values 1001 is used by circuitry 1004 to compute the contribution of each individual compositor.

Circuitry 1006 computes the ongoing partial value of the sub-function utilizing the output of circuitry 1004 and the partial value previously computed by the compositor immediately to the left 1002 which is forwarded as the partial value of the sub-function as the output of the compositor 1009.

Figure 10F:
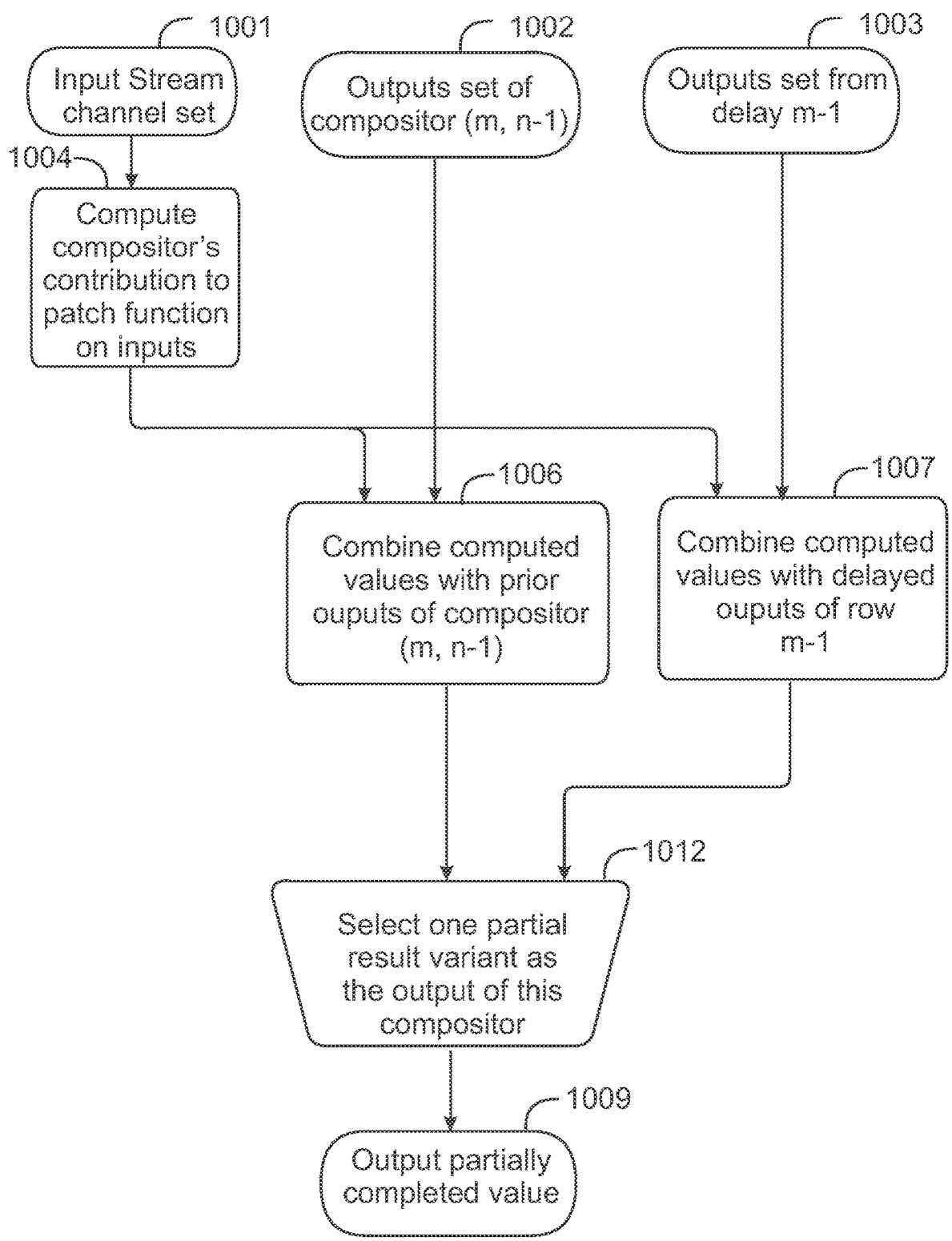
FIG. 10F is a diagram illustrating internal structure of compositors 907a, 907b and 907c of FIGS. 9A and 9B in an embodiment of the invention.

FIG. 10F is a diagram illustrating internal structure and operation of compositors 907a, 907b and 907c of FIGS. 9A and 9B or FIG. 15 in an embodiment of the invention. The source input set of stream values 1001 is used to compute the contribution of each individual compositor 1004.

Circuitry 1006 computes the ongoing partial value of the sub-function utilizing the output of circuitry 1004 and the partial value previously computed by the compositor immediately to the left 1002. Circuitry 1007 computes the ongoing partial value of the sub-function utilizing the output of 1004 and the partial value previously computed and delayed from one of 908a, 908b, 908c, 908d, 908e, and 908f on the compositor row immediately above 1003.

Multiplexor 1012 selects which variant of partial result is forwarded as the partial value of the sub-function as the output of the compositor 1009. If COLFST 811 is not asserted then the output of 1006 is selected, otherwise the output of 1007 is selected.

Figure 10G:
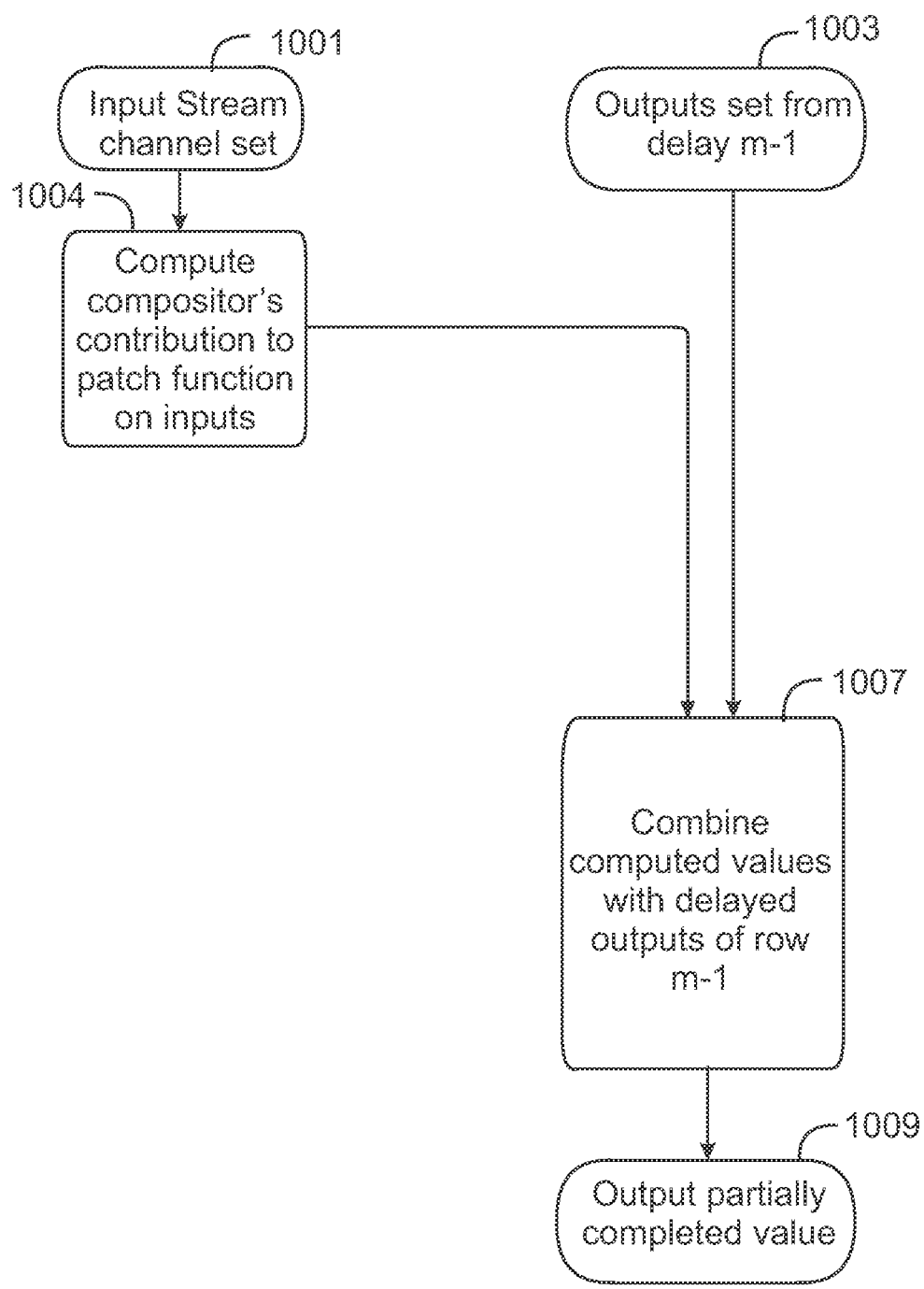
FIG. 10G is a diagram illustrating internal structure of compositor 906 of FIG. 9A in an embodiment of the invention.

FIG. 10G is a diagram illustrating internal structure and operation of compositors 906 of FIG. 9A or FIG. 15 in an embodiment of the invention. The source input set of stream values 1001 is used by circuitry 1004 to compute the contribution of each individual compositor.

Circuitry 1007 computes the ongoing partial value of the sub-function utilizing the output of 1004 and the partial value previously computed and delayed from one of 908a, 908b, 908c, 908d, 908e, and 908f on the compositor row immediately above at 1003. The output of circuitry 1007 is forwarded as the partial value of the sub-function as the output of the compositor 1009.

Figure 11:
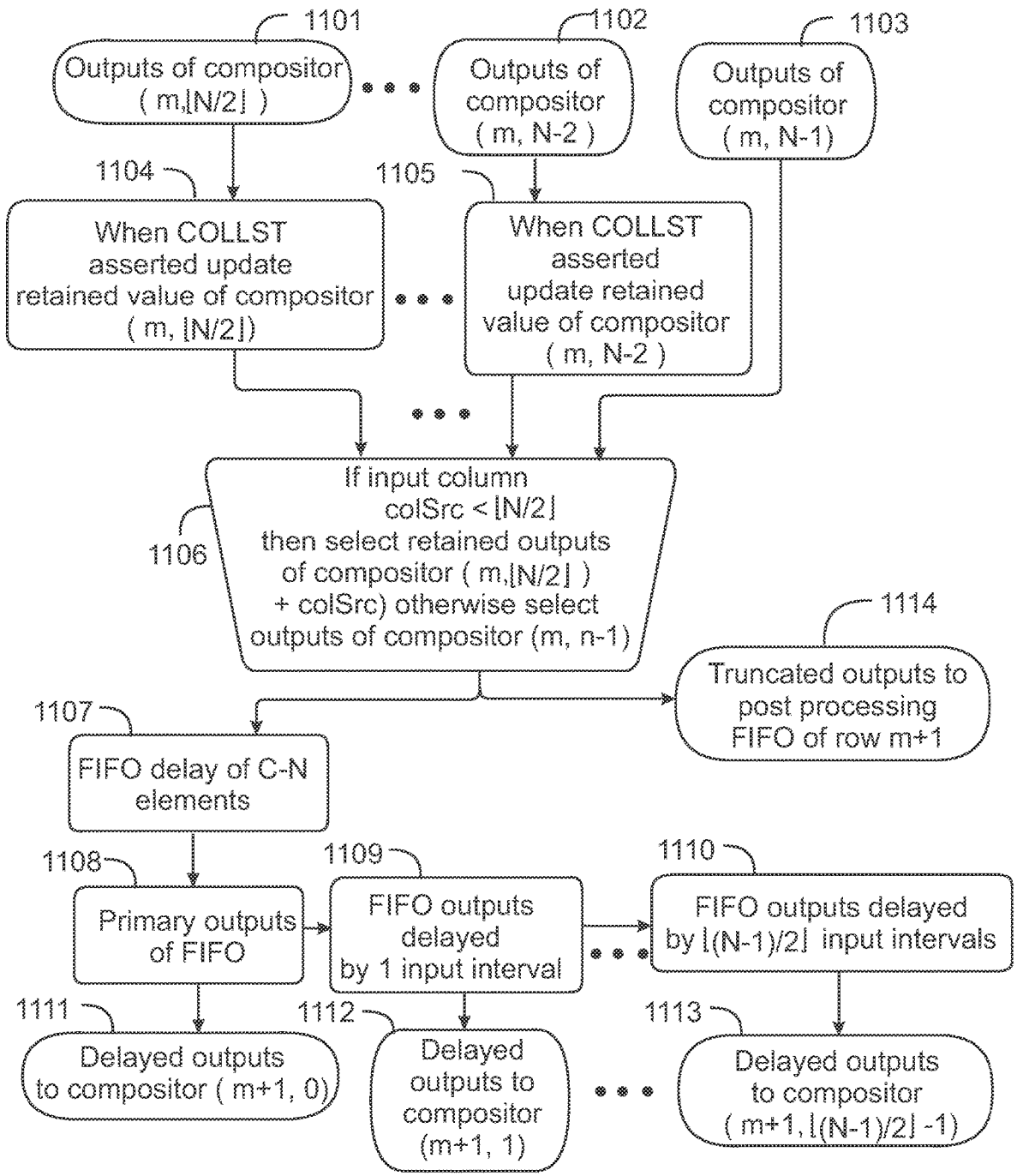
FIG. 11 is a diagram describing internal structure and function of delay stages 908a, 908b, 908c, 908d, 908e and 908f of FIG. 9C in an embodiment of the invention.

FIG. 11 is a diagram illustrating internal structure and operation of intra row delay lines 908a, 908b, 908c, 908d, 908e, and 908f (FIG. 9C). The delay lines are used to retain partially computed results from each row of compositors to be used in the next row.

When COLLST is asserted the current position of the source input stream is at the rightmost edge and the outputs of compositors of the rows [N/2] (1101) through N−2 (1102) are retained for future reference by registers 1104 through 1105 respectively.

If the current position of the source input stream, colSrc, is less than [N/2], multiplexor 1106 selects from the retained values in reverse order from right to left as defined by the index calculation (N−2)-colSrc, otherwise it selects the current value from the last compositor of row m (1103).

Note that when the source input stream column position is less than [N/2], the rightmost compositor of the row will not contain valid data which makes these time slots available for inserting the retained data.

The partial outputs selected by multiplexor 1106 are fed into a first-in first out (FIFO) circuit 1107 with C-N positions, which is configured such that source input stream position is processed such that exactly one value is inserted, and one value is extracted in the same order as inserted. Since the partially completed results from one position will not be required until the source input stream returns to the same patch position on the next row, this effects a delay such that the partial results computed by one row will be presented to the next row precisely when needed.

The partial outputs selected by multiplexor 1106 also feed the same values (1114) into final results delay lines 909, 910a and 910b.

The partial outputs extracted from FIFO 1107 are routed by at 1108 both to the leftmost compositor on the next row (1111) and to a series of parallel access registers 1109 through 1110 which further delay the partial outputs by one source input stream interval as data is passed through the register chain.

When the current position of the source input stream is at the leftmost edge, the FIFO directs output data at 1108 and delayed results 1109 through 1110 are made available to the cells of the next row at 1111, 1112 through 1113 respectively.

It is noted that the extra values from the right side of the source input array stream inserted by multiplexor 1106 into FIFO 1107 are only accessed via path 1111 when the source input array stream position is near the right edge while the additional parallel paths 1112 through 1113 are only used when the source input array stream is at the leftmost position to access data that was inserted normally from path 1103. The apparent similarities in structure and requirements between right edge processing and left edge processing is a natural consequence of the symmetry of the overlap of the sub-function with the right and left edges of the source input stream array. When the value for N is an even number, the number of extra cells processed to support right and left edges is not the same.

Figure 12:
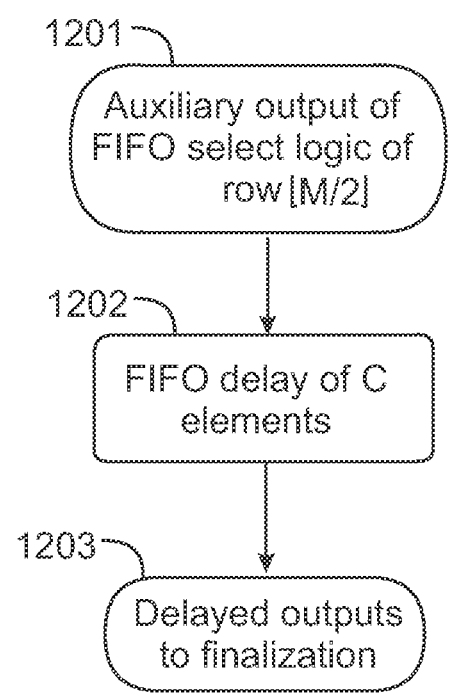
FIG. 12 is a diagram illustrating operation of delay stage 909 of FIG. 9C in an embodiment of the invention.

FIG. 12 is a diagram illustrating internal structure and operation of the final truncated results delay line 909 (FIG. 9C).

When processing the last row of the source input stream array, the partial results from auxiliary output 1201 of intra row delay line 908d are considered to be the final results of the final row of truncated patches and are retained in a FIFO 1202 whose number of elements C is equal to the width of the source input stream array.

Immediately after recording the final results of the truncated patches, the outputs of FIFO 1202 will be transferred via 1203 to further delay lines 910a or directly to final processing 911 if the value of M is such that no other delay lines intervene.

Figure 13:
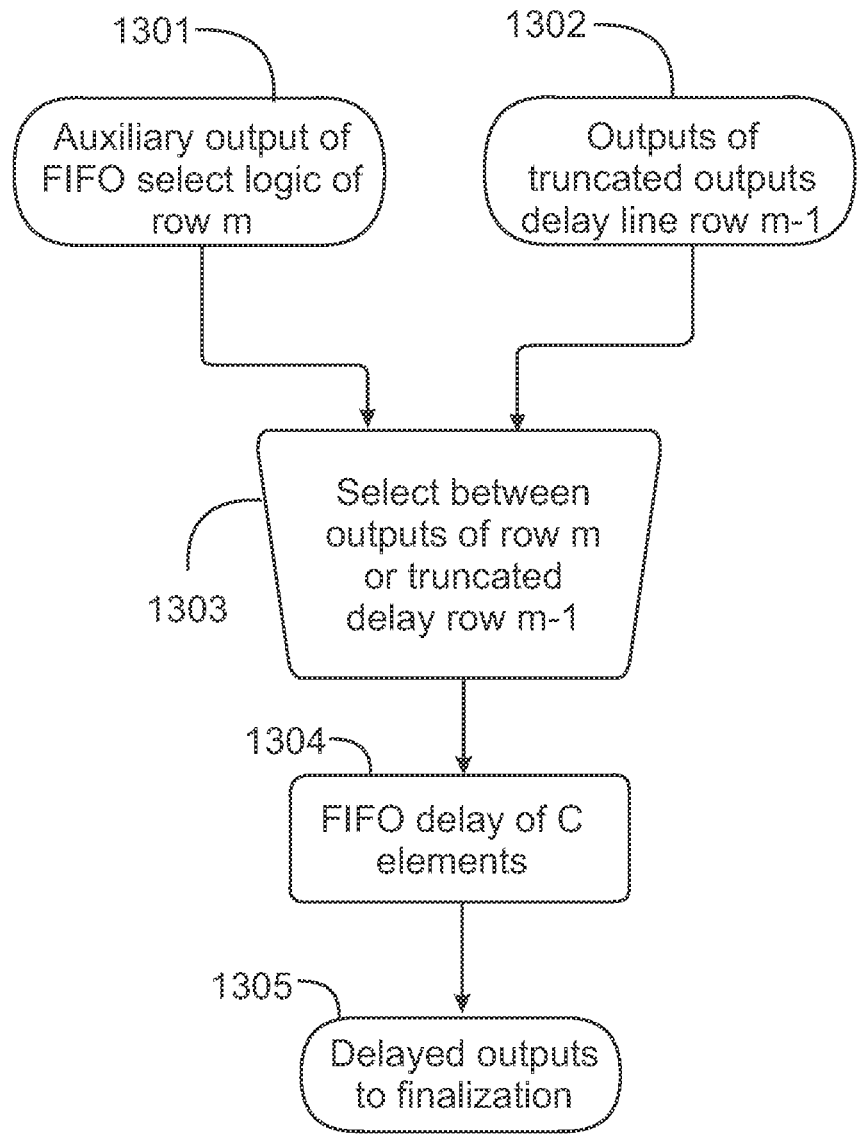
FIG. 13 is a diagram illustrating operation of delay stages 910a and 910b of FIG. 9C in an embodiment of the invention.

FIG. 13 is a diagram illustrating internal structure and operation of the final truncated results delay lines 910a and 910b.

When processing the last row of the source input stream array, the partial results 1301 from the auxiliary output of intra row delay lines 908e through 908f are considered to be the final results of the final row of truncated patches and are retained in a FIFO 1304 whose number of elements C is equal to the width of the source input stream array.

When POSTEN is asserted multiplexor 1303 switches between taking values from 1302 to taking values from the final truncated delay line of the row above which will have the effect of presenting the final truncated results in row first order compatible with the ordering of all prior output results.

Note that during that cycle of an input frame when POSTEN is first asserted, the contents of FIFOs 1202 and 1304 are the final values of the truncated patches that overlap the last row of the source input stream array. Any data contained in FIFOs 1202 and 1304 prior to that cycle will not be processed, so any suppression of the execution when not processing the final row of the source input stream array is optional.

Immediately after recording the final results of the truncated patches, the outputs of FIFO 1304 are transferred via 1305 to further delay lines or directly to final processing 911 if the value of M is such that no other delay lines intervene.

Figure 14:
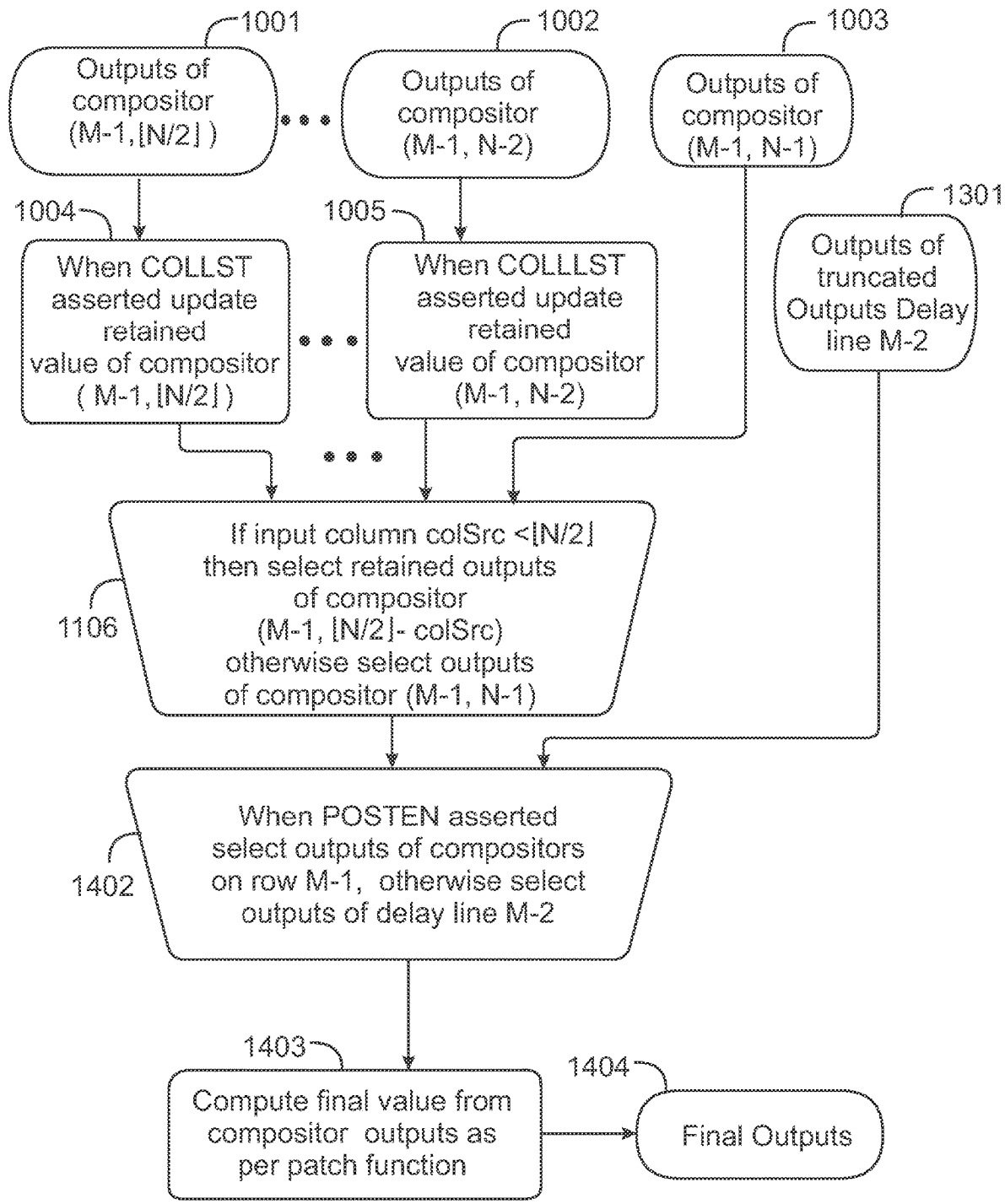
FIG. 14 is a diagram illustrating operation of finalization step 911 in FIG. 9C.

FIG. 14 is a diagram illustrating internal structure and operation of the final processing of all full and truncated results.

As in FIG. 11 and with identical construction and function, if the current position of the source input stream is at the rightmost edge, the outputs of cells of rows M−1 from [N/2] (1101) through N−2 (1102) are retained for future reference by registers 1104 through 1105 respectively.

If the current position of the source input stream is less than [N/2], multiplexor 1106 selects from the retained values in reverse order from right to left, otherwise it selects the current value from the last compositor of row M−1 (1103).

While processing the source input stream array, multiplexor 1402 feeds the results selected by multiplexor 1106 directly to finalization (1403). When in the post processing phase outputs of truncated result delay lines 1401 are selected instead for finalization (1403).

Finalization circuitry 1403 performs all additional computations, if any, to produce the final form of the output stream (1404) from composed patch results. This may typically take the form of a Rectified Linear Activation (RELU) function, whereby negative values are set to zero and over limit values are set to maximum acceptable value, or any other desired conditioning function such as sigmoid or tanh. The post processing function is not required to complete within a single source input stream cycle but is required to accept each final result at the rate of the source input stream array.

When DSTEN is asserted, finalization circuitry 1403 presents the final results as one value of the destination output stream. At any time that DSTEN is not asserted, any partial or incorrect values produced by finalization circuitry 1403 are ignored, so any suppression of operation when results are not used is optional.

In one implementation, the destination output stream array is processed by circuitry similar to the foregoing. In that case, it is advantageous that the timing of the final truncated results be identical to all previous final results. To that end, control of FIFOs 1202 and 1304 is coordinated by control circuitry 702 to maintain an output rate identical to the primary output rate.

In another implementation, the destination output stream array is the final stage of the system, and no further processing is required. In that case, it is advantageous that the timing of the final truncated results be completed as quickly as possible. To that end control of FIFOs 1202 and 1304 is coordinated by control circuitry 702 to output those results at the maximum frequency supported.

Note that the implementation described above produces a single output element from the full set of input elements. In a complete system that produces a large set of output elements from the input set, the entire mechanism described is duplicated once for every output channel with the notable exception of control circuitry 702 which may be shared by output channels, since the timing of all individual sub-functions is identical for the entire output set.

The inventor has built a working prototype of an IC in an embodiment of the invention to test and confirm the details and features of the invention, and operation of the prototype confirms the descriptions above. The inventor has also developed a software supported simulator, which has been used up to the time of filing this application to test and confirm the details and descriptions above.

In another aspect of the present invention, a system is provided to accept an input stream of three-dimensional data, as is commonly presented in medical imaging, wherein additional circuitry and buffering is included to allow a three-dimensional aperture function to pass over the three-dimensional input array with corresponding computations that correctly implement both interior and edge cases for the first and last planes.

In yet another aspect of the present invention, for the complex process of training a Deep Neural Network (DNN), a hardware-assisted Neural Network training system is provided wherein the bulk of the effort is done by a forward inference engine and the training algorithm need only use the statistics gleaned from forward inference to periodically adjust weights and biases for the full network to converge the model to a desired state. With the addition of appropriate accumulators summing the input states as the forward inference process is computed, the instant invention forms the hardware assisted Neural Network training system.

In yet another aspect of the invention, regarding a well-known problem wherein limitations of floating-point accuracy impede convergence of DNN models (known in the art as the "vanishing gradient problem"), a single mass multiplier is provided with limited bit width precision, that may be cascaded with additional adders to produce floating point products of arbitrarily large precision. While this innovation is not generally required for forward inference computations, it may be critically important in a DNN trainer to avoid problems that arise when the gradients computed become too small to measure.

N-up Parallel Processing

In embodiments and implementations of the invention described above focus has been on apparatus and methods for mass multiplication in executing functions where multiplication is required, and on execution of aperture functions by novel ICs in convoluted neural networks (CNNs). It is well known in the art, however, that a complete Deep Neural Network (DNN) must necessarily implement a full set of quite different aperture functions, many of which may require only minimal calculations.

To qualify as an embodiment of the present invention each such implementation must conform to the overall system-wide pipeline format accepting inputs as a stream of parallel values representing an array in a consistent order and concurrently producing outputs as a stream of parallel values representing an array in that same order. The final node(s) of a DNN may return conclusions reflecting an array of positions, or conclusions concerning the input array as a whole. Embodiments of the invention described below are for executing DNNs in novel ICs in which the pipelined execution is supported.

In an aspect of the invention the inventor has developed a method and apparatus to significantly accelerate pipelined operations in CNNs and in DNNs. The inventor proposes in some embodiments of pipelined operations to stream inputs to the ICs in multiples in parallel. In embodiments described above inputs have in all implementations been streamed typically left to right across each column, then top to bottom down the rows. Taking RGB data as an example, this would take the form of three individual channels at each pixel position, typically 8 bits each, representing each of the three independent RGB color values observed at each pixel position. The inventor terms this a 1-up implementation. 1-up meaning streaming input values for one pixel at a time. Or in a more general sense streaming values for one input position at a time in the input array.

The inventor believes that considerable advantage may be attained by streaming input, such as in the pixel example, by more than one input position at a time. To do so circuitry must be added to the novel IC executing the input stream producing the output stream. The change is generally one of size rather than complexity, as circuitry implemented in a 1-up circumstance is repeated in the IC to process input values in parallel for additional input positions, in this example, pixels.

While the circuitry is least problematic when the width of each row is an integral multiple of the input count to be streamed in parallel, this is not a required limitation of the invention. For the pixel example, for a resolution of 1920× 1080, the number of pixels across a row (1920) is evenly divisible by 1, 2, 3, 4, 5, 6, 8, 10, and 12. So streaming RGB values for two pixels, termed 2-up, is an efficient approach, as is also 3-up, and 4-up. As the number of pixels increases, the sheer size of the IC to handle all of the processing increases by a factor directly related to the number of pixels to be considered in parallel, so a user must make reasonable decisions.

But as the stream passes down through the nodes of a DNN, the input array size is often reduced in dimension where the stride of the aperture function is other than 1 (not every input position will produce an immediate output position) or where the aperture function is defined to avoid overlaps with the edges of the input array. In these common cases, the width of the input array cannot be constrained to be an integral multiple of any given number of parallel positions N. One solution is to always align the left edge of each row of the input array to a specific position, nominally the left, of the set of N positions. The right edge may then be represented by an incomplete set, starting always with the first position of the set of N positions. Additional circuitry is then used to avoid using the invalid data for computations and also to suppress any outputs derived from that invalid data.

In embodiments of the invention, for a 2-up implementation in the pixel example, R, G and B values for each of two adjacent pixels are streamed as pipelined input to the IC. The first two pixels are the first two pixels from left in the top row. For the RGB example there will be six input values, these being R, G and B values for each of the first two pixels. The next two pixels in the row are next in the stream, and so on across the top row, then R, G and B values for the first two pixels in the second row, and so on through the input array. The same general protocol is followed for 3-up or 4-up.

Figure 17A:
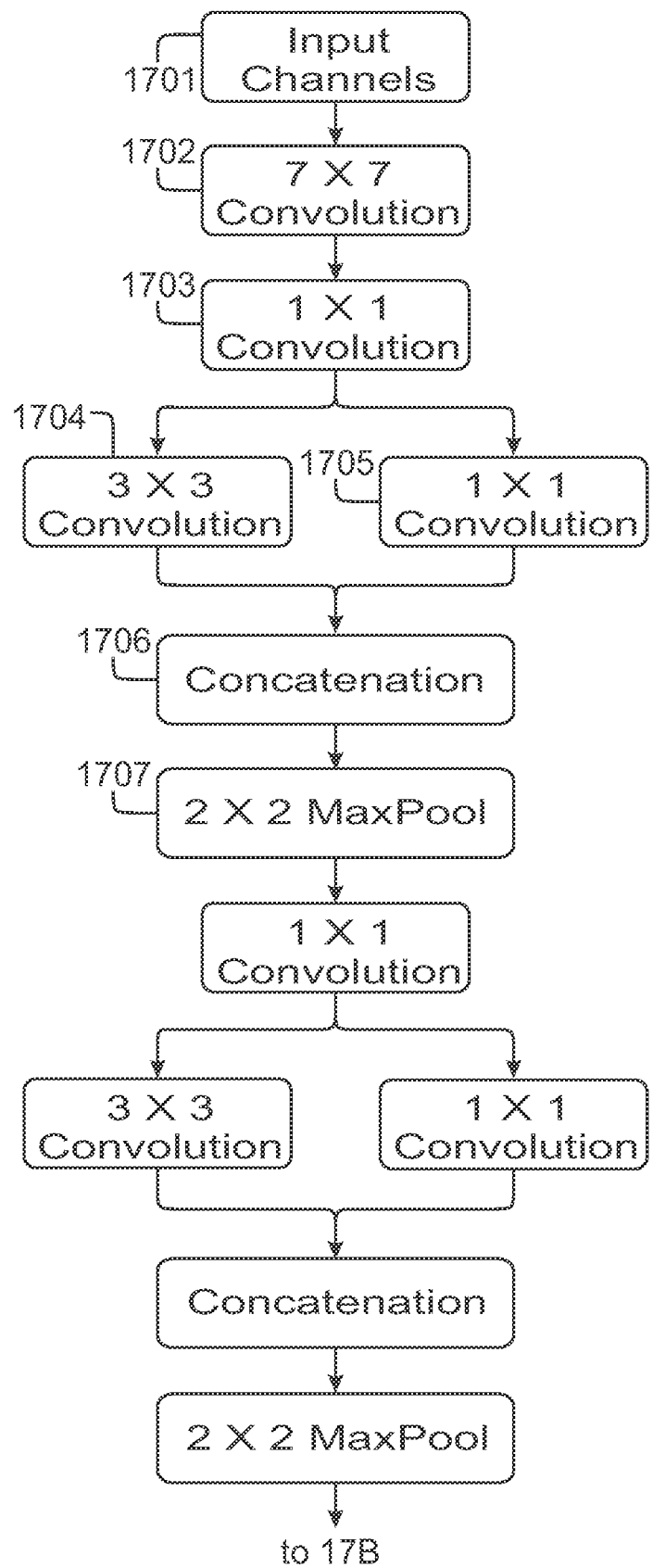
FIG. 17A illustrates an IC with circuitry implementing a part of a deep neural network streaming input channels individually.
Figure 17B:
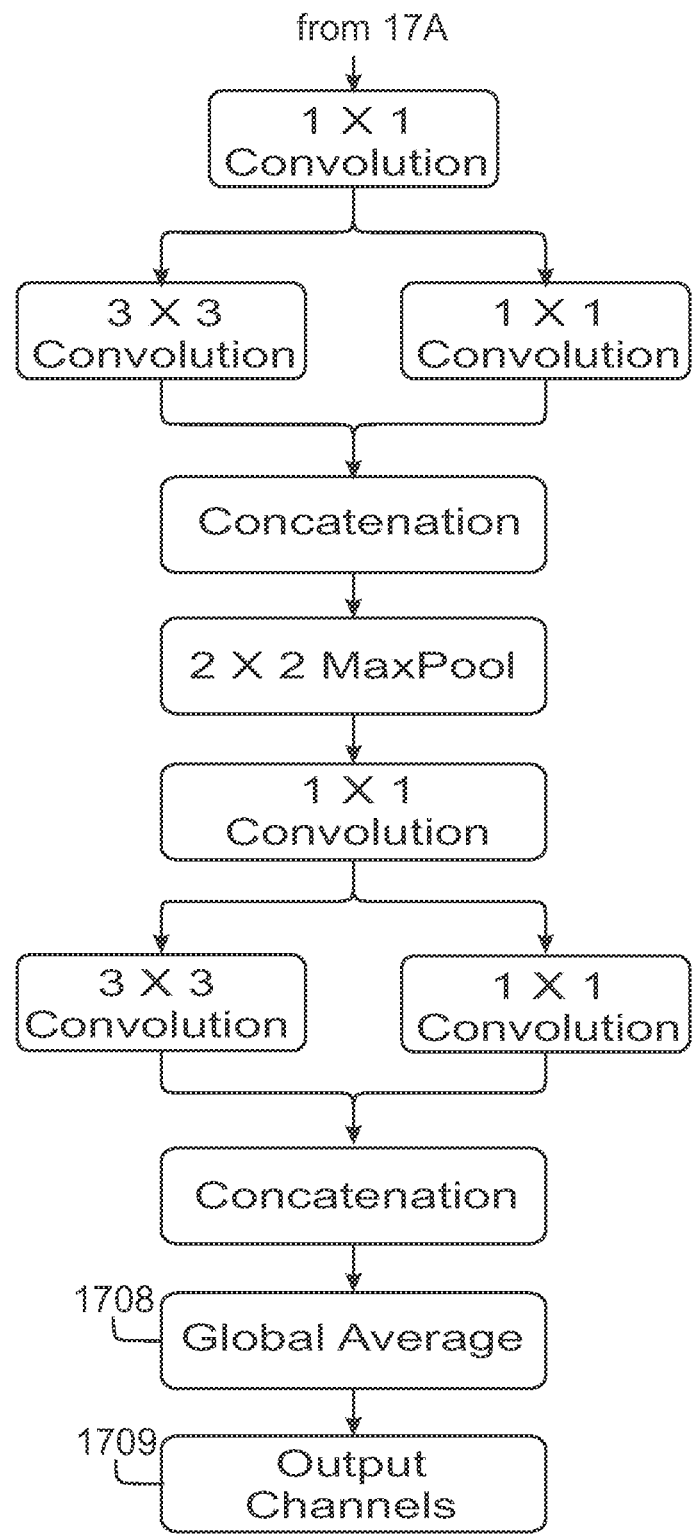
FIG. 17B illustrates the IC with circuitry implementing another part of the deep neural network.

FIGS. 17A and 17B illustrate a 1-up pipelined solution for a well-formed minimal DNN model that might be used to comprehend images and respond with the relative excitation strengths of various objects the model has been trained to recognize. Input channels 1701 are presented as input values for individual pixels in specific order, typically left to right across each row, then top to bottom, as described just above. For RGB data, this takes take the form of three individual channels, typically 8 bits each, representing the three independent color values observed at that position. The eight-bit channels are not a limitation to the scope of the invention.

If the input to this DNN circuit is an output of a another DNN circuit, as would naturally occur if a large DNN were broken up into smaller pieces as an aid to processing, then channels presented would be one for every feature passed into the DNN. For example, if a particular segment of a model requires 64 feature channels as input, each value would be presented in parallel in the specified format, as an unsigned or signed integer, or a floating-point value, with the desired bits of accuracy.

It is important to understand that the blocks depicted in FIG. 17A (as well as in other diagrams described) do not represent steps executed in sequence. Each block represents either input channels or circuitry performing functions, such as an aperture function. The arrows between blocks represent sets of parallel conductors passing values between processing circuits. All processes are active simultaneously whenever inputs to that block are presented. As the input stream commences, circuitry represented by blocks becomes active, one after another, until all processes are active, and an output stream is produced in plural channels as well. Emission of final outputs of the first corner of the input array, nominally the upper left, begins while inputs are still being accepted.

First 7 by 7 Convolution node 1702 in this model is typical for RGB inputs in DNNs used for visual comprehension. This 7 by 7 kernel may be applied only where the kernel patch fits within the bounds of the input array (typical for RGB inputs) or it may be applied to every input position and the missing values synthesized (typical for reprocessing features). Generally, a substantial number of output channels (typically 64) are produced and the number of channels throughout the rest of the system typically increases as the feature values pass through additional nodes.

Each of subsequent Convolution nodes 1703, 1704, 1705 also accept and produce multi-channel array streams of the same dimensions as their inputs. The number of output channels for each is arbitrary and may be more, less, or the same as the number of input channels.

Concatenation node 1706 in this model accepts parallel input array streams produced by nodes 1704 and 1705 and synchronizes them to produce a combined set of channels. The channels from the Convolution nodes are not altered in value. But since the nature of pipelines is such that each output corresponding to a specific array position from a 1 by 1 Convolution will be produced before an output from the 3 by 3 Convolution, the Concatenation function will have to provide buffering in the form of first-in-first-out (FIFO) circuits so that all channels may be output with data corresponding to the same position presented at the same time.

MaxPool node 1707 in this model utilizes an aperture function that compares all values of the patch and outputs only the maximum value for each channel independently. The number of channels is not affected but the array dimensions of the input stream will be reduced in the output stream. If, as is typical, a MaxPool node reduces the horizontal dimension by two as well as the vertical dimension by two, the output array will be one quarter the size of the input array.

Since the frame rate for the input stream and for the output stream must necessarily be the same (outputs cannot be produced faster than the inputs they are based upon, and outputs cannot be produced slower than the inputs or data will be lost), the net effect is that the clock rate for the reduced output array stream will be reduced proportionately.

In this MaxPool example, since only one output is produced for a patch of four input positions, the required output rate is only one quarter of the input rate. All subsequent nodes in the pipeline will therefore operate at a reduced effective throughput. The reduced effective throughput may be advantageous as the number of channels grows ever larger. Some resources that might be dedicated to each channel can be shared between channels when there are many more cycles available to make the required calculations, leading to an overall reduction in circuit size with only a small increase in power. The reduction in dimensionality also forms an important basis for the instant invention.

Subsequent nodes of the model illustrated may utilize similar or dissimilar patterns of connections as long as each pattern supports the system-wide interface of presenting all channels of data corresponding to a given position in any input array stream at the same time.

After MaxPool node 1707 values stream to additional convolution, concatenation and MaxPool nodes in this model as illustrated, but, as these nodes are functionally the same as nodes already described, these nodes do not have element numbers.

Global Average node 1708 in FIG. 17B is distinct in that the aperture function for node 1708 covers the entire remaining dimensions of the previous input array stream, and simply returns the average value of each channel over the entire array. The output array dimensions are thus 1 by 1 and form Output Channels 1709 of the entire circuit.

Figure 18A:
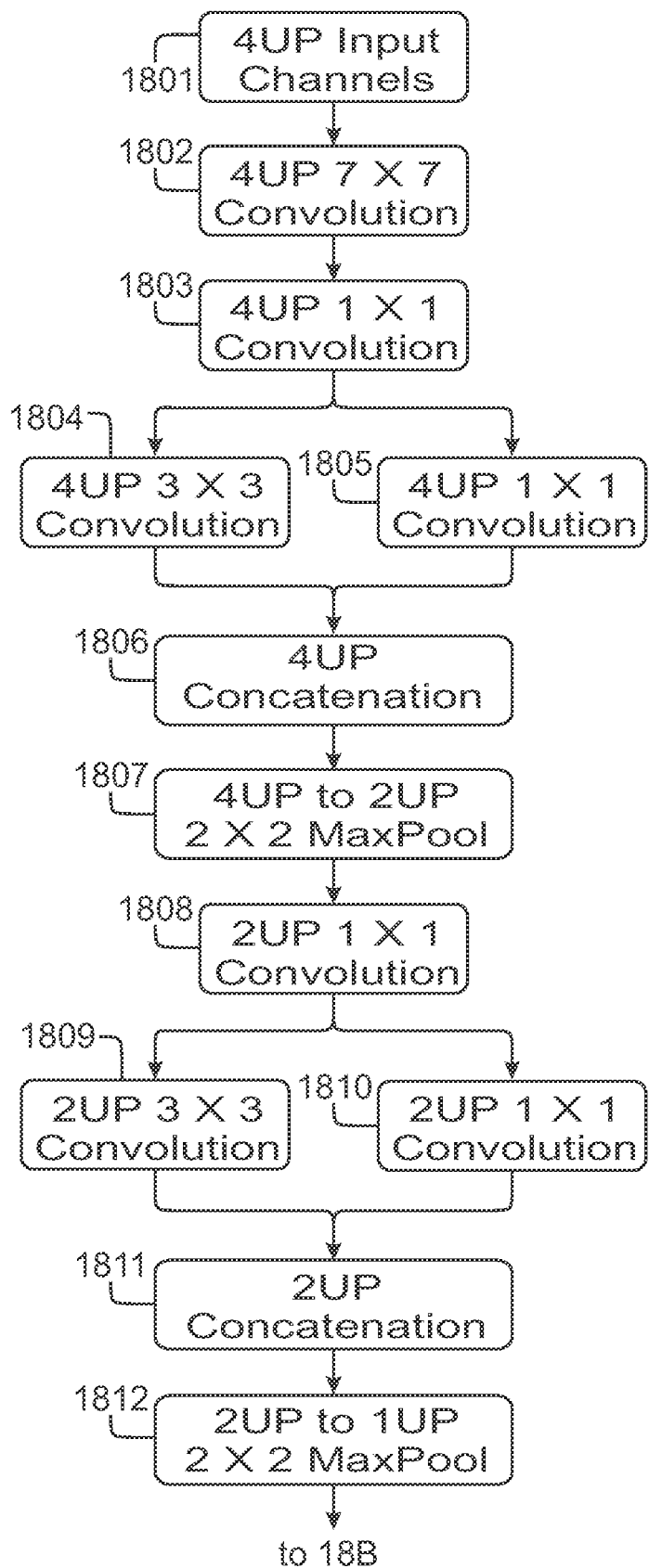
FIG. 18A illustrates an IC with circuitry implementing part of a deep neural network streaming four input channels simultaneously.
Figure 18B:
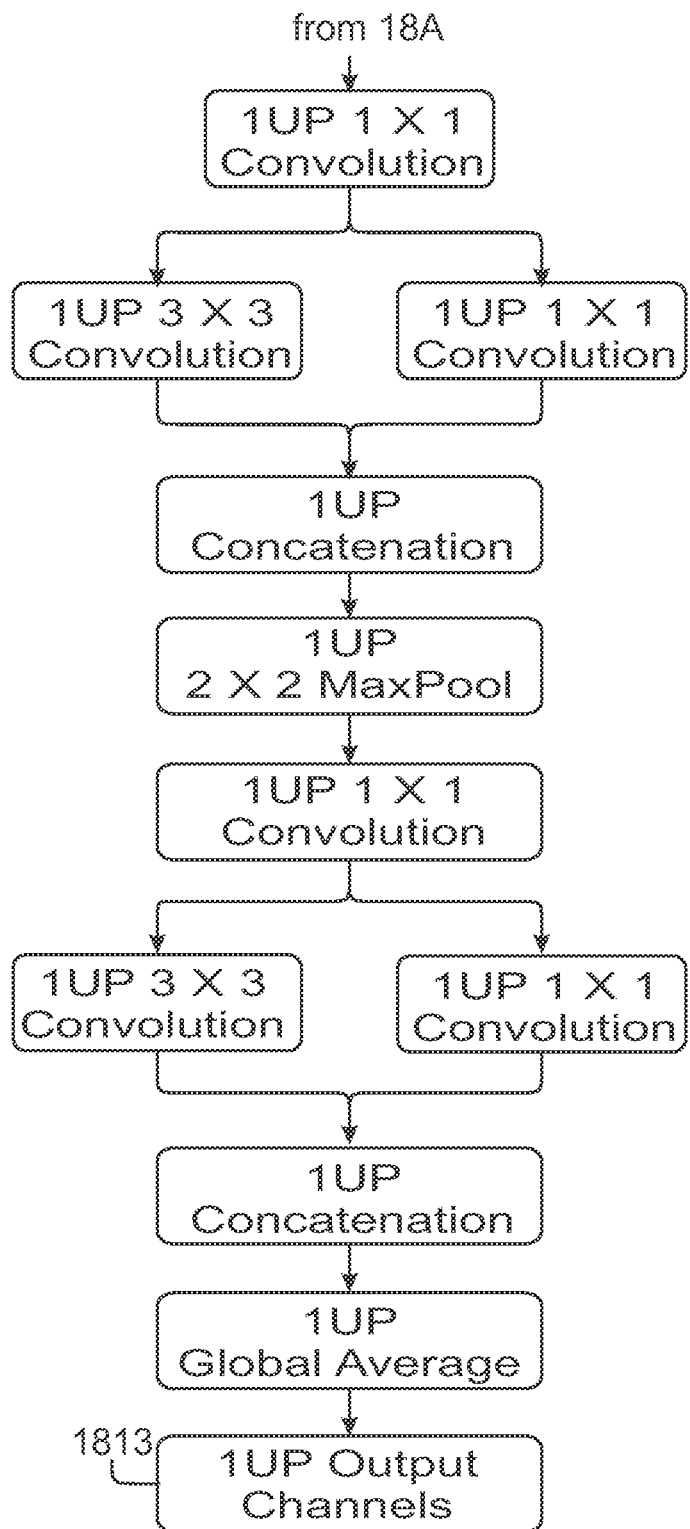
FIG. 18B illustrates circuitry implementing another part of the deep neural network of FIG. 18A.

FIGS. 18A and 18B illustrate overall construction and flow of a 4-up pipeline implementing the same form of DNN model as illustrated in FIGS. 17A and 17B. Input channels 1801 are presented as four sets of data for each channel in parallel. For RGB data, this would take the form of four individual pixels representing four adjacent columns of the input array comprising four RGB values for each pixel for a total of 12 inputs accepted simultaneously in parallel. Alternatively, input channels may be from another DNN circuit in which case they take the form of four complete sets of input channels representing four adjacent columns of the input array. For example, if the model requires 64 feature channels as input, the four sets would comprise a total of 256 parallel inputs.

First 7 by 7 Convolution node 1802 is typical for RGB inputs in DNNs used for visual comprehension. In this 4-up implementation node 1802 accepts inputs for four pixels at a time and produces outputs for four pixels at a time. The number of output channels is typically fairly large, 64 or more, compared to the number of input channels, and no longer represents color information. Throughout the remainder of the DNN in this model the channels represent detection strengths of features or combinations of features found in the input array and have independent values for each position. Each of subsequent Convolution nodes 1803, 1804, 1805 also accept and process inputs for four pixels at a time for each channel. Concatenation node 1806 accepts four sets of channels from Convolution nodes 1804 and 1805 and outputs the combined channels in sets of four.

First MaxPool node 1807 is labeled 4-up to 2-up. Node 1807 takes the maximum of four samples representing a patch of input array positions comprising two adjacent columns on two successive rows. Since the effect is to reduce the dimensions of the input array stream to produce an output array stream one half the width and one half the height, the effective throughput of all subsequent nodes is reduced by a net factor of four. When using single input processing, the subsequent processing clock may be reduced to take advantage by utilizing more compact circuitry.

When using N-up parallel input processing, the reduction in output array width is used to reduce the number of parallel outputs instead. Since the parallel inputs represent adjacent columns in the input array stream on the same row, only the reduction in width is relevant. While it is possible to retain the N-up parallel outputs at a reduced frequency, there is no advantage in size or power in so doing. The net effect of MaxPool node 1807 is to reduce the parallelism from 4-up to 2-up (as labeled) in the horizontal dimension and reduce the processing frequency by a factor of two rather than four as in the 1-up case described above.

Nodes 1808, 1809, 1810, and 1811 process data in 2-up parallel tracks and are each roughly half the size of their 4-up counterparts. This does not correspond to a reduction in power as the total number of operations required by a 4-up, 2-up, or 1-up circuit are the same, and only the overhead to manage the N-up coordination is reduced. Second 2 by 2 MaxPool node 1812 again takes the maximum of four samples representing a patch of input array positions comprising two adjacent columns on two successive rows. The net effect of node 1812 is to reduce the parallelism from 2-up to 1-up in the horizontal dimension and reduce the processing frequency by a factor of two. All subsequent nodes as shown in FIG. 18B operate on single sets of their respective input and output channels and final output 1813 takes the form of single samples of each channel presented in parallel simultaneously.

FIGS. 19 and 20 are tables describing array stream sizes for a typical small DNN applied to an input stream compatible with images in HD RGB format. The table of FIG. 19 describes the DNN implementing 1-up processing only, as depicted in FIGS. 17A and 17B, and the table of FIG. 20 describes the same DNN implementing 4-up processing initially and transitioning to 1-up processing in subsequent nodes, as depicted in FIGS. 18A and 18B.

Having described the nomenclature and general procedures for N-up parallel processing, the inventor now provides a specific example of apparatus and method for applying a 3 by 3 Convolution function to an input array, using 4-up parallel processing. The input array in this example is a pixel array in RGB color, as used in many other examples in this specification. It should be noted that this is not a limitation in the scope of the invention, as the 3 by 3 Convolution with 4-up parallel processing may be used for many other formats of input arrays. It is to be understood again in this example that the 3 by 3 blocks shown represent circuitry performing the kernel functions on the input stream.

Figure 21:
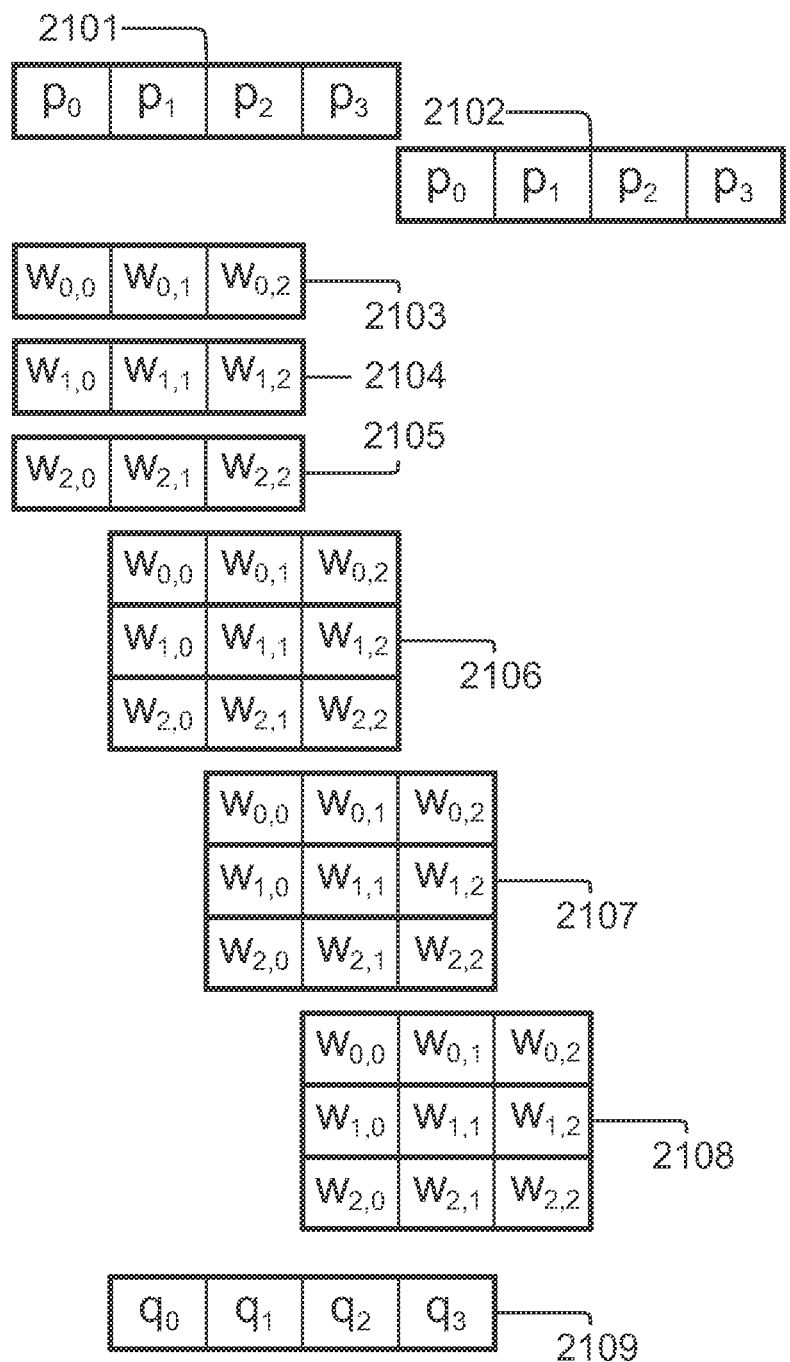
FIG. 21 illustrates circuitry of an IC performing a 3 by 3 Convolution node streaming four input channels simultaneously.

FIG. 21 illustrates the example of circuitry on an IC performing a 3 by 3 Convolution node using a 4-up data stream. In FIG. 21, one set of four inputs 2101 is a set retained from an immediately previous input interval and is retained with a current set of four inputs 2102 to provide all required inputs for all four output channels of the 3 by 3 Convolution. Use of the inputs from the immediately previous input interval along with the inputs from the instant interval is necessary to fully calculate the outputs in pipelined processing as is described in enabling detail above.

$p_0$, $p_1$, $p_2$, and $p_3$ represent the input channel values for positions 0, 1, 2, and 3 in the first row in the input array, respectively. For brevity, only a single symbol is used, but each symbol represents all channels of the input position. For the pixel circumstance each data point $p_x$ represents values for R, G and B for that pixel.

$w_{0,0}$ through $w_{2,2}$ represent the set of weights to be applied to the values in the input channels. Since each weight is applied to one and only one input channel, the number of input channels does not impact the structure of the circuit, so the multiple channels are not shown.

The weights in kernel rows 2103, 2104, and 2105 are applied to input channels $p_0$, $p_1$, and $p_2$ in parallel (simultaneously) and the partial products for each set of weights for each row are immediately summed as is the rule for the aperture function of a 3 by 3 Convolution. As described above in enabling detail for pipelined processing, partial sums are passed along from each functional circuit to the next, and outputs are produced when all necessary partials are accomplished. Application of the weights in row 2105 produces the final output for the kernel for the current row by combining the partial products with the sum of the products from applying the weights of row 2104 from the previous row. Application of the weights of row 2104 produces an intermediate value by combining the partial products with the sum of applying the weights of row 2103 from the previous row. Applying the weights of row 2103 produces an initial value by summing the partial products and retaining the partial products for later use. A bias, if any, may be introduced at any stage. An activation function, if any, would be applied to the final output 2105.

A complete circuit implementing the weights of rows 2103, 2104, and 2105, including any bias and activation function, produces the first output channel of the 4-up set.

When the first 4-up set is presented from the input array stream, there is insufficient data to calculate all four required outputs, so computation for all outputs is delayed until the second 4-up set is acquired, and valid data is available for computation using inputs from both sets 2101 and 2102.

Circuits 2106, 2107, and 2108 apply weights in circuits that are copies of the previous circuit, and the functions differ only in to which positions of the inputs the weights are applied. Note that the set of weights $w_{0,0}$ through $w_{2,2}$ are identical for all output channels but that each combination of one weight and one input channel is unique.

The outputs calculated using the weights of row 2105 of the first kernel copy produce the first parallel set of channels $q_0$ of the output array stream, while the outputs using the weights of the other kernel copies 2106, 2107, and 2108 produce the remaining parallel sets of channels $q_1$, $q_2$, and $q_3$, respectively of the output stream 2109.

Since the first output $q_0$ corresponds to the 3 by 3 kernel being centered on $p_1$, the circuit corresponding to the arrangement in FIG. 21 is the solution for the inset or "valid" version of the 3 by 3 Convolution. The width of the output array stream is thus two positions reduced from the width of the input array stream as conforms to the definition of the aperture function for said variation. (The height is also typically reduced by two rows but that is irrelevant to the horizontal processing.)

Figure 22:
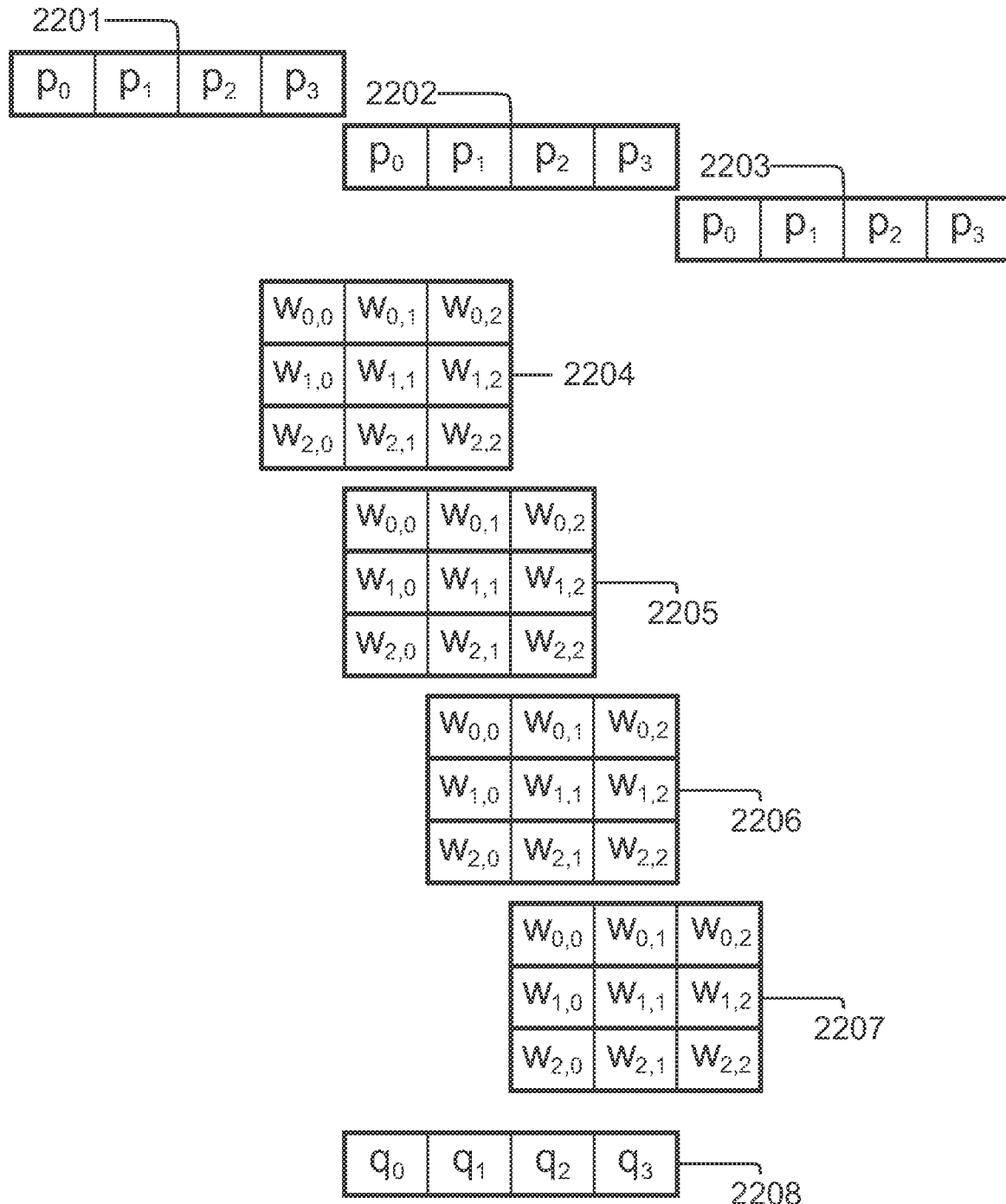
FIG. 22 illustrates the required arrangement for the circuit to produce outputs for the 4-up input channels for the "same" version of the 3 by 3 Convolution.

FIG. 22 illustrates the required arrangement for the circuit to produce outputs for the 4-up input channels for the "same" version of the 3 by 3 Convolution, i.e. where the dimensions of the output array stream are not reduced and one output position is produced for every distinct position of the input array stream. In this variation, an input set 2203 presents the current values of the 4-up input array stream, while input sets 2202 and 2201 present the retained values from the previous two sets.

Application of kernel circuits 2204, 2205, 2206, and 2207 produce the values of the 4-up output array stream 2208, $q_0$, $q_1$, $q_2$, and $q_3$ respectively, and are now aligned such that the center of each kernel corresponds to one position of the 4-up input array stream.

When the first 4-up channel set is presented from the input array stream, there is insufficient data to calculate all four required outputs, so computation is delayed until the second 4-up set is presented and valid data is available for both sets 2202 and 2203. Valid data will not yet be available for set 2201, and kernel circuit 2204 will either suppress inclusion of weights applied to $p_3$ of 2201 or force the uninitialized values to zero as is consistent with the application of the 3 by 3 Convolution aperture function to positions that cause the kernel to overlap the edge of the input array. This suppression mechanism is triggered for the first set of each row, but subsequent sets on that row will make use of the $p_3$ value set 2201 to compute the full kernel for that output position $q_0$.

In processing a complete DNN, situations arise where the 4-up stream technique is applied to input array streams whose widths are not an even multiple of four. In such cases, the invalid values in the final 4-up set are suppressed by forcing the invalid values to zero or by other means, and the final output positions in the last 4-up set of the row are ignored. This is consistent with both the inset ("valid") and full ("same") variations of the 3 by 3 aperture function.

In all cases, the first position of each row of the input array stream is always presented in the first position of the 4-up input set.

In cases where the input row length is not an even multiple of the processing set width, the processing clock is increased such that the overall throughput of the N-up processing is compatible with the throughput of the 1-up input source, and special buffering is required to pack incoming values into N-up sets. This special buffering is described below.

Figure 23:
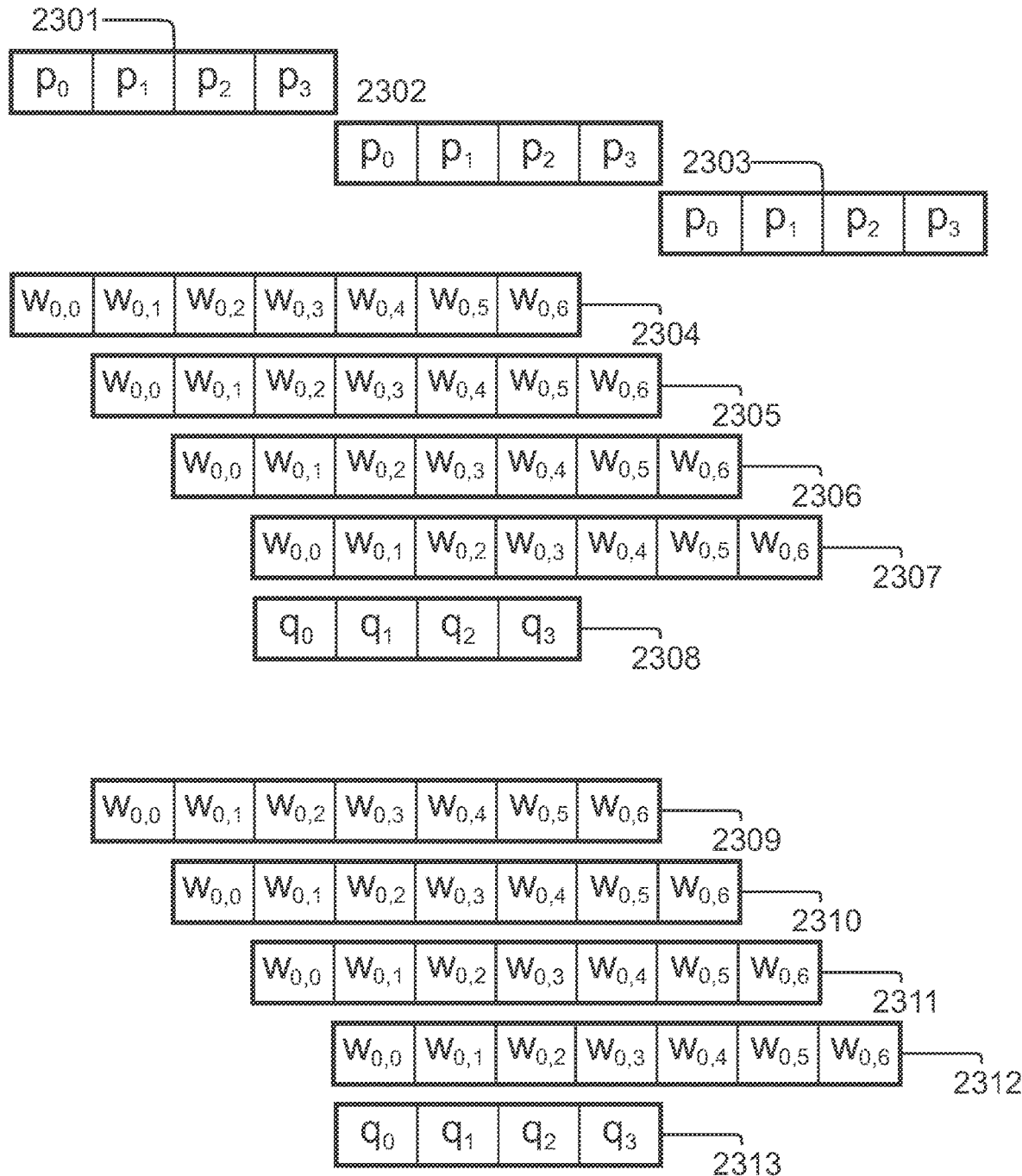
FIG. 23 illustrates the required arrangement for the circuit to output two variants of a 1 row by 7 column Convolution streaming four input channels simultaneously.

FIG. 23 illustrates the required arrangement for the circuit to output two variants of a 1 row by 7 column Convolution over 4-up data. From the previous discussion of 3 by 3 Convolutions, one experienced in the art should discern that the specific number of rows in the kernel only affects the number of partial sums retained over time and not the mapping of kernel weight columns to input set columns. The data arrangement shown in FIG. 23 thus applies equally to 7 by 7, 3 by 7, or any other kernel whose width is 7.

As described above, input set 2303 is the currently presented 4-up data set from the input array stream and sets 2302 and 2301 are previously presented and retained data sets from the immediately prior and second prior sets, respectively.

Kernel processing circuits 2304, 2305, 2306, and 2307 represent the alignments required to produce inset ("valid") Convolution outputs 2308, and circuits 2309, 2310, 2311, and 2312 represent the alignments required to produce full ("same") Convolution outputs 2313.

$w_{0,0}$ of circuit 2304 aligns with $P_0$ of input set 2301 to produce the inset variant, and $w_{0,3}$ of circuit 2308 aligns with $P_0$ of input set 2302 to produce the full variant, where both circuits 2304 and 2309 produce output $q_0$ for their respective use cases.

One experienced in the art should understand that the two sets of kernels have considerable overlap of identical functions and that it is straightforward to arrange a single circuit using only five uniquely mapped kernel circuits to produce either variant on demand. One experienced in the art should also understand that any M-up streaming data set (including 1-up) may be repackaged into any other N-up streaming format (where M N) as required to maintain the overall throughput of the system high enough to accept and process the input array stream at the presented rate. The cost of so doing is to require N copies of certain core processing circuits, but the overall effect is to allow circuits to restrain the processing clock to reasonable limits for the implementation method while still accepting the input stream at full speed.

Figure 24A:
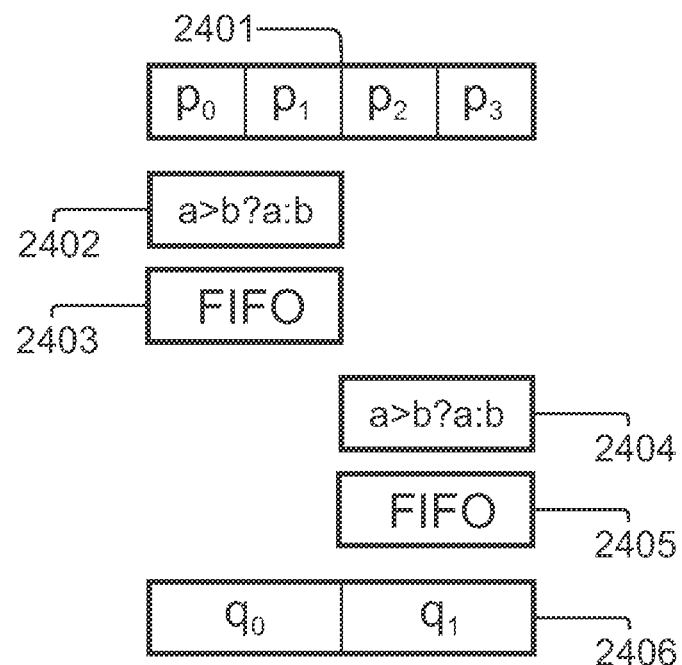
FIG. 24A shows an arrangement of a 2 by 2 MaxPool node over a 4-up data stream.
Figure 24B:
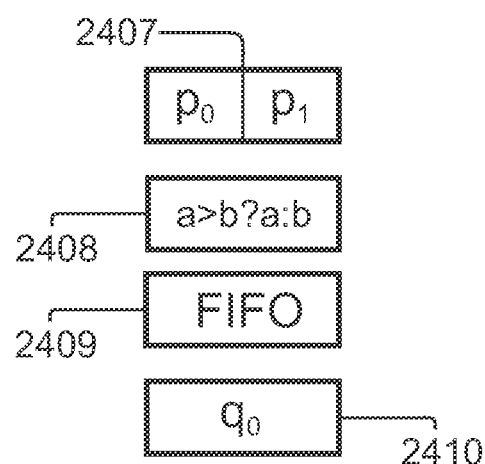
FIG. 24B shows an arrangement of the 2 by 2 MaxPool node of FIG. 24A over a 2-up data stream.

FIGS. 24A and 24B illustrate a typical implementation of a 2 by 2 MaxPool node wherein the largest value for each channel is selected for distinct patches of two adjacent column positions over two adjacent rows.

FIG. 24A shows the arrangement of a 2 by 2 MaxPool node over a 4-up data stream 2401. When the first row of each pair is presented, a comparator 2402 evaluates inputs $p_0$ and $p_1$ and passes the larger to a FIFO circuit 2403 to be retained for use when the second row is presented. Comparator 2404 and FIFO 2405 at the same time do the same operation for inputs $p_2$ and $p_3$. When the second row of each pair is presented, comparator 2402 accepts the retained maximum from FIFO 2403 for the same column positions from the first row and compares it to inputs $p_0$ and $p_1$ and outputs the greater of the three values as output $q_0$, while comparator 2404 and FIFO 2405 perform the same operation on inputs $p_2$ and $p_3$ to produce output $q_1$.

Output set 2406 comprises two sets of channels, each individual value of which is the maximum of four samples of each specific channel (in this aperture function, values from different channels do not interact). The output 2406 of FIG. 24A is thus a 2-up output data stream produced from a 4-up input data stream.

FIG. 24B shows the arrangement of the same 2 by 2 MaxPool node over a 2-up data stream 2407. Comparator 2408 and FIFO 2409 are identical in function to those described above, but only a single set is required to accept 2-up inputs $p_0$ and $p_1$ to produce a single set of output channels 2410. Output 2410 of the second example is thus a 1-up output data stream produced from a 2-up input data stream and all downstream nodes may take the smaller 1-up form.

The tiled MaxPool function, along with any other aperture function with a 2 by 2 stride, reduces the size of the input array by a factor of 2 in each dimension. As the total width of an N-up array stream is N times the number of sets presented, the reduction can be effected by reducing either the width in sets or reducing N, as long as N is evenly divisible by the horizontal stride. Because N is the factor of replication of the copies of the circuit executing in parallel, reducing N is preferred whenever possible.

Figure 25:
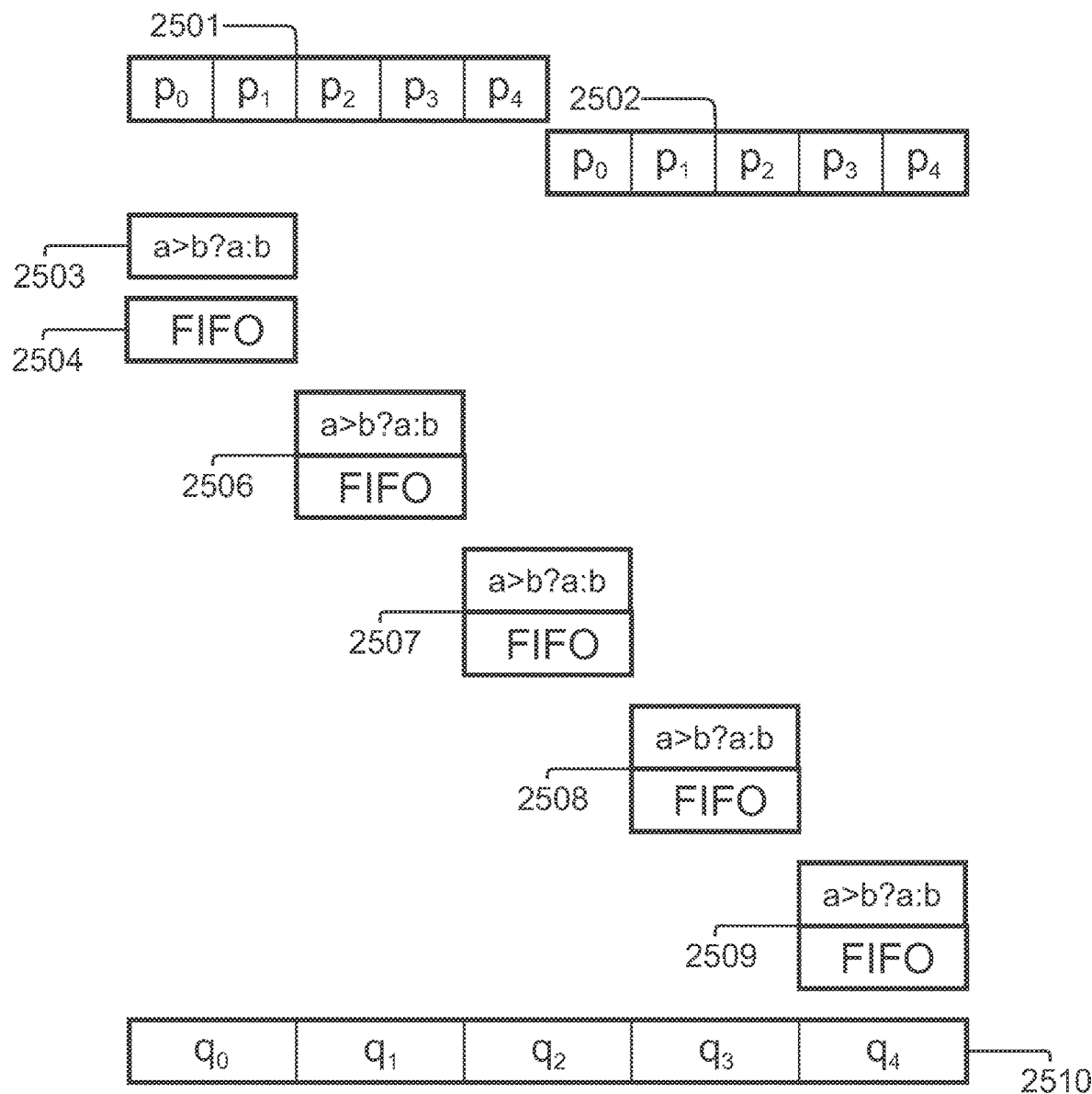
FIG. 25 illustrates a contrived example where reducing N is not possible.

FIG. 25 illustrates a contrived example where reducing N is not possible. It applies a 2 by 2 MaxPool node, but to a 5-up input stream in this case. As before in the 3 by 3 Convolution cases, input set 2501 is retained and used in concert with current input set 2502 to present the minimum set of values such that all outputs may be produced on the same clock cycle. (Other arrangements are also possible such as switching the first comparator to process either $p_0$ with $p_1$ or $p_1$ with $p_2$ on alternate input sets while setting the middle comparator to process $p_4$ with $p_0$ of alternate inputs. This would reduce the number of required copies of the aperture function from five to three and would be advantageous where the aperture function implementation is significantly more complicated than a simple comparison.)

In this example, comparator 2503 and FIFO 2504 operate on the retained values of $p_0$ and $p_1$, comparator block 2506 operates on the retained values of $p_2$ and $p_3$, while comparator block 2507 operates on the retained value of $p_4$ and the current value of $p_0$. Comparator block 2508 operates on the current values of $p_1$ and $p_2$, and comparator block 2509 operates on the current values of $p_3$ and $p_4$.

Since it is not possible within the constraints of the pipeline to implement a 2.5-up data stream, the reduction in dimension in this example must be applied to the width of the input array, and output 2510 is thus a 5-up output reflecting the 5-up input stream.

Figure 26A:
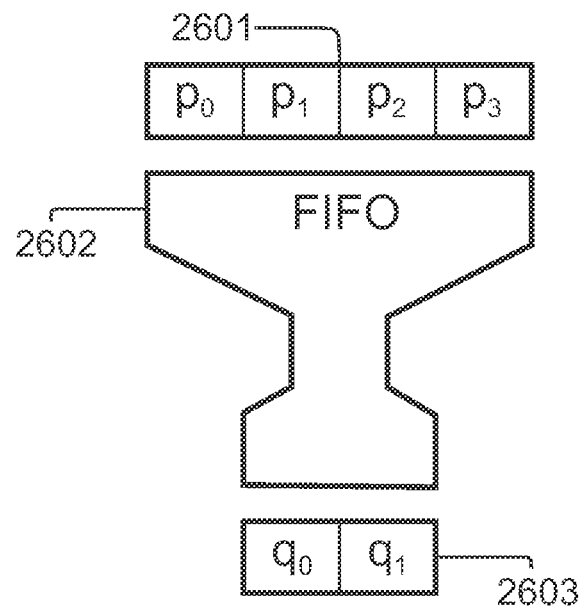
FIG. 26A illustrates a FIFO circuit used to repackage a 4-up stream into a 2-up stream.

As described above, under some circumstances it may be advisable to repackage an M-up stream as an N-up stream with the same array dimensions. A specialized FIFO circuit may be used to perform this function. FIG. 26A illustrates such a FIFO used to repackage a 4-up stream 2601 into a 2-up stream 2603. FIFO 2602 accepts inputs 4 at a time and stores them as individual entries. Whenever 2 entries are available in the FIFO outputs are produced 2 at a time. The data flow in FIG. 26 (as well as in following figures) is down from the inputs through the circuitry to the outputs.

In the common circumstance where the width of the input stream is not an integral multiple of the input stream set size, a counter must be included to track the number of valid entries presented for each row. For example, if the input array width is 10 using a 4-up input set where 3 sets of 4 are required to cover a complete row, the FIFO must ignore the last two entries of the 3rd set of inputs presented, and output 5 sets of 2-up outputs rather than 6. After each row, the counter is reset and begins counting entries on the next row. The array width limit can be fixed or presented via a preloaded register. If the array width is known to always be an integral multiple of both input set size and output set size, then this logic may be omitted.

Figure 26B:
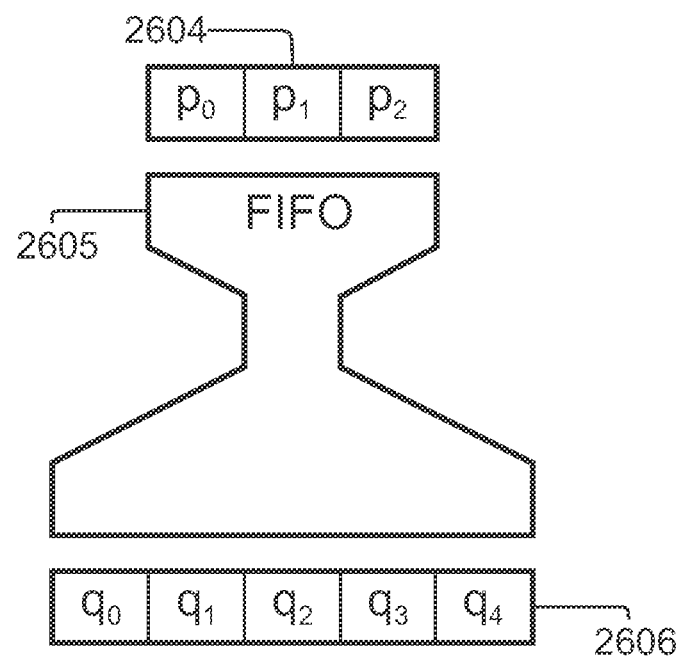
FIG. 26B illustrates repackaging a 3-up stream into a 5-up stream.

FIG. 26B illustrates repackaging a 3-up stream 2604 into a 5-up stream 2606. FIFO 2605 accepts inputs 3 at a time but stores them as individual entries. Whenever 5 entries are available in the store the FIFO produces outputs 5 at a time.

As described above, extra operations must be implemented to account for invalid entries that may occur at the end of rows where the array width is not an integral multiple of the input set size. A similar problem occurs when the array width is not an integral multiple of the output set size. In this case, a final set must be issued when each row has been completely received, the final set containing the final entries of the row in the first outputs, and containing invalid entries of no specific value in the remaining sets of channels. For convenience, a practice of placing all zeroes in the invalid entries may be used to reduce total circuit size in subsequent nodes where zeros have no effect such as in Convolution and MaxPool.

The size of the FIFO must be sufficient to retain as many input sets as required to guarantee that no data is lost. To maintain the throughput of the system as a whole, outputs are issued as soon as sufficient entries are available to produce an output set.

While any set size may be repackaged to any other set size, the required processing frequency will be altered proportionally to the ratio of the sizes. For any M-up input repackaged as N-up output, the required processing frequency may be described as $$f_{out} = f_{in} \times \frac{M}{N}$$

Throughout the system, for the simplest operation, each circuit accepting rows should provide for and ignore unused invalid entries at the end of all rows where the row width is not an integral multiple of the set size. This is not a strict limitation, as the circuit could work anyway with additional logic, not shown here. This guarantees that every column position maps to the same channel set within the parallel sets presented for every row and minimizes the complexity of operations that combine values of the same column positions over multiple rows.

Figure 27A:
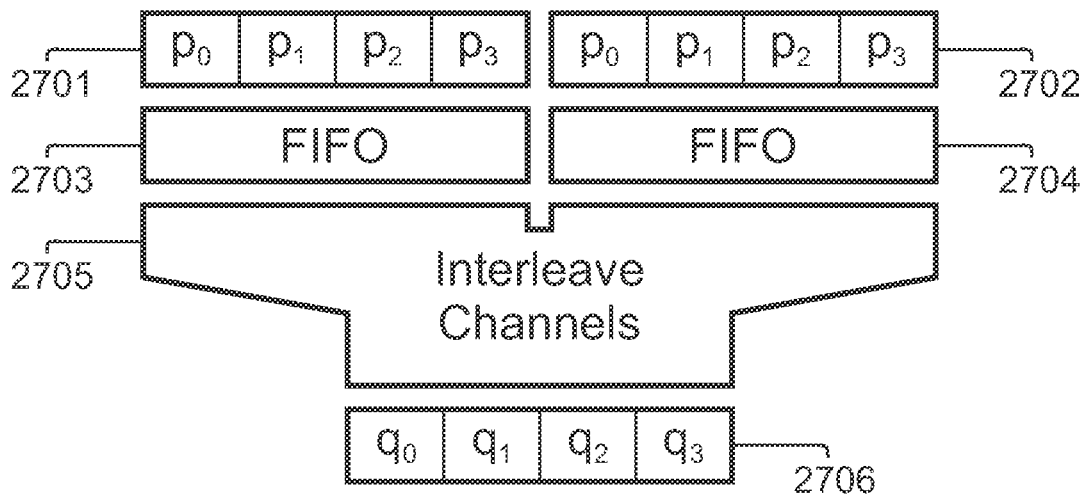
FIG. 27A illustrates implementation of a Concatenation node such that output contains all channels from all sources.

FIG. 27A illustrates implementation of a Concatenation node where channels from one source 2701 are concatenated on a per position basis with channels from another source 2702, or more sources (not shown), such that output 2706 contains all channels from all sources. Channel values are not mixed or altered by this node. In a common circumstance where the sources have differing timings, one or both of the FIFOs 2703 and 2704 will retain input channel values until a full set of output channels are available. The interleaving circuit 2705 will concatenate all channels from set $p_0$ from each source to produce $q_0$, from set $p_1$ to produce $q_1$, and so forth.

A common example that requires this solution would be combination of the output of a 3 by 3 Convolution node and the output of a 1 by 1 Convolution node, each of which is applied to the same input array stream. While both nodes process the stream at the same rate, the outputs of the 3 by 3 node cannot be finalized until the third row of the input stream is presented, while the outputs of the 1 by 1 node can be finalized as soon as any data from the input stream is presented. The net effect is that the outputs of the 1 by 1 node corresponding to specific positions of the input array stream will be presented to the Concatenation node significantly before the outputs of the 3 by 3 node for those same positions. Since the next node after the Concatenation node will require all the channels for any given position to be presented before any calculations can be made, the Concatenation node must buffer the input stream that is presented earlier and wait for the input stream that is presented later to reach the same position before it can present a full set of all channels for the given position on the outputs. This is equally true for 1-up or N-up data streams.

If every input array position of the slowest path is always presented after the same position via all other paths, then the FIFO for that path may be omitted. If under some conditions, typically final positions of the stream, the slowest path will not be presented last, then the data in the FIFO for that path must be retained with a minimum number of entries required to prevent data loss under those special conditions.

If the data path widths for the various sources differ, the path widths may be repackaged to match each other as in FIGS. 26A and 26B, or that function may be merged with the FIFOs used for the concatenation buffering. One experienced in the art should understand that any number of paths may be concatenated as a single operation by adjusting the size of the FIFOs for each of the earlier paths to retain as many values as each path can present, in the worst-case timing, before the corresponding positions are presented by the slowest path.

Figure 27B:
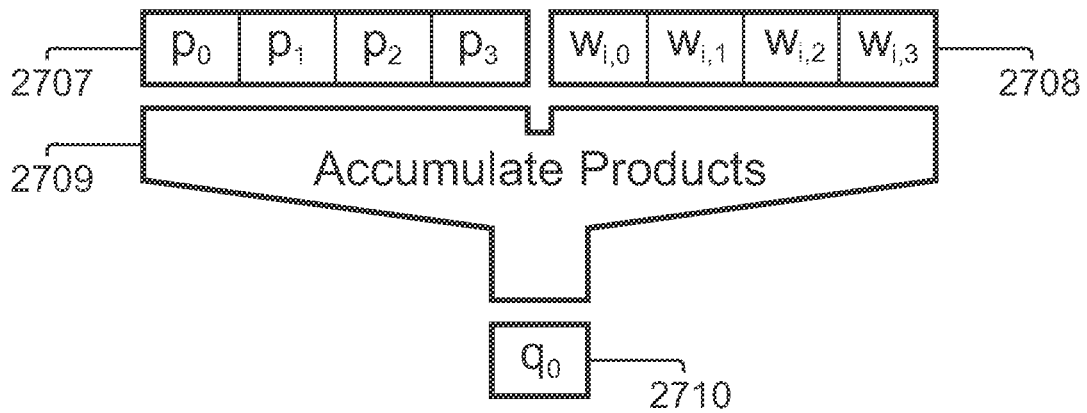
FIG. 27B illustrates implementation of a 4-up Dense node.

FIG. 27B illustrates implementation of a 4-up Dense node. A Dense node is mathematically equivalent to a Convolution that has a kernel size identical to the size of the input array. Therefore, to create each output channel there is one distinct weight applied to each input position for each input channel. The number of output channels bears no relationship to the number of input channels and the output array produced is always a 1 by 1 array. Since inputs 2707 are submitted in sets of four in this example implementation, weights 2708 specific to each input position are loaded from a local store (not shown) and multiplied in circuitry 2709 by current inputs to form partial products of the full kernel. All partial products from all input channels presented are summed to produce a single 1-up set of output channels 2710.

Figure 27C:
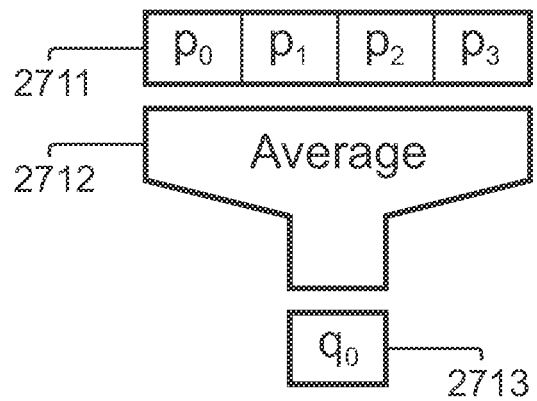
FIG. 27C illustrates implementation of a 4-up Global Average node.

FIG. 27C illustrates implementation of a 4-up Global Average node which takes all values for all positions of each input channel and averages them to produce the same number of output channels. A Global Average node is mathematically equivalent to a Convolution that has a kernel size identical to the size of the input array and is applied only to each input channel individually (as opposed to all input channels together as immediately above) with a common constant value equal to the reciprocal of the number of elements in the kernel. Since it is mathematically equivalent to multiply the reciprocal either before after the summation operation, circuit 2712 simply sums all values of each position for each input channel 2711 and then multiplies by the reciprocal of the number of elements when all input values have been summed, to produce each output channel. Since all input positions are merged into a single value, output 2713 is a single 1-up set of channels with an array size of 1 by 1.

Figure 28:
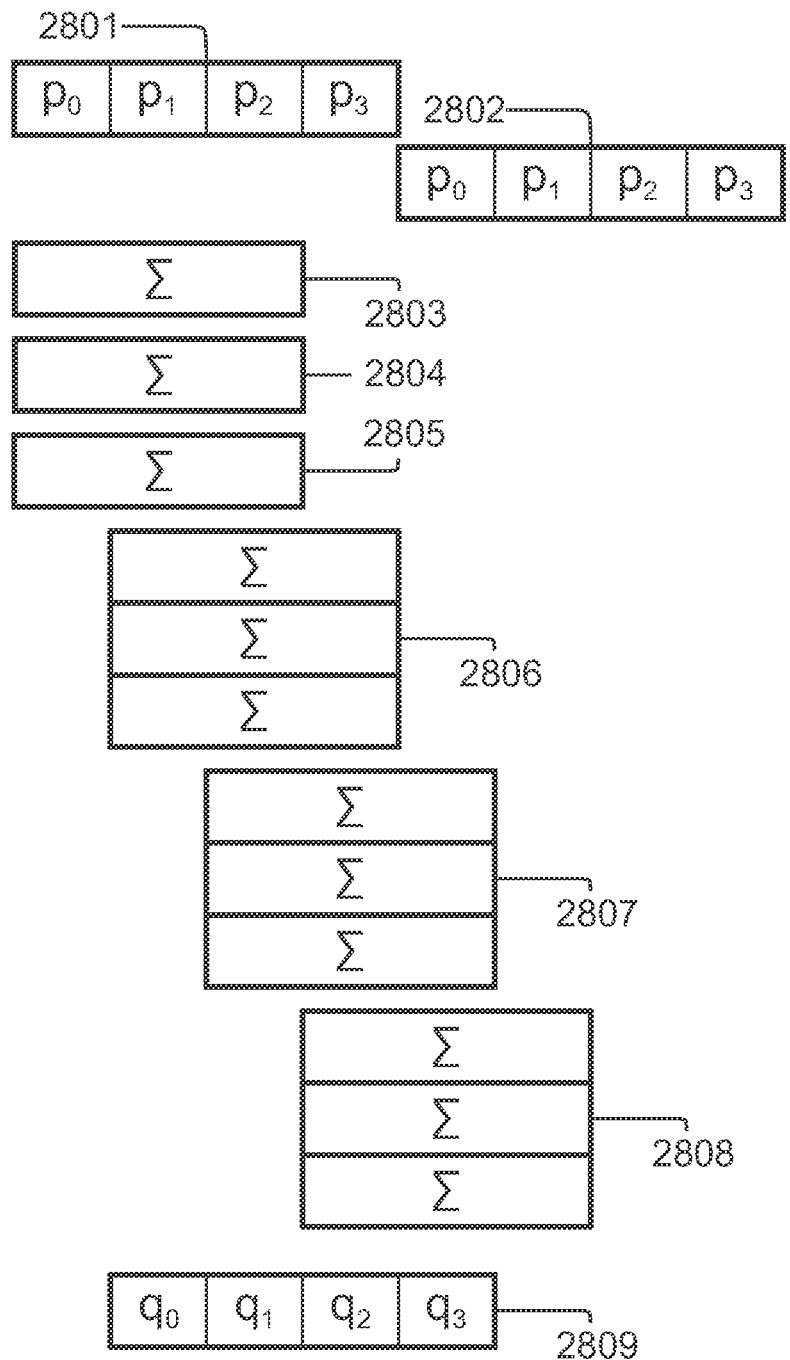
FIG. 28 illustrates a 4-up implementation of a 3 by 3 Local Average node.

FIG. 28 illustrates a 4-up implementation of a 3 by 3 Local Average node which utilizes a sliding aperture function to compute the average of each input channel over a subset of positions to produce the output channels. This implementation forms the inset or "valid" set of outputs where the aperture does not overlap with the edges of the input array, and the number of samples is the same for all output positions. Each output channel corresponds to a single input channel and data is not mixed between channels. As with implementation of a Convolution node with similar size and input mapping show above in FIG. 21, current input set 2802 is retained by registers 2801 such that current and immediately prior input sets may be accessed simultaneously. Each of circuits 2803, 2804, and 2805 apply the same summation of each input channel of sets $p_0$, $p_1$, and $p_2$, but apply that sum to three different partial sums over time to produce set $q_0$ of output array stream 2809. Circuit 2803 initializes the running sum for the first row, circuit 2804 utilizes output of circuit 2803 delayed by a FIFO (not shown) to produce the running sum for the middle row, and circuit 2805 utilizes delayed output of circuit 2804 to produce each final summation. Circuit 2805 then multiplies the final summation by the reciprocal of the number of elements, in this case 1/9, to produce output set $q_0$. An activation function may be integrated into the circuit or equivalently placed between the nodes.

Equivalent circuit 2806 produces output set $q_1$ from channel sets $p_1$, $p_2$ and $p_3$ of the prior input set. Likewise, circuit 2807 produces $q_2$ from $p_2$ and $p_3$ of the prior input set 2801 along with $p_0$ of the current input set 2802, and circuit 2808 produces $q_3$ from $p_3$ of the prior input set 2801 along with $p_0$ and $p_1$ of the current input set 2802.

If the Local Average aperture function is to be produced for every valid position, output 2809 has a reduced array size compared to the input, in this case the width and height are each reduced by two positions, but this is in general insufficient to reduce the 4-up stream significantly. If a horizontal stepping size other than one is used, i.e. not every possible output position is utilized, the reduction of horizontal dimension may be implemented in the circuit as a reduction of N. For example, if the horizontal stepping size is 2, only every other value is required, and the circuit may produce 2-up output channels by computing $q_0$ and $q_2$ only and omit the unused circuitry for $q_1$ and $q_3$. Similarly, if the horizontal stepping size is greater than 4, the various circuits used to compute $q_0$ through $q_3$ can be utilized in turn to produce a 1-up output stream.

Figure 29:
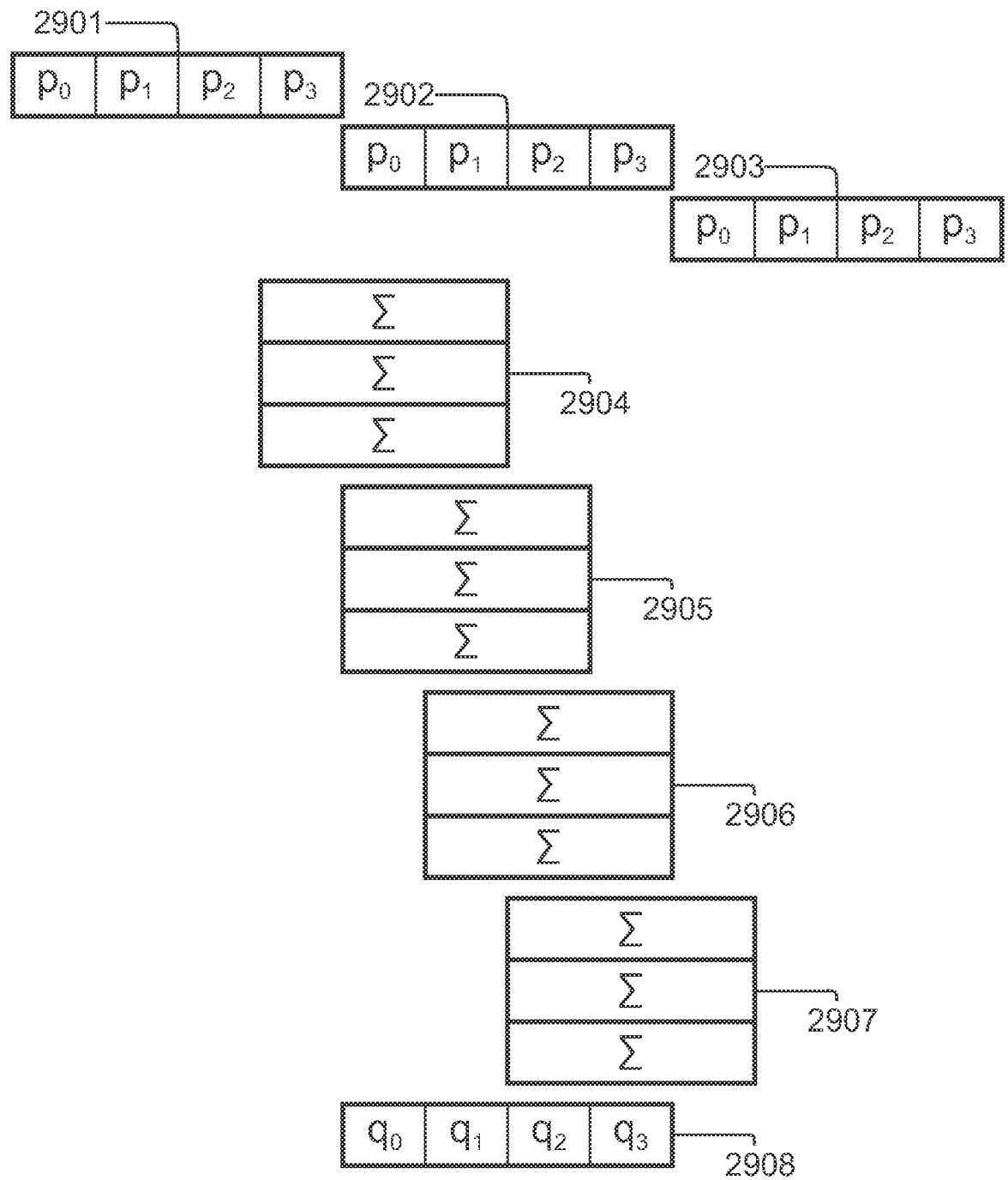
FIG. 29 illustrates another 4-up implementation of a 3 by 3 Local Average node.

FIG. 29 illustrates another 4-up implementation of a 3 by 3 Local Average node that forms the full or "same" set of inputs where the aperture overlaps the edges of the input array, and the output array dimensions are the same as the inputs array dimensions. In this case, the number of input positions sampled at the edges are not the same as the full set of samples taken in the interior, so the final reciprocal used for each output position must reflect the number of samples used for that output position.

In a similar fashion to the example circuit shown in FIG. 22, the variation in FIG. 29 utilizes input set 2903 to present the current values of the 4-up input array stream, while input sets 2902 and 2901 present the retained values from the previous two input sets.

Application of summation circuits 2904, 2905, 2906, and 2907 produce the values of the 4-up output array stream 2908, $q_0$, $q_1$, $q_2$, and $q_3$ respectively, and are now aligned such that the center of each summation corresponds to one position of the 4-up input array stream. In this example, only summation circuit 2904 will intersect the left edge of the input array when the first 4-up input is presented at the beginning of each row, but all four summation circuits may intersect the right edge of the input array depending on the number of sets populated at the end of the row, so the choice of reciprocal reflecting the number of samples taken will vary accordingly.

Observing the close correspondence of the example circuits FIGS. 21 and 28, and also the close correspondence of example circuits FIGS. 22 and 29, one experienced in the art should understand that the structure and replication of the computations is not affected by the nature of the aperture function implemented, and further that this apparatus and method is equally applicable to any aperture function defined over a similar sliding window.

Figure 30A:
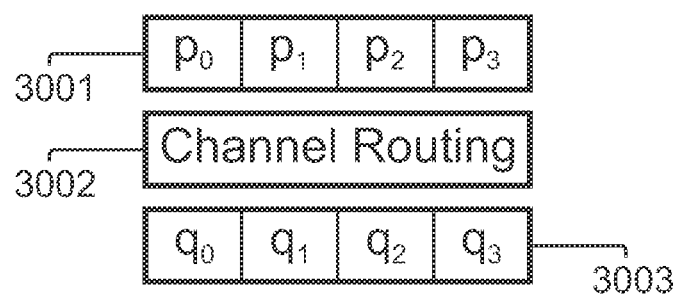
FIG. 30A illustrates implementation of a 4-up Subset node.

FIG. 30A illustrates implementation of a 4-up Subset node that passes only specific channels through to the next node but passes the specific channels with equivalent array dimensions and timing. This node type is typically used to split the incoming channels such that different styles of processing can be applied to each group of incoming channels. If the set of channels routed to the output is fixed, the connection between inputs 3001 and outputs 3003 may be made by direct wiring of physical conductors. Otherwise routing circuitry 3002 will affect the required selection of channels using multiplexors.

Figure 30B:
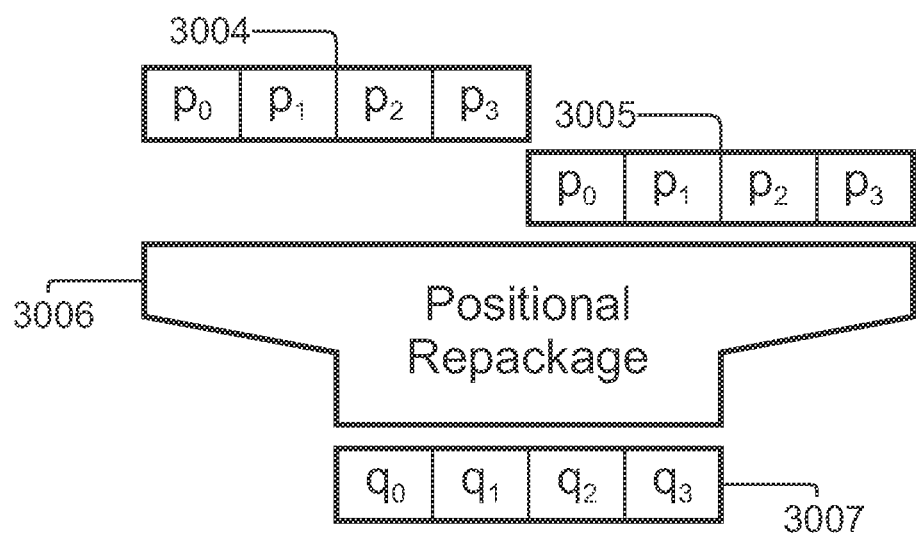
FIG. 30B illustrates typical implementation of a 4-up Crop node.

FIG. 30B illustrates typical implementation of a 4-up Crop node that presents a subset of positions of an input array stream to an output array stream. Typically, entire rows at the top edge or the bottom edge, or both, are omitted along with columns at the left edge or the right edge, or both. To allow for the columns omitted at the left edge to be a number that is not an integral multiple of the data set size N, current input set 3005 is combined with prior input set 3004 in repackaging circuitry 3006 to produce channel sets $q_0$, $q_1$, $q_2$, and $q_3$ of output 3007 such that $q_0$ is always used for the first column of each row. When either no omission on the left edge of the input array stream is required, or the number of columns omitted is an integral multiple of N, the prior input set 3004 may be omitted from the simplified circuit. If the output array is sufficiently reduced from the input array, then the N-up input stream may be repackaged into an M-up output stream within the positional selection circuitry.

In any of the nodes described above, either mass multipliers or individual multipliers may be used with equal facility. Where many weights are applied against each input, mass multipliers have an advantage over individual multipliers based on the bit widths of the multiplicands and the products. In other circumstances, individual multipliers of equivalent precision may be smaller or lower in power usage. The N-up pipeline is not dependent on the type of multipliers used.

In another aspect of the invention ICs might be provided with one or a plurality of interconnected functional circuits and an input and an output port, each IC implementing a portion of a neural network, as are described above with reference to FIGS. 17A and B and FIGS. 18A and B. Individual ones of such ICs in a system embodiment may be connected from a first IC receiving primary input from a source array, to other ICs, output ports to input ports, either in a linear order or in interconnected chains with parallel connections. An output port of a last IC in the connected set would then provide the output of a neural network comprising functionality of all of the ICs.

Figure 31:
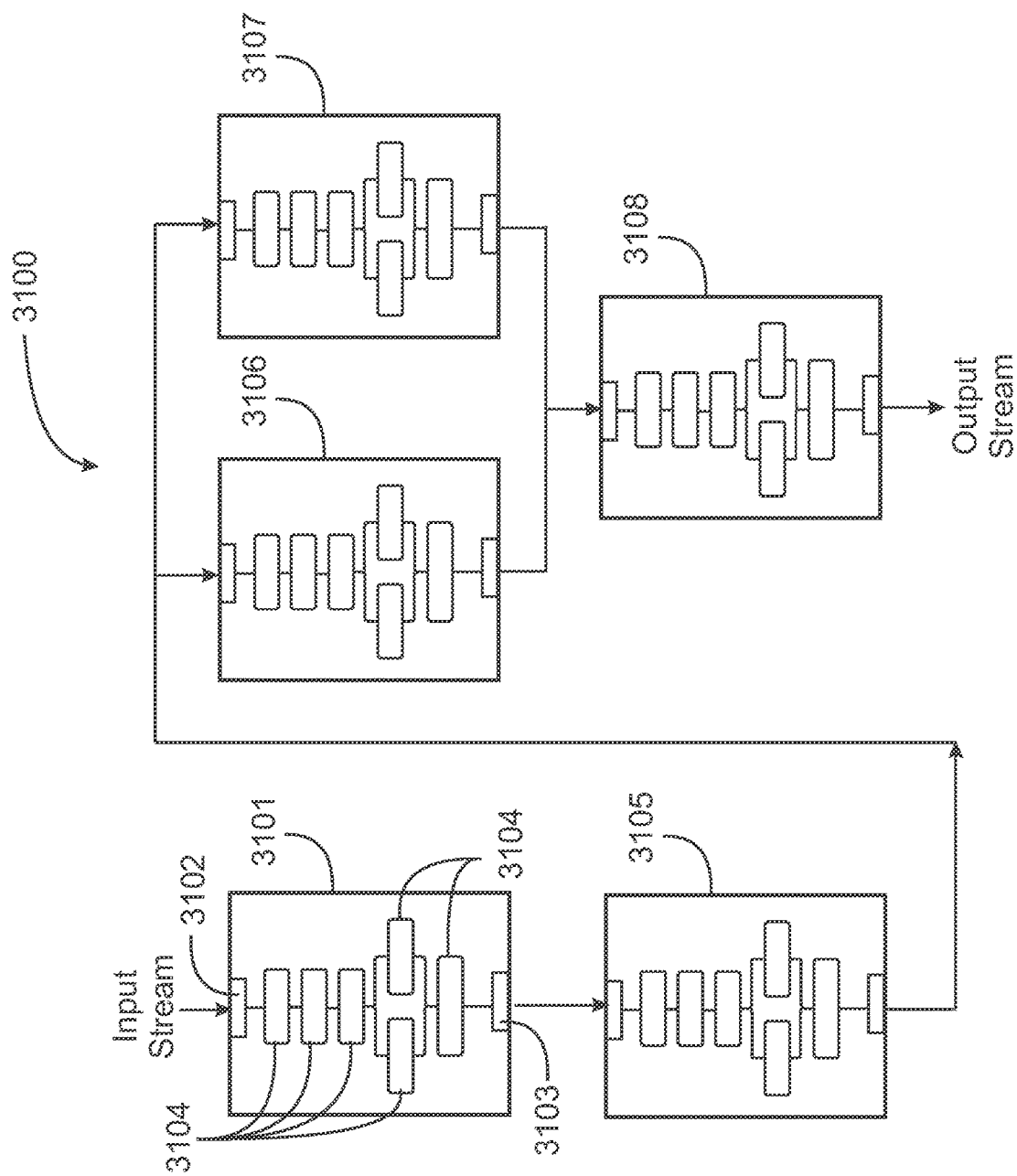
FIG. 31 illustrates a system of interconnected ICs implementing a neural network.

FIG. 31 illustrates such a system 3100 of ICs interconnected to implement a neural network. IC 3101 has an input port 3102 receiving a stream of input values. The input values may be in any protocol as described above for input arrays that may have a single value per position in the array, or multiple values per position as in the example of an HDMI image having RG and B values for each position in the input array, or the input stream may be ordered as an N-up stream as described in embodiments above.

In FIG. 31 five ICs 3101, 3105, 3106, 3107 and 3108 are shown interconnected between input and output ports. IC 3101 is illustrated with functional circuits 3104 interconnected on the IC, leading to an output port 3103, which connects to the input port of IC 3105. The functional circuits are implementing aperture functions as described in different embodiments above. In this example ICs 3105, 3106, 3107 and 3108 show functional circuits with the same interconnection as IC 3101, but it is emphasized that the ICs are different and the functional circuits and the interconnections among the functional circuits are not the same. The graphics are representative.

IC 3105 connects by the output port to input ports for both ICs 3106 and 3107, to illustrate that there may not be a simple linear connection among the ICs. The output ports of ICs 3106 and 3107 are shown both connected to the input port of IC 3108. Again, the graphics are representative. In any system of interconnected ICs the interconnections may be more complicated. IC 3108, as the last IC in the system outputs an output stream for the neural network implemented by the system of interconnected ICs. The connections between input ports and output ports are parallel paths of conductors for delivering bits of values for each output interval. The system of ICs implements a neural network of some depth. A limitless variety of neural networks may be implemented in this aspect of the invention by interconnecting individual ICs provided with different nodes and interconnections on the individual ICs.

Application to Three-Dimensional Image Data

In the embodiments and examples of the instant invention described in enabling detail above in many examples, the primary input data source is in the form of values for pixels of a two-dimensional image, such as, for example, an RGB image as an HDMI frame, being a 1080 by 1920 matrix of RGB values each pixel of which is a 3 by 1 vector of color components. In operations of apparatus and methods in various embodiments of the invention, however, not all input data sets will be in the form of a two-dimensional (2D) array like the HDMI frame. On page 41 above, however, the circumstance of the primary input data source being a three-dimensional array of data points was introduced.

As an example of a three-dimensional image that may serve as input in a neural network, many medical devices, magnetic resonance imaging (MRI) devices, for example, capture three-dimensional (3D) image data. Description below in the instant application extends unique 2D processing apparatus and methods described above in enabling detail to process streams of values representing 3D image data.

To understand applications of embodiments of the invention to 3D data, one may reconsider the 2D data samples used in previous descriptions, such as an HDMI frame, which has been depicted above as a series of pixels arranged in a 2D plane. Aperture functions were described as based on patches, such as a 3 by 3 patch, meaning three pixels wide and three pixels high. A 3 by 3 aperture function manages computation involving data values of nine pixels or features from prior nodes, the pixels or features dependent on the position of the patch centered on a particular pixel in the image. If one now considers the third dimension, orthogonal to the plane of the 2D array, one may consider a 3 by 3 by 3 3D patch, having 27 data points. A 3D patch must have a plurality of data points in each dimension, and a common number, like 3 by 3 by 3 is typical. In a 3D image, the data points are termed voxels rather than pixels. It is not required that three dimensions of a 3D aperture function be the same. That is not a limitation in embodiments of the instant invention. So, for the purpose of this description, as a 2D patch was referred to above as M by N, a 3D aperture function has dimensions L by M by N.

Figure 32:
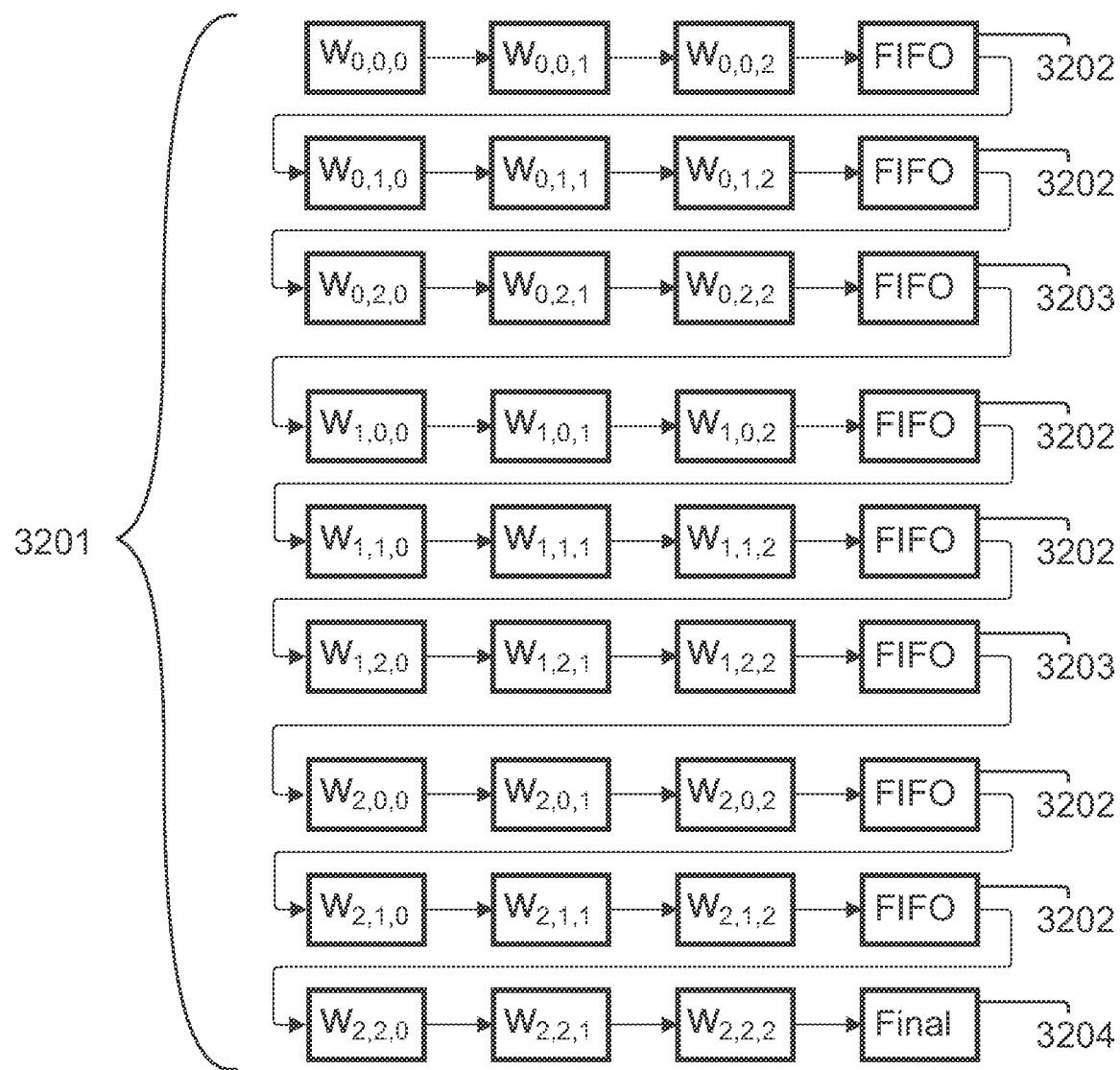
FIG. 32 depicts an arrangement of compositors on an integrated circuit configured to implement a 3 by 3 by 3 convolution as a 3D aperture function over twenty-seven individual data samples.

FIG. 32 depicts an arrangement of compositors on an integrated circuit configured to implement a 3 by 3 by 3 convolution as a 3D aperture function over twenty-seven individual data samples. In this 3D aperture function L, M, and N all equal three. As in the examples using an HDMI frame, the data samples may be monochrome, or may have three color values, or may be features with many more than three values per sample. In embodiments of the instant invention, operations are always pipelined, so values for data samples are input as a stream in a predetermined order. In one protocol, data values are presented in the input stream first across the columns of data array, then proceeding down each row, and thence proceeding to each plane in the third dimension. Values at each data point are processed only once, and partial sums representing the intersection of each 3D aperture position that overlaps with each data point are computed and forwarded for further processing as they were with operation of the apparatus in the 2D implementations.

A 3 by 3 by 3 array of compositors 3201 each apply one of the 27 weights of a single output channel to data points and forward the partial sum for further processing. Row buffer FIFOs 3202 present partials from a previous row appropriately delayed and plane buffer FIFOs 3203 present partials from the previous plane, also appropriately delayed. Once the last weight $W_{2,2,2}$ has been applied, the summation is complete, and the full sum is passed to a final processing circuit 3204. The skilled artisan will understand that the subscripts of the weights at each compositor refer to the plane, row, and column in order.

It is irrelevant whether the input data points comprise single scalar values or multiple values, such as features from a previous neural network node. Any number of parallel output channels may be produced for the same input source array by expanding the parallel weights and sums throughout the circuit.

Special case logic is embedded in compositors 3201 and FIFOs 3202 to handle edge cases for the first and last columns, the first and last rows, and the first and last planes. One skilled in the art will understand that the edge cases for the third dimension closely correspond to those for the second dimension, and similar solutions are sufficient.

It is to be understood as well that a fully functional IC with the array of compositors shown in FIG. 32 will also have an input port, an output port, and control circuitry operating at least one counter and producing control signals coupled to the compositors, the delay circuits, and the finalization circuit, as has been described above for systems operating on 2D data arrays.

Figure 33:
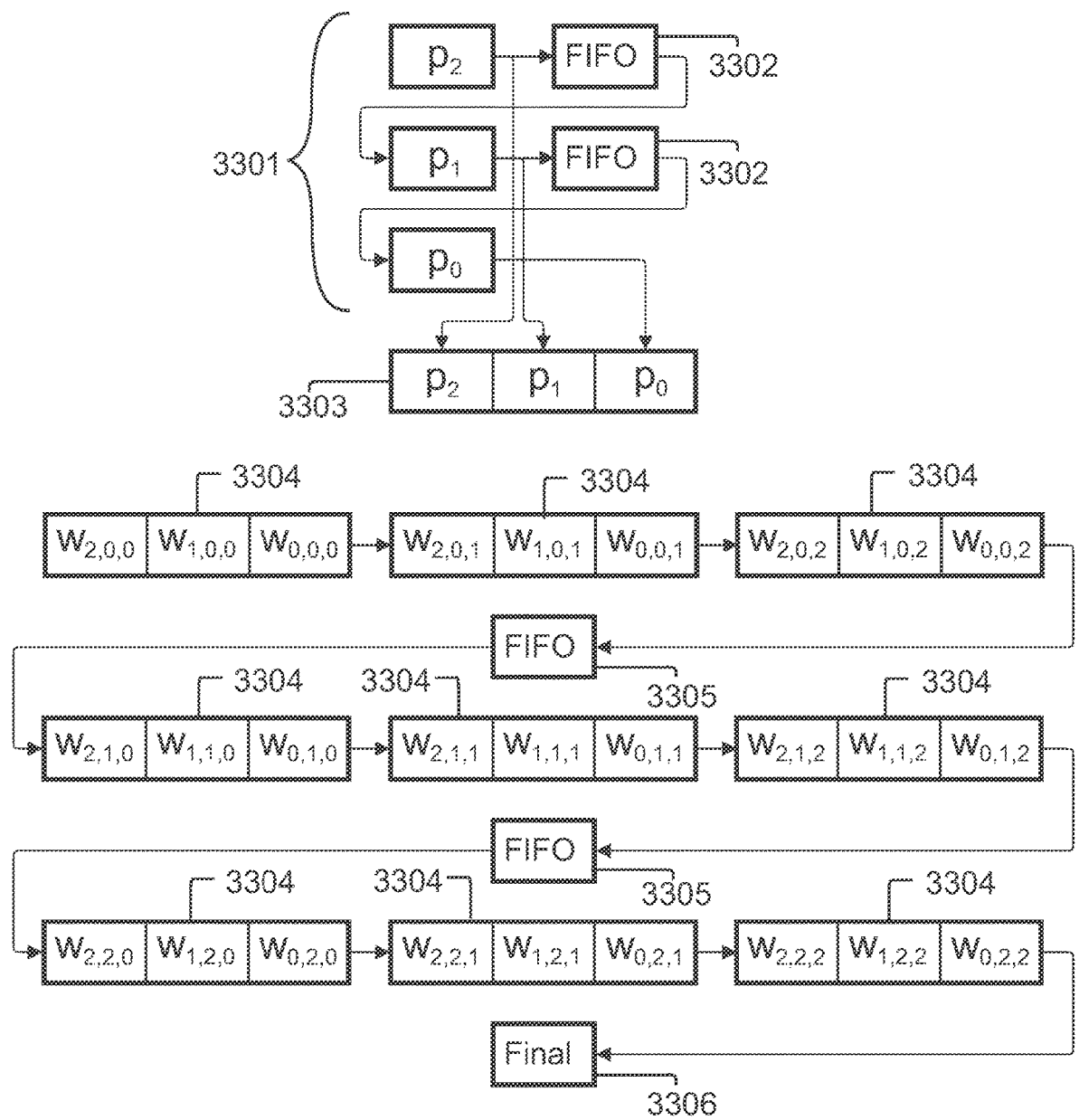
FIG. 33 illustrates an IC wherein data from multiple planes may be buffered and presented simultaneously such that the weights for multiple planes may be applied by a single compositor.

FIG. 33 illustrates an embodiment wherein data from multiple planes may be buffered and presented simultaneously such that a single compositor may apply the weights for multiple planes. When the number of input channels is much lower than the number of output channels, this implementation may be preferred to reduce the total size of the plane buffers required at the expense of increasing the required shared mass multipliers.

For the example 3 by 3 by 3 convolution, input voxels are retained in registers 3301 for each of the three most recently presented planes by means of FIFOs 3302 whose size is equal to RC−1. The data from these registers is consolidated into a bus 3303 that distributes the source input data for the same 2D position across three planes to all compositors 3304.

Each compositor 3304 applies one weight for each plane of the 3 by 3 by 3 convolution to the corresponding source input for that plane and sums the result. Partial sums are passed to other compositors and appropriately delayed by FIFOs 3305 as in the 2D implementation. Edge case conditions, including those for first and last planes, are embedded in the various compositors and closely match those implemented by the completely everted form shown in FIG. 32.

Note that using the partially everted form in FIG. 33 breaks the strict sequencing of the decomposed aperture function in that source values from the upper left corner from three different planes are combined as the first action of computation. If the aperture function is a Convolution where all products may be added in any order to get the same result, this technique is equivalent to the fully everted variant. For any aperture function that relies on the time sequence of operations to compute a valid result, the fully everted variant in FIG. 32 must be used instead.

Considering a 3 by 3 by 3 example again over a P by R by C input array volume where the input is a single scalar value for every voxel, the first form in FIG. 32 requires only a single mass multiplier for all output channels but two R by C FIFOs per channel to forward the partial sums. In contrast, the alternative embodiment of FIG. 33 requires three mass multipliers but only two total R by C FIFOs to buffer the raw scalar data. In this case, the second form may be preferable if the product R times C is large enough to make the size of the FIFOs dominant over the size of the mass multipliers. But if the number of input channels is large compared to the number of output channels, both the total number of mass multipliers and the total size of the FIFOs required is reduced when using the embodiment of FIG. 32 relative to the embodiment of FIG. 33. The choice between the two embodiments may be made solely based on the number of input and output channels and the total size of the buffers and multipliers. Both embodiments are numerically equivalent when the order of operations does not matter, and the choice between them is purely one of overall cost and convenience as long as the aperture function is correctly and completely computed.

Figure 34:
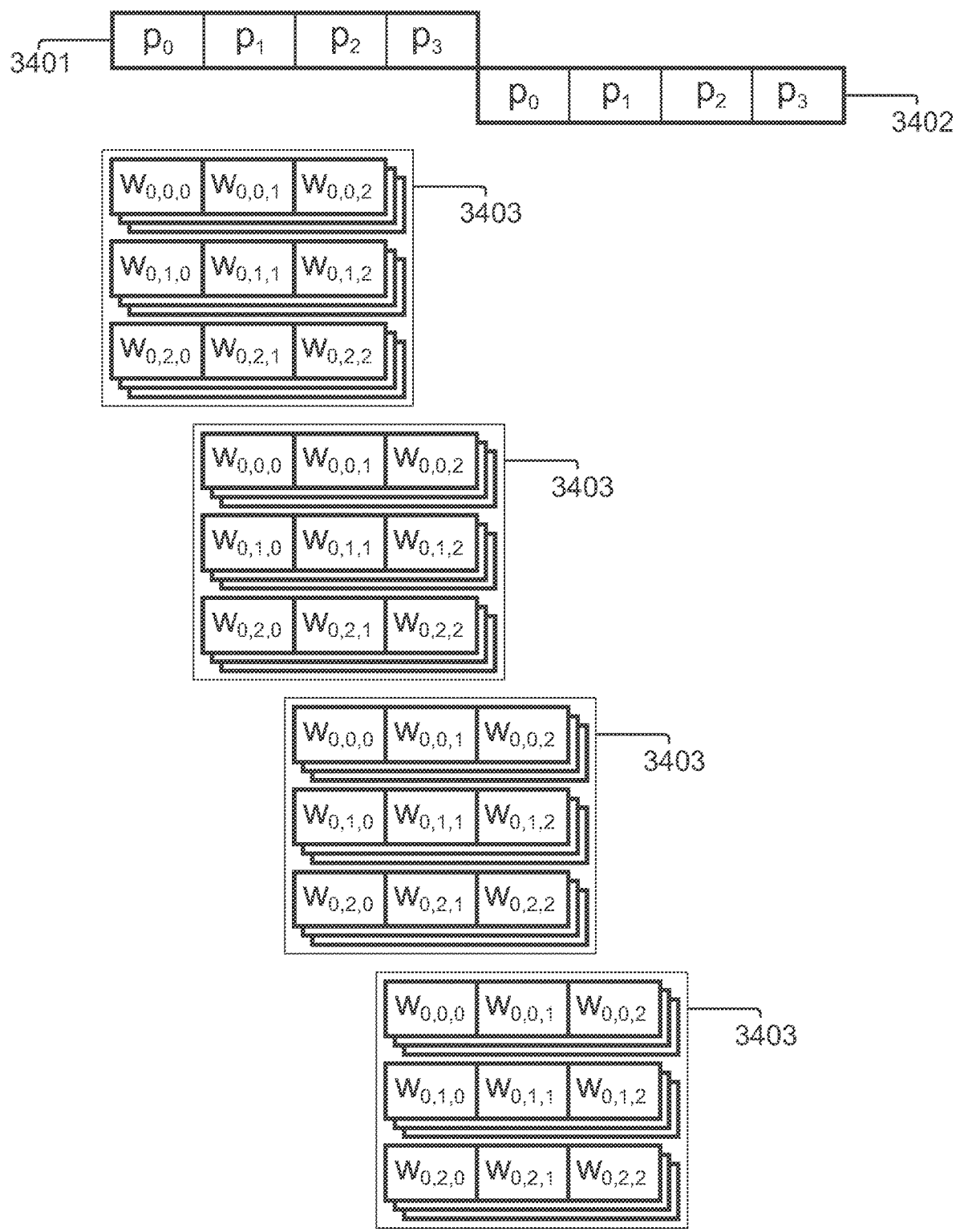
FIG. 34 depicts an implementation of a typical 3 by 3 by 3 convolution applied to a 4-up input stream.

FIG. 34 depicts an implementation of a typical 3 by 3 by 3 convolution applied to a 4-up input stream. As described previously, a 4-up input stream presents data for four input array positions in parallel. Source input sets are presented by registers 3402 and then retained by registers 3401 such that two sets are presented simultaneously in presentation order to all four of compositor sets 3403. Each compositor set sequences the data between rows and planes (FIFOs not shown) as was the case for the 1-up embodiment described with reference to FIG. 32 and the primary difference is that the columns are processed simultaneously rather than sequentially.

Each compositor set 3403 has embedded unique edge conditions as each may be exposed to a different subset in the horizontal direction. Even though the horizontal operations are accomplished simultaneously, the sequence of operations can still be identical, so this embodiment is applicable to any aperture function.

Figure 35:
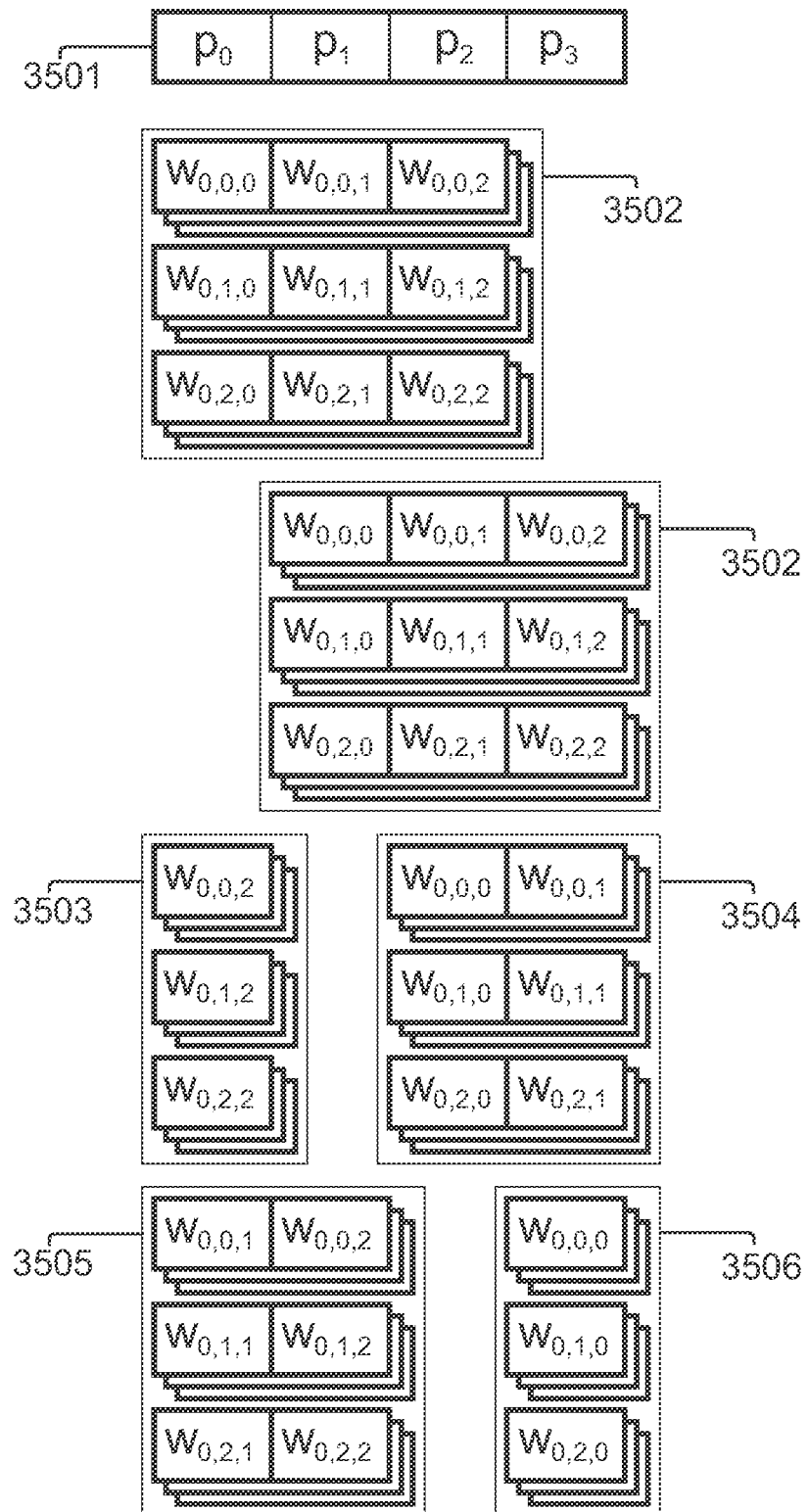
FIG. 35 illustrates a fully everted implementation of an IC applied to a 4-up data stream.

FIG. 35 illustrates a fully everted embodiment of the same 3 by 3 by 3 convolution example applied to a 4-up data stream that is described above with reference to FIG. 34. In this embodiment, each source voxel is handled only once, and a total of four mass multipliers per input component are required to support all output channels in parallel sets.

Source input data is presented in registers 3501 and distributed to all compositor sets. Compositor sets 3502 are similar to compositor sets 3403 described with reference to FIG. 34. Compositors in set 3504 accept data from $P_2$ and $P_3$ and forward the partials to compositors in set 3503 where data from $P_0$ of the next source input data set are applied. Compositors in set 3506 accept data from $P_3$ and forward the partials to compositors in set 3505 where data from $P_0$ and $P_1$ of the next source input data set are applied. Inter row FIFOs provide the standard delay functions in compositor sets 3503 and 3505 and are not included in compositor sets 3504 and 3506. Inter plane FIFOs provide equivalent delay functions for compositors 3502, 3503, and 3505.

Final outputs are produced by the compositors implementing weight $W_{2,2,2}$ which are depicted here as the compositor furthest beneath weight $W_{0,2,2}$ for all four outputs. Note that compositor sets 3502 produce outputs one input source interval before compositor sets 3503 and 3505 and so must be delayed to produce all four outputs at the same time.

With appropriate restrictions to conform to the requirements of the specific aperture function, one skilled in the art will understand that any such function that can be decomposed into a sequential sequence of steps can be computed over time continuously by such a circuit. Furthermore, while the number and form of compositor sets are dictated by the specific combination of N-up (including 1-up) data presentation and the three-dimensional array of the sample size per output, the basic form, timing, and exception rules are general for all combinations.

Other aperture functions typically used in a Deep Neural Network, such as MaxPool for example, can be accommodated within the general form described.

The skilled person will understand that the embodiments illustrated in the figures and described above are all exemplary, and do not detail every form that the invention might take. There may be a variety of other forms that may be realized within the scope of the invention.

The scope of the invention is limited only by the claims.

The invention claimed is:

1. An integrated circuit (IC) implementing an L by M by N three-dimensional aperture function throughout a P by R by C three-dimensional source array, the IC comprising:
   an input port receiving an ordered stream of independent input values from the source array;
   an output port producing an ordered stream of independent output values;
   an array of n compositor circuits, where n=L×M×N, each compositor circuit implementing a sub-function of the aperture function;
   dedicated pathways between the compositor circuits;
   delay circuits on the IC receiving values on the dedicated pathways from individual ones of the compositor circuits and providing the delayed values at later times to other compositor circuits downstream;
   a finalization circuit; and
   a control circuit operating counters and producing control signals coupled to the compositors, the delay circuits, and the finalization circuit.

2. The IC of claim 1 wherein input values are ordered from a first input point at a first column of a first row of a first plane of the source array, taken across columns of the first row of the first plane, then down row by row and across columns of the rows to a final point at the last column of the last row of the first plane, and then column by column and row by row through a second plane, and plane by plane to and through a last plane.

3. The IC of claim 1 wherein output values are posted to the output port by the finalization circuit in order of receiving and processing a complete composition of values for an output of the aperture function at each specific position of the P by R by C array of input values.

4. The IC of claim 1 further comprising a mass multiplier circuit multiplying each input value in the input stream, as received, by each weight of the aperture function, and providing products to individual ones of the compositor circuits for further processing.

5. The IC of claim 1 wherein all circuitry is active simultaneously, and the output stream of the IC at the output port is produced while inputs are being received at the input port.

6. The IC of claim 1 further comprising a mass multiplication circuit coupled to the input port and adapted to multiply each input value as received by all weights of the 3D aperture function simultaneously and to provide products of the multiplications to the compositor circuits on dedicated pathways, the compositor circuits performing remaining steps of the sub-function and passing partial results along the dedicated pathways between the compositor circuits.

7. The IC of claim 1 further comprising L register circuits coupled to the input port, one for each plane of the aperture function, each register circuit capturing all input data for one plane of the aperture function at each position of the aperture function and presenting the data from all three planes simultaneously to each compositor for sub-function computation.

8. The IC of claim 1 wherein the input port receives an ordered stream of input values from the P by R by C source array in sets of values from A adjacent input positions in each input interval.

9. The IC of claim 8 wherein C is not an integral multiple of A.

10. The IC of claim 8 further comprising mass multiplier circuitry wherein each input value in the input stream is multiplied by all weights of the aperture function on receipt and the products are provided on dedicated pathways to the compositors.

* * * * *